US010128125B2

(12) United States Patent
Funaya et al.

(10) Patent No.: US 10,128,125 B2
(45) Date of Patent: *Nov. 13, 2018

(54) SEMICONDUCTOR DEVICE AND METHOD OF MANUFACTURING THE SAME

(71) Applicant: Renesas Electronics Corporation, Tokyo (JP)

(72) Inventors: Takuo Funaya, Tokyo (JP); Takayuki Igarashi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/789,740

(22) Filed: Oct. 20, 2017

(65) Prior Publication Data

US 2018/0061662 A1   Mar. 1, 2018

Related U.S. Application Data

(63) Continuation of application No. 15/462,583, filed on Mar. 17, 2017, now Pat. No. 9,805,950, which is a
(Continued)

(51) Int. Cl.
*H01L 29/00* (2006.01)
*H01L 21/3205* (2006.01)
(Continued)

(52) U.S. Cl.
CPC ...... *H01L 21/3205* (2013.01); *H01L 21/0217* (2013.01); *H01L 21/02164* (2013.01);
(Continued)

(58) Field of Classification Search
CPC . H01L 23/455; H01L 23/522; H01L 23/5227; H01L 235/528; H01L 23/5283; H01L 2223/6655
(Continued)

(56) References Cited

U.S. PATENT DOCUMENTS 9,653,396 B2 * 5/2017 Funaya ............ H01L 21/02164
2002/0005583 A1   1/2002 Harada et al.
(Continued)

FOREIGN PATENT DOCUMENTS

JP   2001-351920 A   12/2001
JP   2003-100744 A   4/2003
(Continued)

OTHER PUBLICATIONS

Notice of Allowance dated Jun. 28, 2017 in U.S. Appl. No. 15/462,583.
(Continued)

*Primary Examiner* — Matthew E Warren
(74) *Attorney, Agent, or Firm* — McGinn I.P. Law Group, PLLC

(57) ABSTRACT

A semiconductor device including: a semiconductor substrate; a first coil formed on the semiconductor substrate via a first insulation film; a second insulation film formed on the semiconductor substrate so as to cover the first insulation film and the first coil; a first pad formed on the second insulation film and disposed at a position not overlapped with the first coil in a planar view; a laminated insulation film formed on the second insulation film, the laminated insulation film having a first opening from which the first pad is exposed; a second coil formed on the laminated insulation film and disposed above the first coil; and a first wiring formed on the laminated insulation film including an upper portion of the first pad exposed from the first opening, the first wiring being electrically connected to the first pad.

14 Claims, 41 Drawing Sheets

Related U.S. Application Data continuation of application No. 14/777,454, filed as application No. PCT/JP2013/058526 on Mar. 25, 2013, now Pat. No. 9,653,396.

(51) Int. Cl.

| | | |
|---|---|---|
| *H01L 23/522* | (2006.01) | |
| *H01L 23/00* | (2006.01) | |
| *H01L 27/06* | (2006.01) | |
| *H01L 21/66* | (2006.01) | |
| *H01L 49/02* | (2006.01) | |
| *H01L 21/02* | (2006.01) | |
| *H01L 23/528* | (2006.01) | |
| *H01L 23/495* | (2006.01) | |

(52) U.S. Cl.
CPC ........ *H01L 21/02271* (2013.01); *H01L 22/14* (2013.01); *H01L 22/32* (2013.01); *H01L 23/5227* (2013.01); *H01L 24/03* (2013.01); *H01L 24/06* (2013.01); *H01L 24/49* (2013.01); *H01L 27/06* (2013.01); *H01L 27/0617* (2013.01); *H01L 27/0688* (2013.01); *H01L 28/10* (2013.01); *H01L 23/49575* (2013.01); *H01L 23/528* (2013.01); *H01L 23/5283* (2013.01); *H01L 24/48* (2013.01); *H01L 2223/6655* (2013.01); *H01L 2224/02166* (2013.01); *H01L 2224/04042* (2013.01); *H01L 2224/05554* (2013.01); *H01L 2224/32245* (2013.01); *H01L 2224/45099* (2013.01); *H01L 2224/45144* (2013.01); *H01L 2224/45147* (2013.01); *H01L 2224/48091* (2013.01); *H01L 2224/48137* (2013.01); *H01L 2224/48247* (2013.01); *H01L 2224/48257* (2013.01); *H01L 2224/48465* (2013.01); *H01L 2224/49113* (2013.01); *H01L 2224/49175* (2013.01); *H01L 2224/73265* (2013.01); *H01L 2924/00011* (2013.01); *H01L 2924/00014* (2013.01); *H01L 2924/01078* (2013.01); *H01L 2924/12041* (2013.01); *H01L 2924/1306* (2013.01); *H01L 2924/181* (2013.01)

(58) Field of Classification Search
USPC ................................ 257/528, 531, 758, 760
See application file for complete search history.

(56) References Cited

U.S. PATENT DOCUMENTS

| | | |
|---|---|---|
| 2006/0145308 A1 | 7/2006 | Floyd et al. |
| 2006/0263727 A1 | 11/2006 | Lee et al. |
| 2007/0109719 A1 | 5/2007 | Kuwajima et al. |
| 2008/0191349 A1 | 8/2008 | Aoki |
| 2009/0244866 A1 | 10/2009 | Kawano et al. |
| 2009/0280646 A1 | 11/2009 | Iwaya et al. |
| 2010/0265024 A1 | 10/2010 | Nakashiba |
| 2011/0128084 A1 | 6/2011 | Jin et al. |
| 2012/0020419 A1 | 1/2012 | Kaeriyama |
| 2012/0062040 A1 | 3/2012 | Kaeriyama |
| 2014/0175602 A1 | 6/2014 | Funaya |
| 2015/0318245 A1 | 11/2015 | Uchida |

FOREIGN PATENT DOCUMENTS

| | | |
|---|---|---|
| JP | 2006-191027 A | 7/2006 |
| JP | 2006-339197 A | 12/2006 |
| JP | 2007-142109 A | 6/2007 |
| JP | 2008-502215 A | 1/2008 |
| JP | 2008-210828 A | 9/2008 |
| JP | 2008-270465 A | 11/2008 |
| JP | 2008-277564 A | 11/2008 |
| JP | 2009-302268 A | 12/2009 |
| JP | 2010-016142 A | 1/2010 |
| JP | 2010-251662 A | 11/2010 |
| JP | 2011-054672 A | 3/2011 |
| WO | WO 2010/113383 A1 | 10/2010 |
| WO | WO 2010/140297 A1 | 11/2010 |

OTHER PUBLICATIONS

Notice of Allowance dated Jan. 12, 2017 in U.S. Appl. No. 14/777,454.
Extended European Search Report dated Oct. 14, 2016.
International Search Report (ISR) (PCT Form PCT/ISA/210), in PCT/JP2013/058526, dated Apr. 23, 2013.
Japanese Office Action dated Jan. 30, 2018 in Japanese Application No. 2016-180151 with an English translation thereof.
Japanese Office Action dated Jun. 13, 2017 in Japanese Application No. 2016-180151 with an English translation thereof.
Japanese Pretrial Report dated May 14, 2018 in corresponding Japanese Application No. 2018-004229 with an English translation thereof.

* cited by examiner

OP1a  OP1c  OP1b
PD1

V3

V3

M2
PD1

SEMICONDUCTOR DEVICE AND METHOD OF MANUFACTURING THE SAME

CROSS-REFERENCE TO RELATED APPLICATIONS

The present application is a Continuation of Application of U.S. patent application Ser. No. 15/462,583, filed on Mar. 17, 2017, which is a Continuation Application of U.S. patent application Ser. No. 14/777,454, filed on Sep. 15, 2015, now U.S. Pat. No. 9,653,396, issued on May 16, 2017, which is a national stage entry of International No. PCT/JP2013/058526, filed on Mar. 25, 2013, the entire contents of which are hereby incorporated by reference.

TECHNICAL FIELD

The present invention relates to a semiconductor device and a method of manufacturing the same, and can be suitably utilized in, for example, a semiconductor device provided with coils and in a method of manufacturing the same.

BACKGROUND ART

As a technique of transmitting an electric signal between two circuits different from each other in potential of an electric signal to be inputted, there is a technique using a photocoupler. The photocoupler has a light emitting element such as a light emitting diode and a light receiving element such as a phototransistor, and it converts an inputted electric signal to light by the light emitting element and restores this light to an electric signal by the light-receiving element, so that the electric signal is transmitted.

Further, a technique of transmitting an electric signal by magnetically coupling (induction-coupling) two inductors has been developed.

Japanese Patent Application Laid-Open Publication No. 2008-270465 (Patent Document 1) and Japanese Patent Application Laid-Open Publication No. 2008-277564 (Patent Document 2) disclose a technique regarding micro transformer.

PRIOR ART DOCUMENT

Patent Document

Patent Document 1: Japanese Patent Application Laid-Open Publication No. 2008-270465
Patent Document 2: Japanese Patent Application Laid-Open Publication No. 2008-277564

SUMMARY OF THE INVENTION

Problems to be Solved by the Invention

As a technique of transmitting an electric signal between two circuits different from each other in potential of an electric signal to be inputted, there is a technique using a photocoupler. However, since the photocoupler has the light emitting element and the light receiving element, it is difficult to achieve size reduction. Further, there is a limit in adoption of the photocoupler due to such a fact that the electric signal cannot be followed when a frequency of an electric signal is high.

Meanwhile, in the semiconductor device in which an electric signal is transmitted by magnetically-coupled inductors, the inductors can be formed by using a miniaturization technique of a semiconductor device, and therefore, the device can be downsized, and electrical characteristics are also excellent. Therefore, it is desired to develop the semiconductor device.

Therefore, it is desired to improve the reliability as high as possible even in a semiconductor device provided with such an inductor.

Other object and novel characteristics of the present invention will be apparent from the description of the present specification and the accompanying drawings.

Means for Solving the Problems

According to an embodiment, a semiconductor device has a first coil and a first pad disposed above a semiconductor substrate, a second coil disposed above the first coil, and a laminated insulation film interposed between the first coil and the second coil. Then, the laminated insulation film is composed of a silicon oxide film, a silicon nitride film on the silicon oxide film, and a resin film on the silicon nitride film, and the first pad is partially covered by the laminated insulation film.

Moreover, according to an embodiment, a method of manufacturing a semiconductor device has a step of forming a first insulation film on a semiconductor substrate, a step of forming a first coil on the first insulation film, a step of forming a second insulation film on the first insulation film so as to cover the first coil, and a step of forming a first pad on the second insulation film. Furthermore, the method has a step of forming a laminated insulation film, which has a first opening exposing the first pad, on the first insulation film and a step of forming a second coil and a first wiring on the laminated insulation film. The second coil is disposed above the first coil, and the laminated insulation film is composed of a silicon oxide film, a silicon nitride film on the silicon oxide film, and a resin film on the silicon nitride film.

Effects of the Invention

According to an embodiment, reliability of a semiconductor device can be improved.

BRIEF DESCRIPTIONS OF THE DRAWINGS

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and others), the number of the elements is not limited to a specific number unless otherwise stated or except the case that the number is apparently limited to a specific number in principle. The number larger or smaller than the specified number is also applicable. Further, in the embodiments described below, it goes without saying that the components (including element steps) are not always indispensable unless otherwise stated or except the case that the components are apparently indispensable in principle. Similarly, in the embodiments described below, when the shape of the components, positional relation thereof, and others are mentioned, the substantially approximate and similar shapes and others are included therein unless otherwise stated or except the case that it is conceivable that they are apparently excluded in principle. The same goes for the numerical value and the range described above.

Hereinafter, embodiments of the present invention will be described in detail based on the accompanying drawings. Note that components having the same function are denoted by the same reference symbols throughout all the drawings for describing the embodiment, and the repetitive description thereof will be omitted. Also, in the embodiments described below, the description of the same or similar parts is not repeated in principle unless otherwise required.

Also, in some drawings used in the embodiments, hatching is omitted even in a cross-sectional view so as to make the drawings easy to see. Further, hatching is used even in a plan view so as to make the drawings easy to see.

(First Embodiment)
<Regarding Circuit Configuration>

Figure 1:
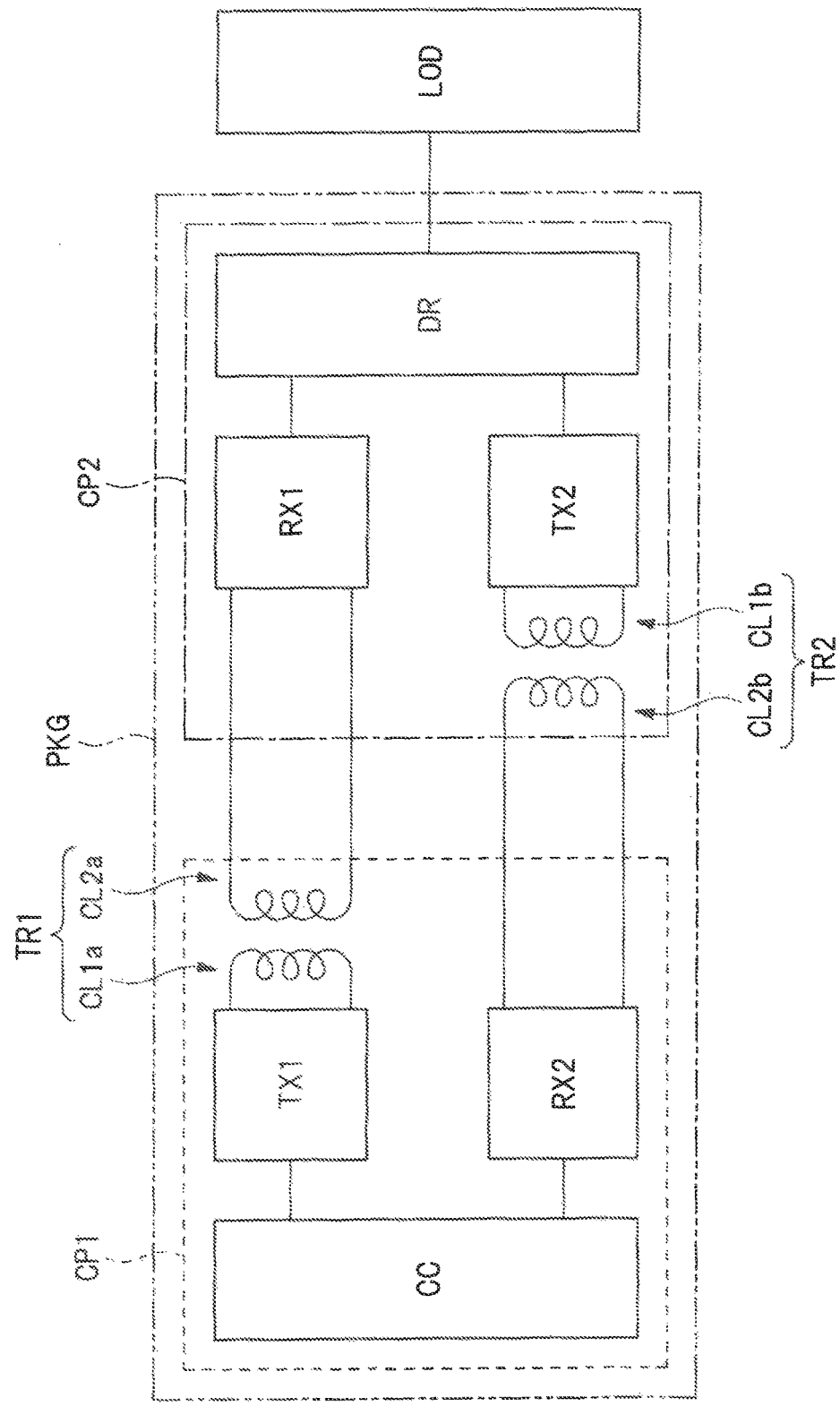
FIG. 1 is a circuit diagram showing an example of an electronic device using a semiconductor device of an embodiment.

FIG. 1 is a circuit diagram showing one example of an electronic device (a semiconductor device) using a semiconductor device (a semiconductor chip) of an embodiment. In FIG. 1, note that a section surrounded by a dotted line is formed within a semiconductor chip CP1, a section surrounded by a dotted chain line is formed within a semiconductor chip CP2, and a section surrounded by a two-dot chain line is formed within a semiconductor package PKG.

The electronic device shown in FIG. 1 is provided with the semiconductor package PKG in which the semiconductor chips CP1 and CP2 are embedded. A transmission circuit TX1, a reception circuit RX2, and a control circuit CC are formed within the semiconductor chip CP1, and a reception circuit RX1, a transmission circuit TX2 and a drive circuit DR are formed within the semiconductor chip CP2.

The transmission circuit TX1 and the reception circuit RX1 are circuits for transmitting a control signal from the control circuit CC to the drive circuit DR. Further, the transmission circuit TX2 and the reception circuit RX2 are circuits for transmitting a signal from the drive circuit DR to the control circuit CC. The control circuit CC controls or drives the drive circuit DR and the drive circuit DR drives a load LOD. The semiconductor chips CP1 and CP2 are embedded in the semiconductor package PKG, and the load LOD is provided outside the semiconductor package PKG.

A transformer (a transformer, a converter, a magnetic coupling element, an electromagnetic coupling element) TR1 composed of coils (inductors) CL1a and CL2a magnetically coupled (inductively coupled) is interposed between the transmission circuit TX1 and the reception circuit RX1, so that a signal can be transmitted from the transmission circuit TX1 to the reception circuit RX1 via this transformer TR1 (that is, via the coils CL1a and CL2a magnetically coupled). In this manner, the reception circuit RX1 within the semiconductor chip CP2 can receive a signal transmitted by the transmission circuit TX1 within the semiconductor chip CP1. Therefore, the control circuit CC can transmit a signal (a control signal) to the drive circuit DR via the transmission circuit TX1, the transformer TR1 and the reception circuit RX1. The transformer TR1 (the coils CL1a and CL2a) is formed within the semiconductor chip CP1. Each of the coil CL1a and the coil CL2a can also be regarded as an inductor. Further, the transformer TR1 can also be regarded as a magnetic coupling element.

Also, a transformer (a transformer, a converter, a magnetic coupling element, an electromagnetic coupling element) TR2 composed of coils (inductors) CL1b and CL2b magnetically coupled (inductively coupled) is interposed between the transmission circuit TX2 and the reception circuit RX2, so that a signal can be transmitted from the transmission circuit TX2 to the reception circuit RX2 via this transformer TR2 (that is, via the coils CL1b and CL2b magnetically coupled). In this manner, the reception circuit RX2 within the semiconductor chip CP1 can receive a signal transmitted by the transmission circuit TX2 within the semiconductor chip CP2. Therefore, the drive circuit DR can transmit a signal to the control circuit CC via the transmission circuit TX2, the transformer TR2 and the reception circuit RX2. The transformer TR2 (the coils CL1b and CL2b) is formed within the semiconductor chip CP2. Each of the coil CL1b and the coil CL2b can also be regarded as an inductor. Further, the transformer TR2 can also be regarded as a magnetic coupling element.

The transformer TR1 is formed of the coils CL1a and CL2a formed within the semiconductor chip CP1. However, the coil CL1a and the coil CL2a are not conductively connected but magnetically coupled to each other via a conductor. Therefore, when a current flows in the coil CL1a, an induced electromotive force is generated in the coil CL2a in accordance with change of the current so that an induction current flows. The coil CL1a is a primary coil, while the coil CL2a is a secondary coil. By utilizing this and transmitting a signal from the transmission circuit TX1 to the coil CL1a (the primary coil) of the transformer TR1 to cause a current to flow and detecting (receiving) the induction current (or induced electromotive force) generated in the coil CL2a (the secondary coil) of the transformer TR1 in accordance therewith by the reception circuit RX1, a signal corresponding to the signal transmitted by the transmission circuit TX1 can be received by the reception circuit RX1.

Further, the transformer TR2 is formed of the coils CL1b and CL2b formed within the semiconductor chip CP2. However, the coil CL1b and the coil CL2b are not conductively connected but magnetically coupled to each other via a conductor. Therefore, when a current flows in the coil CL1b, an induced electromotive force is generated in the coil CL2b in accordance with change of the current so that an induction current flows. The coil CL1b is a primary coil, while the coil CL2b is a secondary coil. By utilizing this and transmitting a signal from the transmission circuit TX2 to the coil CL1b (the primary coil) of the transformer TR2 to cause a current to flow and detecting (receiving) the induction current (or induced electromotive force) generated in the coil CL2b (the secondary coil) of the transformer TR2 in accordance therewith by the reception circuit RX2, a signal corresponding to the signal transmitted by the transmission circuit TX2 can be received by the reception circuit RX2.

The signal is transmitted and received between the semiconductor chip CP1 and the semiconductor chip CP2 through a route from the control circuit CC to the drive circuit DR through the transmission circuit TX1, the transformer TR1 and the reception circuit RX1 and a route from the drive circuit DR to the control circuit CC through the transmission circuit TX2, the transformer TR2 and the reception circuit RX2. That is, the signal can be transmitted and received between the semiconductor chip CP1 and the semiconductor chip CP2 by reception of a signal transmitted by the transmission circuit TX1 which is received by the reception circuit RX1 and reception of a signal transmitted by the transmission circuit TX2 which is received by the reception circuit RX2. As described above, the transformer TR1 (namely, the coils CL1a and CL2a magnetically coupled) is interposed for transmission of a signal from the transmission circuit TX1 to the reception circuit RX1, while the transformer TR2 (namely the coils CL1b and CL2b magnetically coupled) is interposed for transmission of a signal from the transmission circuit TX2 to the reception circuit RX2. The drive circuit DR can drive the load LOD in accordance with a signal transmitted from the semiconductor chip CP1 to the semiconductor chip CP2 (namely, a signal transmitted from the transmission circuit TX1 to the reception circuit RX1 through the transformer TR1). As the load LOD, while there are various loads in accordance with applications, for example, a motor or others can be exemplified.

The semiconductor chip CP1 and the semiconductor chip CP2 are different from each other in a voltage level (reference potential) from each other. For example, the semiconductor chip CP1 is connected to a low-voltage region having a circuit operated or driven at a low voltage (for example, several volts to several tens volts) through a bonding wire BW, a lead LD and others described later. Further, the semiconductor chip CP2 is connected to a high-voltage region having a circuit (for example, the load LOD, a switch for the load LOD, or others) operated or driven at a higher voltage (for example, 100 V or higher) than the low voltage via a bonding wire BW, a lead LD and others described later. However, since the signal between the semiconductor chips CP1 and CP2 is transmitted so as to interpose the transformers TR1 and TR2, a signal can be transmitted between different voltage circuits.

At the transformers TR1 and TR2, a large potential difference is generated between the primary coil and the secondary coil in some cases. In other words, since a large potential difference is generated in some cases, the primary coil and the secondary coil which are not connected by a conductor but magnetically coupled with each other are used to transmit signals. Therefore, when the transformer TR1 is formed in the semiconductor chip CP1, it is important to increase the breakdown voltage between the coil CL1a and the coil CL2a as much as possible in order to improve the reliability of the semiconductor chip CP1, the semiconductor package PKG in which the semiconductor chip CP1 is embedded, or the electronic device using it. Moreover, when the transformer TR2 is formed in the semiconductor chip CP2, it is important to increase the breakdown voltage between the coil CL1b and the coil CL2b as much as possible in order to improve the reliability of the semiconductor chip CP2, the semiconductor package PKG in which the semiconductor chip CP2 is embedded, or the electronic device using it. Therefore, in the present embodiment, the configuration of an insulation film (later-described laminated film LF) interposed between the primary coil and the secondary coil in the semiconductor chip (CP1, CP2) is devised, and this will be described later in detail.

Note that FIG. 1 shows a case that the control circuit CC is embedded in the semiconductor chip CP1. However, as another aspect, the control circuit CC can be embedded in a semiconductor chip other than the semiconductor chips CP1 and CP2. Further, FIG. 1 shows a case that the drive circuit DR is embedded in the semiconductor chip CP2. However, as another aspect, the drive circuit DR can be embedded in a semiconductor chip other than the semiconductor chips CP1 and CP2.

<Regarding Signal Transmission Example>

Figure 2:
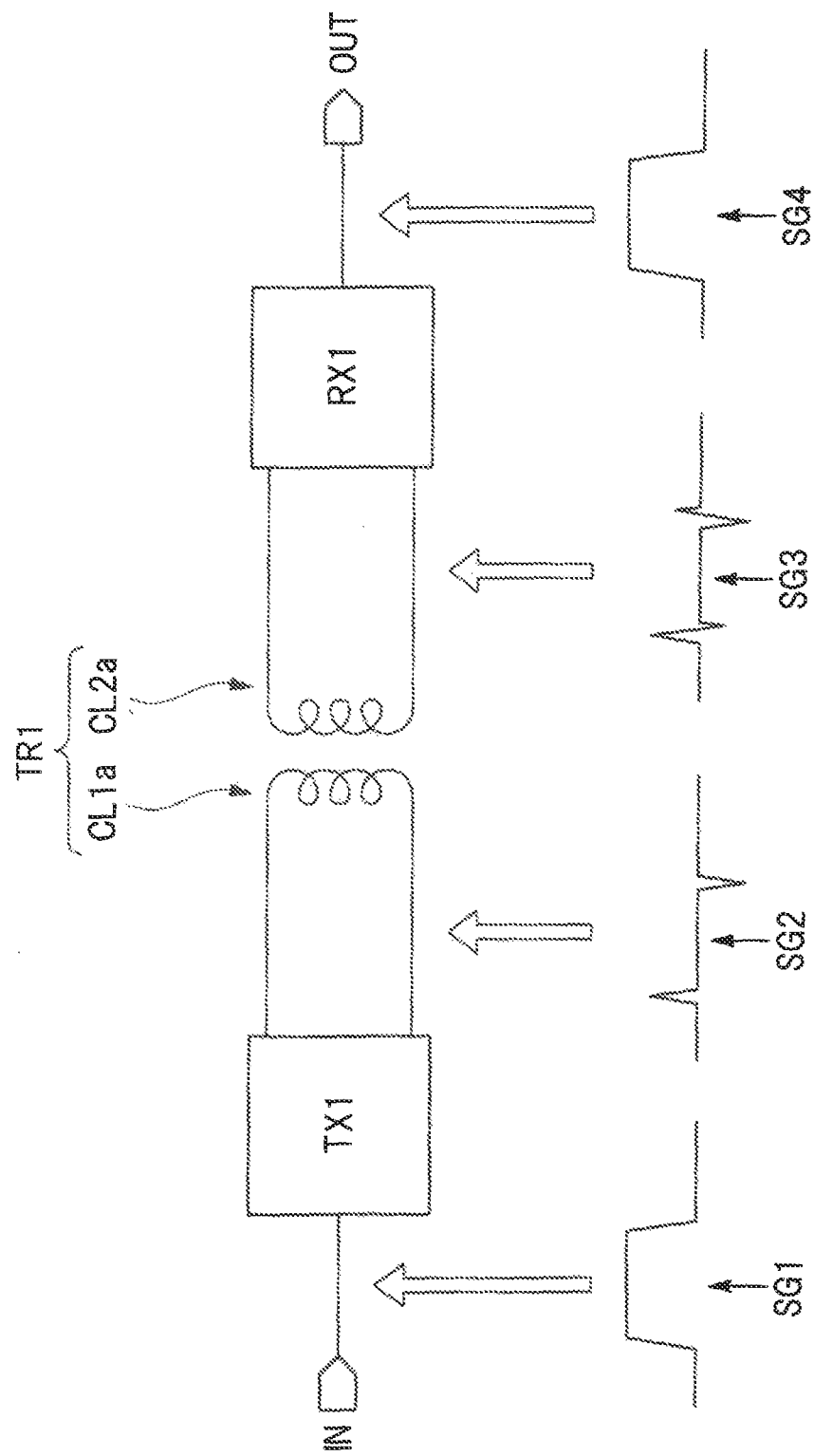
FIG. 2 is an explanatory diagram showing a signal transmission example.

FIG. 2 is an explanatory diagram showing a transmission example of a signal.

The transmission circuit TX1 modulates a square-waveform signal SG1 inputted into the transmission circuit TX1 to a differential-waveform signal SG2 to send the signal to the coil CL1a (a primary coil) of the transformer TR1. When a current based on the differential-waveform signal SG2 flows in the coil CL1a (the primary coil) of the transformer TR1, a signal SG3 corresponding thereto is flowed in the coil CL2a (a secondary coil) of the transformer TR1 by an induced electromotive force. By amplifying this signal SG3 in the reception circuit RX2 and further modulating the signal into a square waveform, a square-waveform signal SG4 is outputted from the reception circuit RX2. In this manner, the signal SG4 corresponding to the signal SG1 inputted into the transmission circuit TX1 can be outputted from the reception circuit RX2. Thus, a signal is transmitted from the transmission circuit TX1 to the reception circuit RX1. Transmission of the signal from the transmission circuit TX2 to the reception circuit RX2 can be performed similarly.

Further, FIG. 2 shows one example of transmission of a signal from the transmission circuit to the reception circuit. However, this invention is not limited to this and can be variously changed as long as this is a method of transmitting a signal through magnetically-coupled coils (a primary coil and a secondary coil).

<Regarding Structure of Semiconductor Chip>

Figure 3:
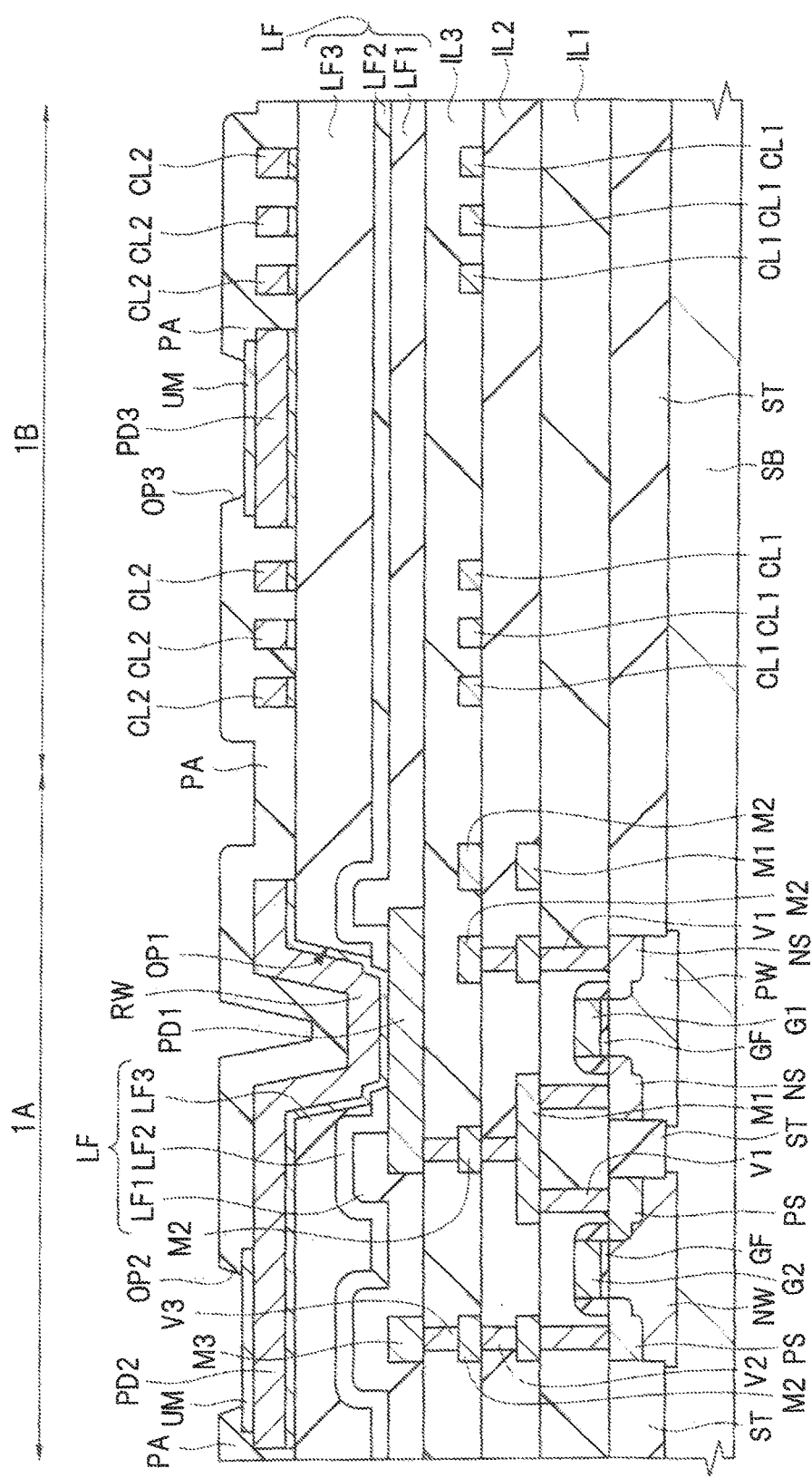
FIG. 3 is a cross-sectional view of a principal part of the semiconductor device of the embodiment.
Figure 4:
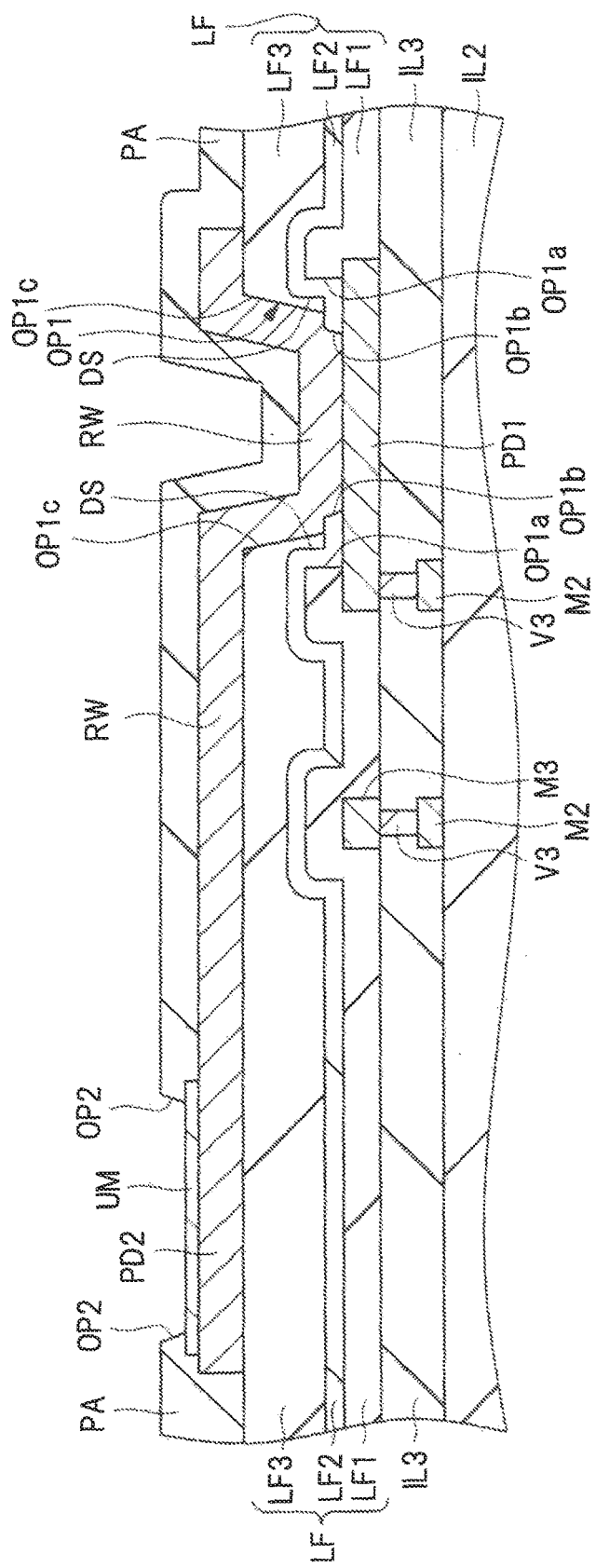
FIG. 4 is a cross-sectional view of a principal part of the semiconductor device of the embodiment.
Figure 5:
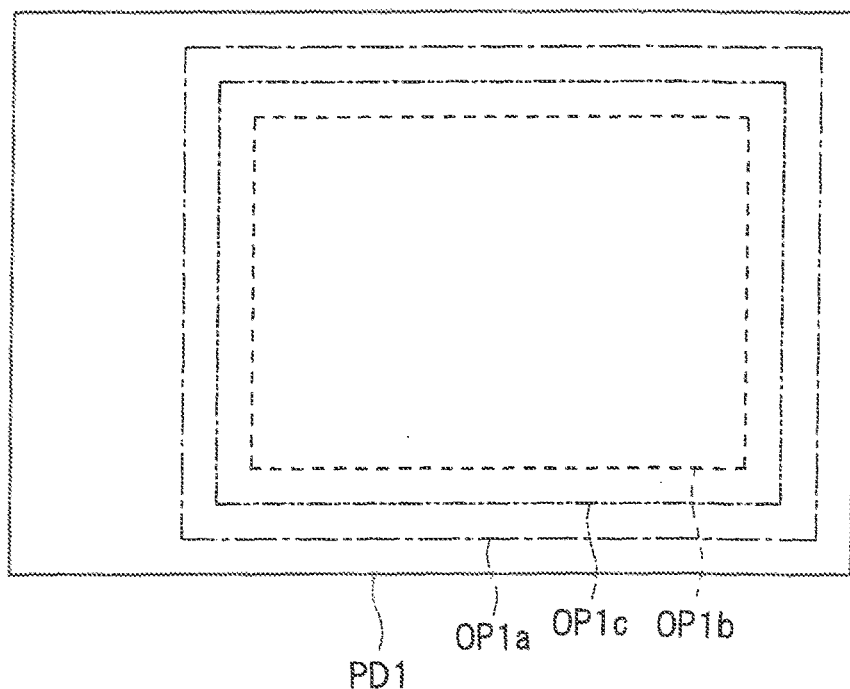
FIG. 5 is a plan view of a pad.
Figure 6:
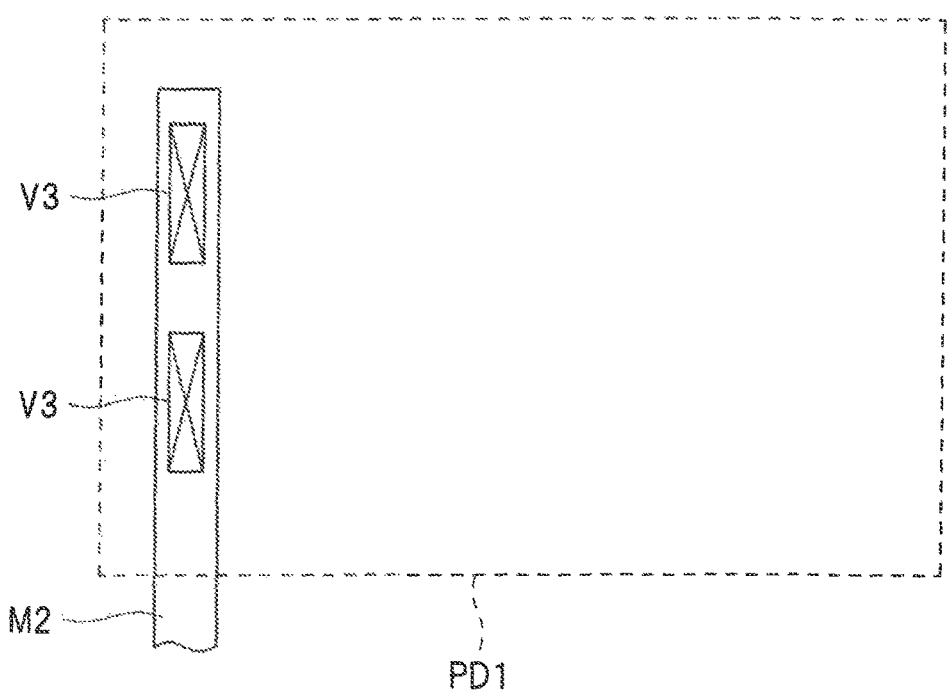
FIG. 6 is a plan view showing a lower layer of the pad.

FIG. 3 is a cross-sectional view of a principal part showing a cross-sectional structure of the semiconductor device of the present embodiment. The semiconductor device shown in FIG. 3 is a semiconductor device (semiconductor chip) corresponding to the above-described semiconductor chip CP1 or the above-described semiconductor chip CP2. And, FIG. 4 is a cross-sectional view of a principal part of the semiconductor device of the present embodiment, and shows a cross-sectional view showing a structure of an upper layer than an interlayer insulation film IL2 of a peripheral-circuit formation region 1A. Also, FIG. 5 is a plan view of a pad PD1, and shows a position of an opening OP1a of a silicon oxide film LF1 by a dotted chain line, a position of an opening OP1b of a silicon nitride film LF2 by a dotted line, and a position of an opening OP1c of a resin film LF3 by a two-dot chain line in order to facilitate understanding. Further, FIG. 6 is a plan view showing a lower layer of the pad PD1, and shows a position of an outer periphery of the pad PD1 by a dotted line in order to facilitate understanding.

The semiconductor device of the present embodiment is a semiconductor device (semiconductor chip) formed by utilizing a semiconductor substrate SB composed of single-crystal silicon or others, and has the peripheral-circuit formation region 1A and a transformer formation region 1B. Note that the peripheral-circuit formation region 1A and the transformer formation region 1B correspond to planar regions of a main surface of the same semiconductor substrate SB, which are different from each other.

As shown in FIG. 3, a semiconductor element such as MISFET (Metal Insulator Semiconductor Field Effect Transistor) is formed on a semiconductor substrate SB composed of a single crystal silicon configuring the semiconductor device (semiconductor chip) or the present embodiment, or others. This semiconductor element is formed in the peripheral-circuit formation region 1A.

For example, a p-type well PW and a n-type well NW are formed on the semiconductor substrate SB1 in the peripheral-circuit formation region 1A, a gate electrode G1 for an n-channel type MISFET is formed on the p-type well PW through a gate insulation film GF, and a gate electrode G2 for a p-channel type MISFET is formed on the n-type well NW through a gate insulation film GF. The gate insulation film GF is composed of, for example, a silicon oxide film or others, and each of the gate electrodes G1 and G2 is composed of, for example, a polycrystalline silicon film (a doped polysilicon film) to which an impurity or others is introduced.

An n-type semiconductor region NS of the n-channel type MISFET for a source/drain is formed within the p-type well PW of the semiconductor substrate SB, and a p-type semiconductor region PS of the p-channel type MISFET for a source/drain is formed within the n-type well NW of the semiconductor substrate SB. The n-channel type MISFET is formed of the gate electrode G1, the gate insulation film GF positioned below the gate electrode G1, and the n-type semiconductor regions NS (the source/drain region) positioned on both sides of the gate electrode G1. Further, the p-channel type MISFET is formed of the gate electrode G2, the gate insulation film GF positioned below the gate electrode G2, and the p-type semiconductor regions PS (the source/drain region) positioned on both sides of the gate electrode G2. The n-type semiconductor regions NS can have the LDD (Lightly doped Drain) structure. In this case, a sidewall insulation film also referred to as sidewall spacer is formed on a side wall of the gate electrode G1. Similarly, the p-type semiconductor regions PS can have the LDD structure. In this case, a sidewall insulation film also referred to as sidewall spacer is formed on a side wall of the gate electrode G2.

Here, note that a MISFET is exemplified explanations as a semiconductor element formed in the peripheral-circuit formation region 1A. However, in addition to this, a capacitive element, a resistive element, a memory element, a transistor having a different configuration, or others may be formed in the peripheral-circuit formation region 1A. In the case of the above-described semiconductor chip CP1, the control circuit CC, the transmission circuit TX1, and the reception circuit RX2 described above are formed of the semiconductor elements formed in the peripheral-circuit formation region 1A. In the case of the above-described semiconductor chip CP2, the drive circuit DR, the reception circuit RX1, and the transmission circuit TX2 described above are formed of the semiconductor elements formed in the peripheral-circuit formation region 1A.

Moreover, here, a single-crystal silicon substrate is exemplified for explanations as the semiconductor substrate SB. However, as another mode, a SOI (Silicon On Insulator) substrate, etc. can be also used as the semiconductor substrate SB.

A multi-layered wiring structure composed of a plurality of interlayer insulation films and a plurality of wiring layers is formed on the semiconductor substrate SB.

That is, the plurality of interlayer insulation films IL1, IL2, and IL3 are formed on the semiconductor substrate SB, and the plug V1, the via portions V2 and V3, and the wirings M1, M2, and M3 are formed in the plurality of interlayer insulation layers IL1, IL2, and IL3.

Specifically, the interlayer insulation film IL1 is formed on the semiconductor substrate SB as the insulation film so as to cover the above-described MISFET, and a wiring M1 is formed on this interlayer insulation film IL1. The wiring M1 is a wiring in a first wiring layer (wiring layer on the lowermost layer). The interlayer insulation film IL2 is formed on the interlayer insulation film IL1 as the insulation film so as to cover the wiring M1, and a wiring M2 is formed on this interlayer insulation film IL2. The wiring M2 is a wiring in a second wiring layer which is a one-level higher wiring layer than the first wiring layer. The interlayer insulation film IL3 is formed on the interlayer insulation film IL2 as the insulation film so as to cover the wiring M2, and a wiring M3 is formed on this interlayer insulation film IL3. The wiring M3 is a wiring in a third wiring layer which is a one-level higher wiring layer than the second wiring layer.

The plug V1 is made of a conductor, it is formed in a layer lower than the wiring M1, that is, the plug V1 is formed in the interlayer insulation film IL1 so as to penetrate through the interlayer insulation film IL1, and an upper surface of the plug V1 contacts with a lower surface of the wiring M1, so that the plug V1 is electrically connected to the wiring M1. Further, a bottom portion of the plug V1 is connected to various semiconductor regions (for example, then-type semiconductor region NS, the p-type semiconductor region PS, and others) formed in the semiconductor substrate SB, the gate electrodes G1 and G2, and others. In this manner, the wiring M1 is electrically connected to the various semiconductor regions, the gate electrodes G1 and G2, and others formed in the semiconductor substrate SB.

The via portion V2 is composed of a conductor, and it is formed between the wiring M2 and the wiring M1, that is, the via portion V2 is formed in the interlayer insulation film IL2, to connect the wiring M2 and the wiring M1 to each other. The via portion V2 can also be formed integrally with the wiring M2. Further, the via portion V3 is composed of a conductor, and it is formed between the wiring M3 and the wiring M2, that is, the via portion V3 is formed in the interlayer insulation film IL3, to connect the wiring M3 and wiring M2 to each other. The via portion V3 can also be formed integrally with the wiring M3.

In the semiconductor device of the present embodiment, the third wiring layer, that is, the wiring M3 is the uppermost-layer wiring. More specifically, desired wire connection of the semiconductor elements (for example, the above-described MISFET) formed on the semiconductor substrate SB is made by the first wiring layer (the wiring M1), the second wiring layer (the wiring M2), and the third wiring layer (the wiring M3), and desired operations can be performed.

The pad (pad region, pad electrode) PD1 is formed by the third wiring layer, which is the uppermost-layer wiring. In other words, the pad Pd1 is formed in the same layer as that of the wiring M3. More specifically, the wiring M3 and the pad PD1 are formed by the electrically-conductive layer of the same layer in the same step. Therefore, the pad PD1 is formed on an interlayer insulation film IL3. The pad PD1 can be regarded as apart of the wiring M3. However, while the wiring M3 is covered by the laminated film LF, at least a part of the pad PD1 is exposed from the opening OP1 of the laminated film LF. However, a part of the pad PD1 is covered by the laminated film LF. More specifically, although the pad PD1 is exposed from the opening OP1, the pad PD1 of the part that is not overlapped with the opening OP1 in a planar view is covered by the laminated film LF. Specifically, a central portion of the pad PD1 is not covered by the laminated film LF, and an outer-peripheral portion of the pad PD1 is covered by the laminated film LF. Before a rewiring RW is formed, a test indicating whether the semiconductor device performs the desired operations or not (corresponding to a test step, a later-described probe test) can be performed by utilizing the pad PD1. The pad PD1 is preferably made of an electrically-conductive material (electrically-conductive material exhibiting metal conduction) containing aluminum as a main component (main element). A suitable material of the pad PD1 is exemplified as a compound or an alloy of Al (aluminum) and Si (silicon), a compound or an alloy of Al (aluminum) and Cu (copper), or a compound or an alloy of Al (aluminum), Si (silicon), and Cu (copper), and it is preferable that the composition ratio of Al (aluminum) is larger than 50 atomic % (in other words, Al rich). Moreover, FIG. 3 shows one pad PD1. However, in practice, one or more pads PD1 are formed, and a plurality of pads are preferably formed.

Moreover, as shown in FIG. 4 to FIG. 6, the via portion V3 is provided immediately below the pad PD1, and the pad PD1 can be electrically connected to the wiring M2 via the via portion V3. As another mode, the pad PD1 and the wiring M2 can be electrically connected to each other by providing the wiring M3 integrally formed with the pad PD1, and by connecting the wiring M3 integrally formed with the pad PD1 to the wiring M2 via the via portion V3, which is provided immediately below the wiring M3.

Moreover, although FIG. 3 shows the case in which the number of the wiring layers (not including the rewiring RW) formed on the semiconductor substrate SB1 is three (the case of the three layers in total, i.e., the wirings M1, M2, and M3), the number of the wiring layers is not limited to three and can be variously changed. However, the number is preferable to be two or larger. If the number of the wiring layers (not including the rewiring RW) is three or larger, the coil CL1 formed in the same layer as that of the second wiring layer can be extracted by the wiring (lead wiring) of the first wiring layer, and, therefore, the layout of the coil and the wiring can be easily performed.

As shown in FIG. 3 and FIG. 4, the laminated film (laminated insulation film) LF is formed on the interlayer insulation film IL3 so as to cover the wiring M3, and the rewiring RW is formed on the laminated film LF. The laminated film LF is formed of the silicon oxide film LF1, the silicon nitride film LF2 on the silicon oxide film LF1, and the resin film LF3 on the silicon nitride film LF2. Since each of the silicon oxide film LF1, the silicon nitride film LF2, and the resin film LF3 is an insulation film, the laminated film LF can be regarded as a laminated insulation film obtained by laminating the plurality of insulation films (specifically, the three insulation films of the silicon oxide film LF1, the silicon nitride film LF2, and the resin film LF3).

The pad PD1 is exposed from the opening OP1 of the laminated film LF, and the rewiring RW is formed also on the pad PD1 exposed from the opening OP1. More specifically, the rewiring RW is formed on the laminated film LF including the part on the pad PD1 exposed from the opening OP1 and is electrically connected to the pad PD1. The rewiring RW is a wiring which extracts the pad PD1, which is a part of the uppermost-layer wiring (here, the third wiring layer), to a desired region (the pad PD2) of the semiconductor chip. More specifically, the rewiring RW is formed so as to be extended on the laminated film LF from above the pad PD1, which is exposed from the opening OP1 of the laminated film LF, to the pad PD2 on the laminated film LF.

The pad (pad region, pad electrode, bonding pad) PD2 is formed of the electrically-conductive layer of the same layer as that of the rewiring RW and is integrally formed with the rewiring RW. Therefore, the pad PD2 is also formed on the laminated film LF (in other words, on the resin film LF3 of the laminated film LF), and the pad PD2 is electrically connected to the rewiring RW. Therefore, the pad PD2 is electrically connected to the pad PD1 through the rewiring RW. And, although FIG. 3 shows one pad PD2, one or more pads PD2 are formed in practice, and a plurality of pads are preferably formed.

In the planar view, note that the region where the pad PD2, the rewiring RW, and the pad PD1 are disposed is different from the region where the coil CL1, the coil CL2, and the pad PD3 are disposed. In other words, the pad PD2, the rewiring RW, and the pad PD1 are disposed at the positions at which they are not overlapped with the coil CL1, the coil CL2, and the pad PD3 in the planar view.

The laminated film LF has the opening OP1, which exposes at least a part of the pad PD1. However, the laminated film LF is a laminated film formed of the silicon oxide film LF1, the silicon nitride film LF2, and the resin film LF3. Therefore, the opening OP1 of the laminated film LF is formed by the opening OP1c of the resin film LF3, the opening OP1b of the silicon nitride film LF2, and the opening OP1a of the silicon oxide film LF1 (see FIG. 4 and FIG. 5). The relation among the opening OP1a, the opening OP1b, and the opening OP1c is as shown in FIG. 4 and FIG. 5, and this will be explained later.

Note that FIG. 4 shows integrally the rewiring RW and the pad PD2 without separating a copper film CF and a seed film SE described later in order to facilitate understanding of the drawing.

As shown in FIG. 3, in the transformer formation region 1B, the transformer having the coil (inductor) CL1 and the coil (inductor) CL2 is formed. More specifically, in the transformer formation region 1B, the coil CL1, which is the primary coil of the transformer, and the coil CL2, which is the secondary coil of the transformer, are formed on the semiconductor substrate SB1. In the case of the above-described semiconductor chip CP1, the coil CL1 corresponds to the above-described coil CL1a, the coil CL2 corresponds to the above-described coil CL2a, and the transformer formed by the coil CL1 and the coil CL2 corresponds to the above-described transformer TR1. In the case of the above-described semiconductor chip CP2, the coil CL1 corresponds to the above-described coil CL1b, the coil CL2 corresponds to the above-described coil CL2b, and the transformer formed by the coil CL1 and the coil CL2 corresponds to the above-described transformer TR2.

The coil CL1 and the coil CL2 are not formed in the same layer, but are formed in different layers from each other, and an insulating layer is interposed between the coil CL1 and the coil CL2. Moreover, the coil CL1 on the lower layer side is not formed to be in contact with the semiconductor substrate SB, but is formed on the semiconductor substrate SB via the insulating layer. Specifically, the coil CL1 is formed on an interlayer insulation film (here, the interlayer insulation film IL1) formed on the semiconductor substrate SB.

The coil CL1 is formed in a lower layer than the coil CL2, and the coil CL2 is formed in an upper layer than the coil CL1. In the present embodiment, the coil CL2 in the upper layer side among the coil CL1 and the coil CL2 is formed on the laminated film LF. More specifically, the coil CL2 is formed on the laminated film LF and is disposed above the coil CL1. In other words, the coil CL2 is formed on the resin film LF3 of the laminated film LF. Therefore, the coil CL2 is in contact with the resin film LF3.

The coil CL2 is formed in the same step by an electrically-conductive layer of the same layer as the rewiring RW. Thus, the coil CL2 is formed in the same layer as the rewiring RW. Therefore, the coil CL2 and the rewiring RW are formed of the same material.

In the transformer formation region 1B, on the laminated film LF, the coil CL2 is formed, and the pad (pad region, pad electrode, bonding pad) PD3 is also formed. The pad PD3 is formed by the electrically-conductive layer of the same layer as the coil CL2 and is integrally formed with the coil CL2. Therefore, the pad PD3 is also formed on the laminated film LF (more specifically, on the resin film LF3 of the laminated film LF), and is electrically connected to the coil CL2.

Therefore, the pad PD2, the rewiring RW, the pad PD3, and the coil CL2 are formed in the same layer by the electrically-conductive layer of the same layer, the pad PD2 is integrally formed with and electrically connected to the rewiring RW, and the pad PD3 is integrally formed with and electrically connected to the coil CL2. However, the rewiring RW and the coil CL2 are separated from each other and are not connected by a conductor. Moreover, the pad PD2 and the pad PD3 are separated from each other and are not connected by a conductor. Moreover, the pad PD2 and the coil CL2 are separated from each other and are not connected by a conductor. The pad PD3 and the rewiring RW are separated from each other and are not connected by a conductor. Although, the pad PD2 is electrically connected to the pad PD1 via the rewiring RW, the pad PD3 is not connected to the pad PD1 by a conductor. In the transformer formation region 1B, although the coil CL1, the coil CL2, and the pad PD3 are formed, the pad PD1, the rewiring RW, and the pad PD2 are not formed.

The coil CL1 in the lower layer side among the coil CL1 and the coil CL2 is formed in the lower wiring layer than the uppermost-layer wiring (here, the third wiring layer) in the multi-layered wiring structure excluding the rewiring RW. Here, the coil CL1 is formed by the second wiring layer which is lower than the third wiring layer which is the uppermost-layer wiring. In other words, the coil CL1 is formed in the same layer as the wiring M2.

Since the coil CL1 is formed by the second wiring layer, the coil CL1 can be formed by the electrically-conductive layer of the same layer as the wiring M2 in the same step. For example, when the wiring M2 is formed by patterning an electrically-conductive film formed on the interlayer insulation film IL2, not only the wiring M2 but also the coil CL1 can be formed in the patterning of the electrically-conductive film. Moreover, for example, when the wiring M2 is formed by using a damascene method, the coil CL1 can be also formed by using the damascene method in the same step as the wiring M2. In this case, the wiring M2 and the coil CL1 are formed by an electrically-conductive film (for example, an electrically-conductive film mainly containing copper) buried in a trench of the interlayer insulation film IL2.

A plurality of insulating layers are interposed between the coil CL2 and the coil CL1, more specifically, the interlayer insulation film IL3 and the laminated film LF are interposed therebetween. More specifically, between the coil CL2 and the coil CL1, the interlayer insulation film IL3, the silicon oxide film LF1, the silicon nitride film LF2, and the resin film LF3 are interposed in this order from bottom. Therefore, the coil CL2 and the coil CL1 are not connected by a conductor and are in an electrically insulated state. However, the coil CL2 and the coil CL1 are magnetically coupled to each other.

Therefore, the coil CL1 in the lower layer side is formed in the same layer as the wiring M2, which is the second wiring layer, so that the coil CL2 is formed on the coil CL1 via the interlayer insulation film IL3, the silicon oxide film LF1, the silicon nitride film LF2, and the resin film LF3.

The resin film LF3 is preferably a polyimide film. The polyimide (polyimide) film is a polymer having imide bonding in a repeating unit and is a type of an organic insulation film. As the resin film LF3, in addition to the polyimide film, other organic insulation films such as epoxy-based, PBO-based, acrylic-based, and WRP-based resins can be also used. A polyimide-based resin is an organic resin suitably used in a device, which is required to have high heat resistance of 200° C. or higher, and can be selectively used depending on the thermal expansion coefficient, mechanical strength such as ductility, a cure temperature, etc. of a material.

An insulative protective film (surface protective film, insulation film, protective insulation film) PA is formed on the laminated film LF, in other words, on the resin film LF3 so as to cover the rewiring RW and the coil CL2. The protective film PA is an insulation film and can be therefore regarded as a protective insulation film. The rewiring RW and the coil CL2 are covered and protected by the protective film PA. As the protective film PA, a resin film is preferred, and, for example, a polyimide film can be preferably used. The protective film PA is an outermost film of the semiconductor chip (semiconductor device).

The pads PD2 and PD3 are exposed from openings OP2 and OP3 of the protective film PA, respectively. More specifically, the pad PD2 is exposed from the opening OP2 of the protective film PA by providing the opening OP2 on the pad PD2, and the pad PD3 is exposed from the opening OP3 of the protective film PA by providing the opening OP3 on the pad PD3. Therefore, electrically-conductive connecting members such as the bonding wires BW described later can be connected to the pads PD2 and PD3 exposed from the openings OP2 and OP3 of the protective film PA, respectively.

Moreover, it is preferred to form an underlying metal film UM on each of the pads PD2 and PD3. More specifically, the underlying metal film UM is formed on the pad PD2, and the underlying metal film UM on the pad PD2 is exposed from the opening OP2 of the protective film PA. Moreover, the underlying metal film UM is formed on the pad PD3, and the underlying metal film UM on the pad PD3 is exposed from the opening OP3 of the protective film PA. In this manner, since the electrically-conductive connecting members such as the later-described bonding wires BW are to be connected to the underlying metal films UM exposed from the openings OP2 and OP3 of the protective film PA, respectively, the connecting members (bonding wires BW) can be easily connected. The underlying metal film UM is formed of, for example, a laminated film of a nickel (Ni) film and a gold (Au) film on the nickel (Ni) film.

Note that the protective film PA is preferred to be formed, but can be omitted. However, if the protective film PA is formed, the rewiring RW and the coil CL2 can be covered and protected by the protective film PA, and therefore, advantages such as further improvement of reliability and easy handling of the semiconductor chip are obtained.

When the semiconductor device of FIG. 3 is applied to the above-described semiconductor chip CP1, the above-described transmission circuit TX1 and the coils CL1 and CL2 (corresponding to the above-described coils CL1a and CL2a) are formed in the semiconductor chip CP1, and the transmission circuit TX1 formed in the semiconductor chip CP1 is electrically connected to the coil CL1 in the semiconductor chip CP1 via internal wiring. Moreover, when the semiconductor device of FIG. 3 is applied to the above-described semiconductor chip CP2, the above-described transmission circuit TX2 and the coils CL1 and CL2 (corresponding to the above-described coils CL1b and CL2b) are formed in the semiconductor chip CP2, and the transmission circuit TX2 formed in the semiconductor chip CP2 is electrically connected to the coil CL1 in the semiconductor chip CP2 via internal wiring.

In this case, signals for transmission can be transmitted from the transmission circuit TX1 in the semiconductor chip CP1 to the coil CL1 in the semiconductor chip CP1 via the internal wiring in the semiconductor chip CP1. The pad PD3 connected to the coil CL2 in the semiconductor chip CP1 is electrically connected to the pad PD2 (the pad PD2 connected to the rewiring RW) of the semiconductor chip CP2 via an electrically-conductive connecting member such as the later-described bonding wire BW, and is further electrically connected to the reception circuit RX1 in the semiconductor chip CP2 via the internal wiring of the semiconductor chip CP2. In this manner, in the semiconductor chip CP1, the signals (received signals) received by the coil CL2 from the coil CL1 through electromagnetic induction can be transmitted to the reception circuit RX1 in the semiconductor chip CP2 via the later-described bonding wire BW (connecting member) and the internal wiring of the semiconductor chip CP2.

Similarly, signals for transmission can be transmitted from the transmission circuit TX2 in the semiconductor chip CP2 to the coil CL1 in the semiconductor chip CP2 via the internal wiring in the semiconductor chip CP2. The pad PD3 connected to the coil CL2 in the semiconductor chip CP2 is electrically connected to the pad PD2 (the pad PD2 connected to the rewiring RW) of the semiconductor chip CP1 via the electrically-conductive connecting member such as the later-described bonding wire BW, and is further electrically connected to the reception circuit RX2 in the semiconductor chip CP1 via the internal wiring of the semiconductor chip CP1. In this manner, in the semiconductor chip CP2, the signals (received signals) received by the coil CL2 from the coil CL1 through electromagnetic induction can be transmitted to the reception circuit RX2 in the semiconductor chip CP1 via the later-described bonding wire BW (connecting member) and the internal wiring of the semiconductor chip CP1.

<Regarding Manufacturing Steps>

Next, manufacturing steps of the semiconductor device of the present embodiment will be explained. The semiconductor device of FIG. 3 described above is manufactured by the following manufacturing steps.

Each of FIG. 7 to FIG. 31 is a cross-sectional view of a principal part in the manufacturing step of the semiconductor device of the present embodiment. FIG. 7 to FIG. 31 show the cross-sectional views of a cross-sectional region corresponding to FIG. 3 described above.

Figure 7:
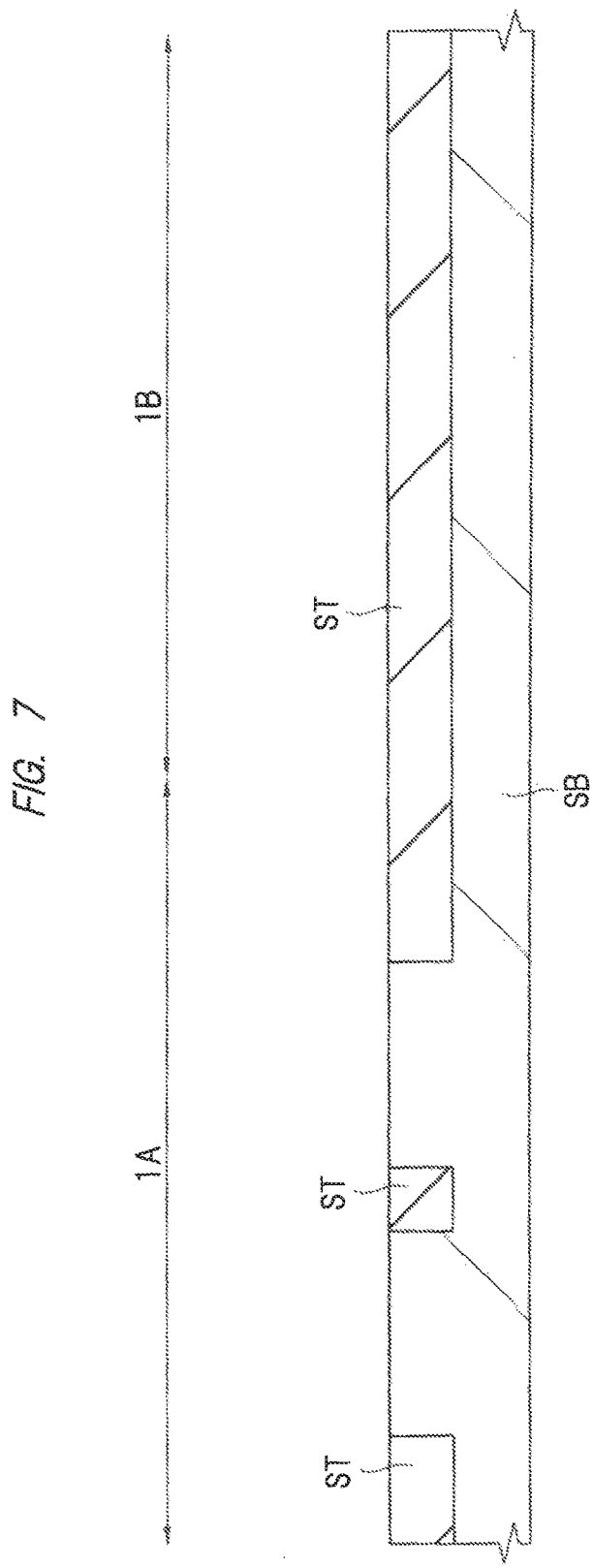
FIG. 7 is a cross-sectional view of a principal part in a manufacturing step of the semiconductor device of the embodiment.

First, as shown in FIG. 7, the semiconductor substrate (semiconductor wafer) SB made of, for example, p-type single-crystal silicon having a specific resistance of about 1 to 10 Ωcm is prepared (provided).

The semiconductor substrate SB has the peripheral-circuit formation region 1A, which is a region where a peripheral circuit is to be formed, and the transformer formation region 1B, which is a region where the transformer is to be formed. The peripheral-circuit formation region 1A and the transformer formation region 1B correspond to planar regions of the main surface of the same semiconductor substrate SB, which are different from each other.

Note that the peripheral circuits formed in the peripheral-circuit formation region 1A are the control circuit CC, the transmission circuit TX1, the reception circuit RX2, etc. described above in the case of the above-described semiconductor chip CP1, and are the drive circuit DR, the reception circuit RX1, the transmission circuit TX2, etc. described above in the case of the above-described semiconductor chip CP2. Moreover, the transformer formed in the transformer formation region 1B is the above-described transformer TR1 in the case of the above-described semiconductor chip CP1, and is the above-described transformer TR2 in the case of the above-described semiconductor chip CP2. Therefore, the coil CL1 and the coil CL2 formed in the transformer formation region 1B are the coil CL1$a$ and the coil CL2$a$ described above in the case of the above-described semiconductor chip CP1, and are the coil CL1$b$ and the coil CL2$b$ described above in the case of the above-described semiconductor chip CP2, respectively.

Then, on the main surface of the semiconductor substrate SB, element isolation regions ST are formed by, for example, a STI (Shallow Trench Isolation) method or others. The element isolation region ST is formed by forming a trench on the semiconductor substrate SB and burying an insulation film in the trench. Inactive regions specified (defined) by the element isolation regions ST in the semiconductor substrate SB, MISFETs are formed so as to be described later.

Then, a semiconductor element such as MISFETs are formed on (in the active regions of) the semiconductor substrate SB of the peripheral-circuit formation region 1A. Hereinafter, formation steps of the MISFETs will be explained.

Figure 8:
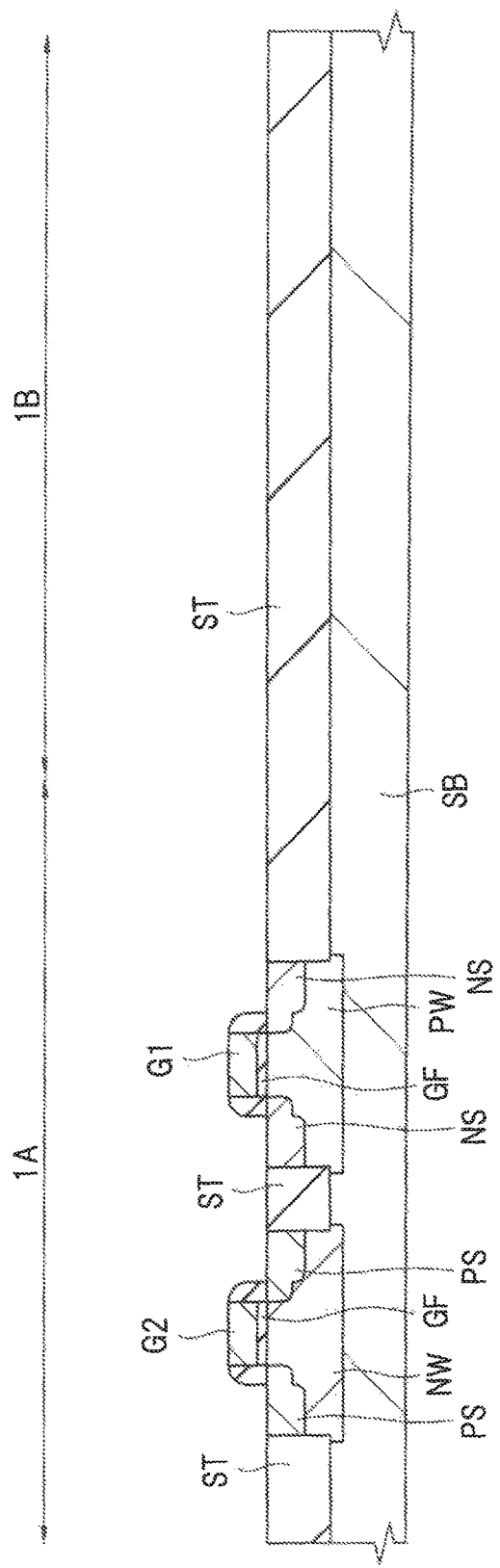
FIG. 8 is a cross-sectional view of a principal part in a manufacturing step of the semiconductor device, continued from FIG. 7.

First, as shown in FIG. 8, a p-type well PW and an n-type well NW are formed on the semiconductor substrate SB. Each of the p-type well PW and the n-type well NW is formed by ion implantation and is formed from the main surface of the semiconductor substrate SB down to a predetermined depth.

Then, gate electrodes G1 and G2 are formed on the main surface of the semiconductor substrate SB via a gate insulation film GF. The gate electrode G1 is formed on the p-type well PW via the gate insulation film GF, and the gate electrode G2 is formed on the n-type well NW via the gate insulation film GF.

Specifically, the gate electrodes G1 and G2 can be formed via the gate insulation film GF as follows. More specifically, first, the main surface of the semiconductor substrate SB is cleaned by, for example, rinsing treatment, and an insulation film for the gate insulation film GF is formed on the main surface of the semiconductor substrate SB, and then, a polycrystalline silicon film for the gate electrodes G1 and G2 is formed on the insulation film. The insulation film for the gate insulation film GF is formed of, for example, a silicon oxide film, a silicon oxynitride film, or others, and can be formed by, for example, a thermal oxidation method. The polycrystalline silicon film for the gate electrodes G1 and G2 can be formed by, for example, a CVD (Chemical Vapor Deposition) method. The polycrystalline silicon film is formed into a doped polysilicon film so as to be a low-resistance semiconductor film (electrically-conductive material film) by doping with an impurity in the film formation or by introducing an impurity by ion implantation after the film formation. Moreover, the polycrystalline silicon film which has been an amorphous silicon film in the film formation can be also changed into a polycrystalline silicon film by thermal treatment after the film formation. Then, the gate electrodes G1 and G2 formed of the patterned polycrystalline silicon film can be formed by patterning the polycrystalline silicon film by a photolithography technique and an etching technique. The insulation film for the gate insulation film GF remaining below the gate electrodes G1 and G2 serves as the gate insulation film GF.

Then, an n-type semiconductor region NS for source/drain of an n-channel-type MISFET is formed in the p-type well PW of the semiconductor substrate SB, and a p-type semiconductor region PS for source/drain of a p-channel-type MISFET is formed in the n-type well NW of the semiconductor substrate SB. Each of the n-type semiconductor region NS and the p-type semiconductor region PS can be formed by ion implantation. The ion implantation into the regions immediately below the gate electrodes G1 and G2 is prevented, and therefore, the n-type semiconductor regions NS are formed in the regions on both sides of the gate electrode G1 at the p-type well PW, and the p-type semiconductor regions PS are formed in the regions on both sides of the gate electrode G1 at the n-type well NW.

If each of the n-type semiconductor region NS and the p-type semiconductor region PS has the LDD structure, each of the $n^-$-type semiconductor region and the $p^-$-type semiconductor region of low impurity concentrations is formed by ion implantation, and a sidewall insulation film (sidewall spacer) is formed on side walls of the gate electrodes G1 and G2, and then, each of the $n^+$-type semiconductor region and the $p^+$-type semiconductor region of high impurity concentrations is formed by ion implantation. In this manner, the n-type semiconductor region NS can be formed into an n-type semiconductor region having the LDD structure formed of the $n^-$-type semiconductor region of the low impurity concentration and the $n^+$-type semiconductor region of the high impurity concentration, and the p-type semiconductor region PS can be formed into a p-type semiconductor region having the LDD structure formed of the p⁻-type semiconductor region of the low impurity concentration and the p⁺-type semiconductor region of the high impurity concentration.

Then, anneal treatment (thermal treatment) for activating the impurities which have been introduced by the past ion implantation is performed.

In this manner, an n-channel-type MISFET and a p-channel-type MISFET are formed on the semiconductor substrate SB of the peripheral-circuit formation region 1A. The gate electrode G1, the gate insulation film GF below the gate electrode G1, and the n-type semiconductor regions NS function as a gate electrode, a gate insulation film, and source/drain regions of the n-channel-type MISFET. Moreover, the gate electrode G2, the gate insulation film GF below the gate electrode G2, and the p-type semiconductor regions PS function as a gate electrode, a gate insulation film, and source/drain regions of the p-channel-type MISFET.

Then, a low-resistance metal silicide layer (not shown) can be also formed on each upper portion (surface layer portion), etc. of then-type semiconductor regions NS, the p-type semiconductor regions PS, and the gate electrodes G1 and G2 by using a salicide (Salicide: Self Aligned Silicide) technique. For example, by forming a metal film for forming the metal silicide layer on the semiconductor substrate SB, and then, performing a thermal treatment, the metal film is reacted with each upper layer of the n-type semiconductor regions NS, the p-type semiconductor regions PS, and the gate electrodes G1 and G2, and then, unreacted parts of the metal film are removed. In this manner, the metal silicide layer (not shown) can be formed on each upper portion (surface layer portion) of the n-type semiconductor regions NS, the p-type semiconductor regions PS, and the gate electrodes G1 and G2. By forming the metal silicide layer, the contact resistance, diffusion resistance, etc. of the n-type semiconductor regions NS, the p-type semiconductor regions PS, and the gate electrodes G1 and G2 can be reduced. Moreover, the metal silicide layer is not required to be formed, or the n-type semiconductor regions NS, the p-type semiconductor regions PS, and the gate electrodes G1 and G2 on which the metal silicide layer is formed and those on which the metal silicide layer is not formed can be provided.

Figure 9:
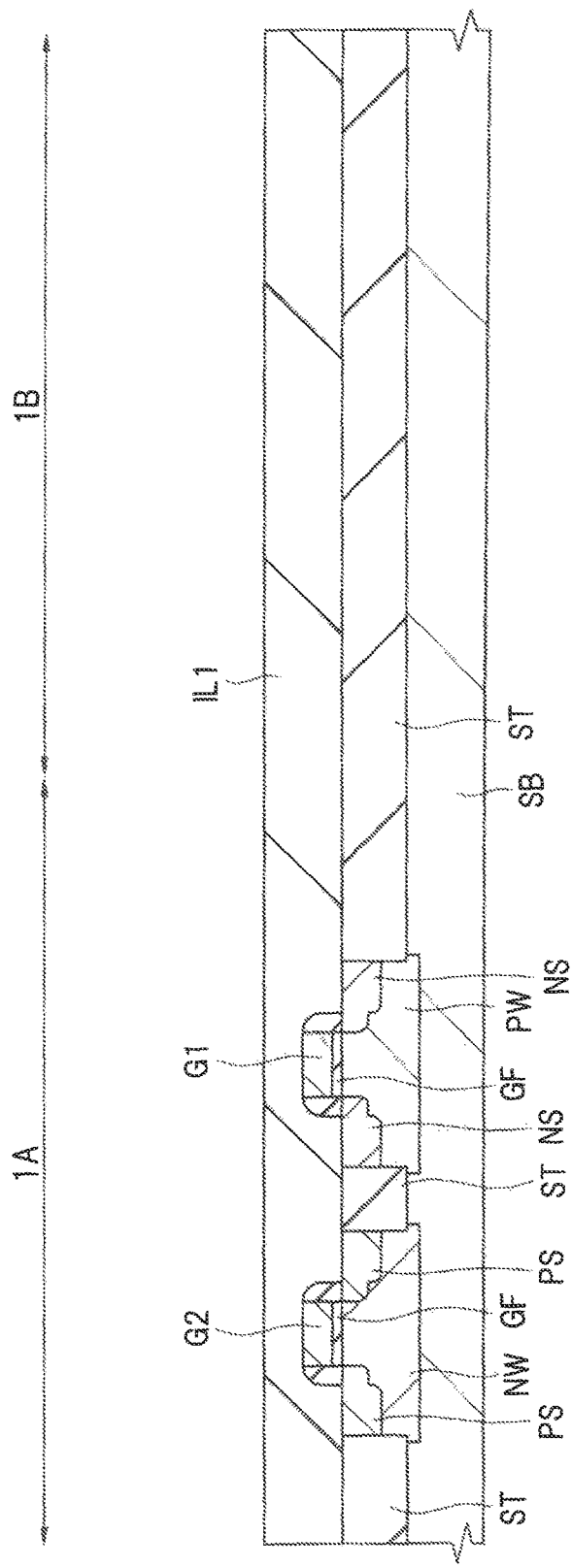
FIG. 9 is a cross-sectional view of a principal part in a manufacturing step of the semiconductor device, continued from FIG. 8.

Then, as shown in FIG. 9, the interlayer insulation film IL1 is formed on the main surface (entire main surface) of the semiconductor substrate SB. The interlayer insulation film IL1 is formed so as to cover the MISFETs formed on the semiconductor substrate SB. More specifically, the interlayer insulation film IL1 is formed on the main surface of the semiconductor substrate SB so as to cover then-type semiconductor regions NS, the p-type semiconductor regions PS, and the gate electrodes G1 and G2. Since the interlayer insulation film IL1 is formed on the entire main surface of the semiconductor substrate SB, the interlayer insulation film IL1 is formed in both of the peripheral-circuit formation region 1A and the transformer formation region 1B. The interlayer insulation film IL1 is formed of, for example, a single film of a silicon oxide film, a laminated film of a silicon nitride film and a silicon oxide film thicker than the silicon nitride film (the silicon nitride film is in the lower layer side, and the silicon oxide film is in the upper layer side), or others.

After the film formation of the interlayer insulation film IL1, the upper surface of the interlayer insulation film IL1 is planarized as needed, by, for example, polishing the surface (upper surface) of the interlayer insulation film IL1 by a CMP (Chemical Mechanical Polishing) method or others. Even if concave/convex shapes are formed on the surface of the interlayer insulation film IL1 due to underlying unevenness, the interlayer insulation film IL1 having the planarized surface can be obtained by polishing the surface of the interlayer insulation film IL1 by the CMP method.

Figure 10:
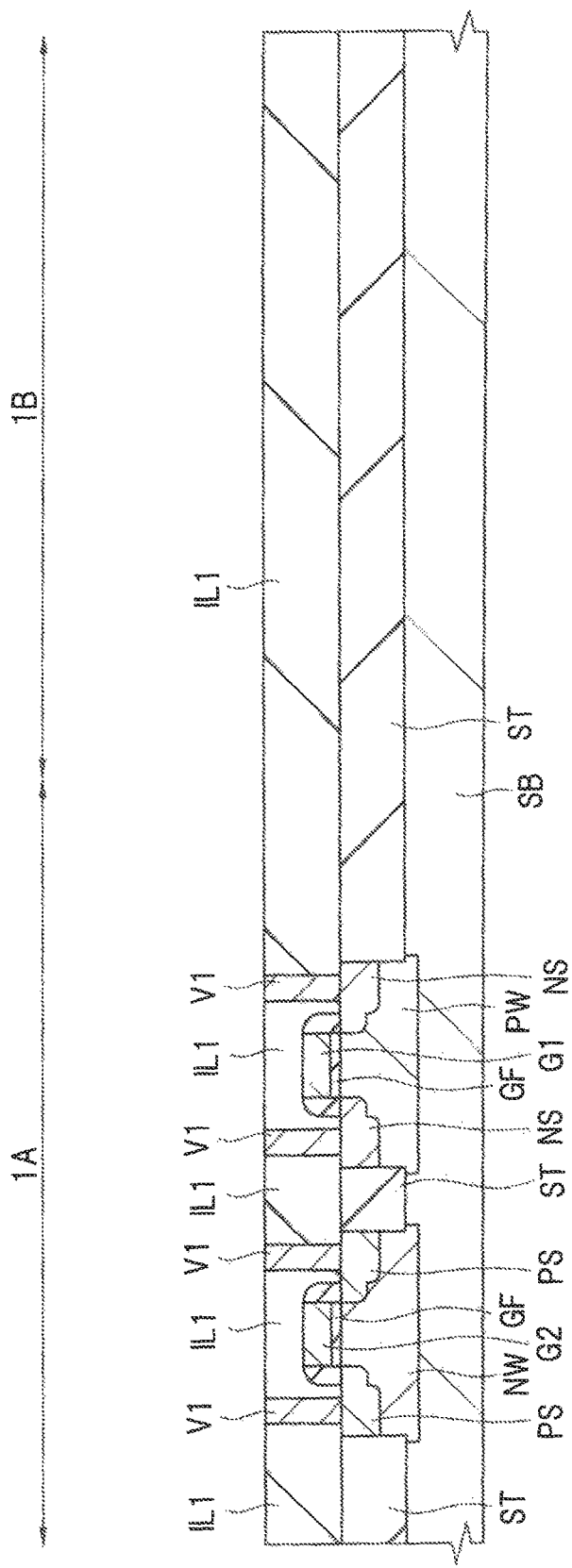
FIG. 10 is a cross-sectional view of a principal part in a manufacturing step of the semiconductor device, continued from FIG. 9.

Then, the interlayer insulation film IL1 is dry-etched while using a photoresist layer (not shown), which is formed on the interlayer insulation film IL1 by using a photolithography technique, as an etching mask, so that contact holes (through holes, holes) are formed in the interlayer insulation film IL1. Then, an electrically-conductive film is buried in the contact holes, so that electrically-conductive plugs (connecting conductor portions) V1 are formed as shown in FIG. 10.

In order to form the plugs V1, for example, a barrier conductor film (for example, a titanium film, a titanium nitride film, or a laminated film formed of them) is formed on the interlayer insulation film IL1 including the inside (on bottom portions and side walls) of the contact holes by, for example, a sputtering method or a plasma CVD method. Then, a main conductor film formed of, for example, a tungsten film is formed on the barrier conductor film by, for example, a CVD method or others so as to bury the contact holes. Then, the unnecessary main conductor film and the unnecessary barrier conductor film which are outside the contact holes (on the interlayer insulation film IL1) are removed by, for example, a CMP method or an etch back method. In this manner, the upper surface of the interlayer insulation film IL1 is exposed, and the plugs V1 are formed by the barrier conductor film and the main conductor film buried and remaining in the contact holes of the interlayer insulation film IL1. In order to simplify the drawing, FIG. 10 shows that that the main conductor film and the barrier conductor film are integrated as the plug V1. The plug V1 is electrically connected to, for example, the n-type semiconductor region NS, the p-type semiconductor region PS, the gate electrode G1, or the gate electrode G2 in the bottom portions thereof.

Figure 11:
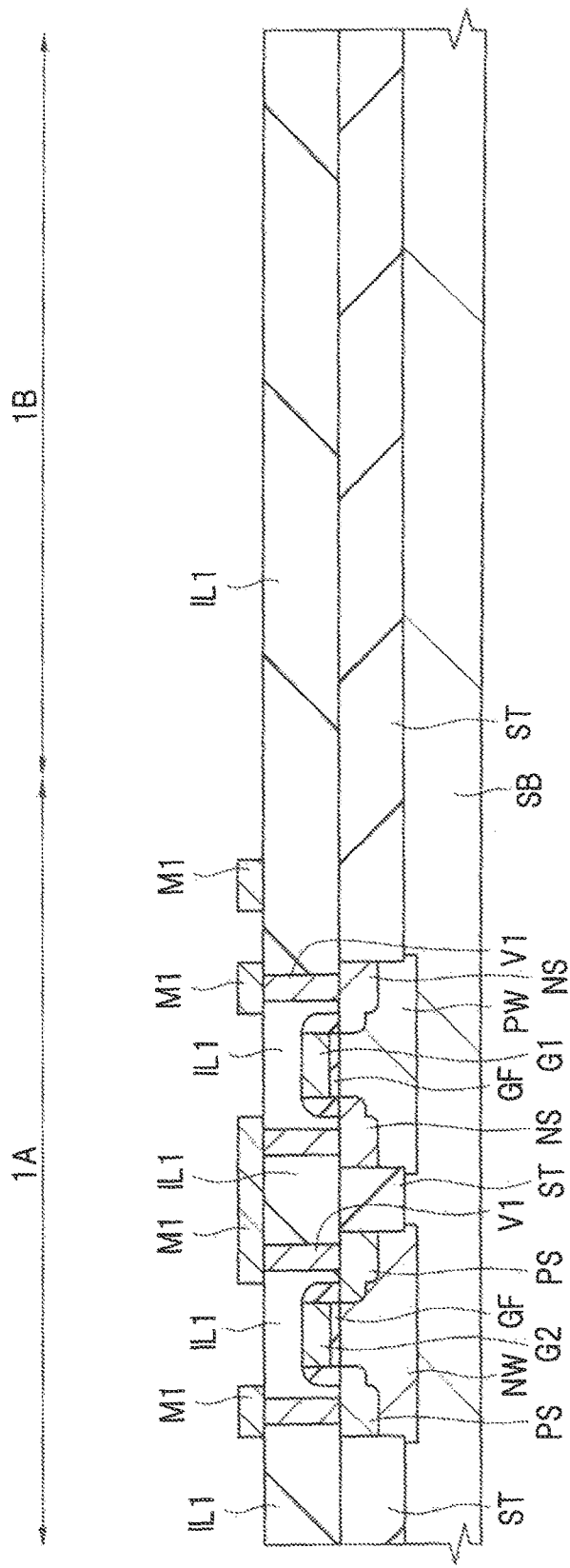
FIG. 11 is a cross-sectional view of a principal part in a manufacturing step of the semiconductor device, continued from FIG. 10.

Then, as shown in FIG. 11, the wiring M1 of the first wiring layer which is a lowermost wiring layer is formed on the interlayer insulation film IL1 in which the plugs V1 are buried. In order to form the wiring M1, first, an electrically-conductive film for the first wiring layer is formed on the interlayer insulation film IL1 in which the plugs V1 are buried. The electrically-conductive film is formed of, for example, a laminated film of a barrier conductor film (for example, a titanium film, a titanium nitride film, or a laminated film formed of them), an aluminum film, and a barrier conductor film (for example, a titanium film, a titanium nitride film, or a laminated film formed of them) in this order from bottom by using a sputtering method or others. The aluminum film in this electrically-conductive film can be regarded as an aluminum film for forming the wiring M1. Then, the wiring M1 can be formed by patterning the electrically-conductive film by using a photolithography technique and an etching technique. The plugs V1 are electrically connected to the wiring M1 since the upper surfaces thereof are in contact with the wiring M1.

The above-described aluminum film for forming the wiring M1 is not limited to a pure aluminum film, and an electrically-conductive material film containing aluminum as a main component (however, an electrically-conductive material film exhibiting metal conduction) can be used. For example, a compound film or an alloy film of Al (aluminum)

and Si (silicon), a compound film or an alloy film of Al (aluminum) and Cu (copper), or a compound film or an alloy film of Al (aluminum), Si (silicon), and Cu (copper) can be preferably used as the aluminum film for forming the wiring M1. Moreover, it is preferable that the composition ratio of Al (aluminum) of the aluminum film is larger than 50 atomic % (in other words, Al rich). This is similar for not only the above-described aluminum film for forming the wiring M1 but also an aluminum film for forming the wiring M2 (in other words, an aluminum film constituting a later-described electrically-conductive film CD1) and an aluminum film for forming the wiring M3 (in other words, an aluminum film constituting a later-described electrically-conductive film CD2).

Moreover, the wiring M1 of the first wiring layer can be formed in not only the peripheral-circuit formation region 1A but also the transformer formation region 1B. As the wiring M1 formed in the transformer formation region 1B, for example, the wirings (wirings corresponding to later-described lead wirings HW1, HW2) which electrically connect the coil CL1 and the peripheral circuit (the transmission circuit TX1, the transmission circuit TX2 described above, or others) are exemplified.

Also, here, the case of the formation of the wiring M1 by the method of patterning the electrically-conductive film has been explained. As another mode, the wiring M1 can be also formed by a damascene method. In this case, the wiring M1 serving as a buried wiring (for example, buried copper wiring) can be formed by forming an insulation film on the interlayer insulation film IL1, in which the plugs V1 are buried, and then, forming a wiring trench in the insulation film, and burying an electrically-conductive film in the wiring trench.

Figure 12:
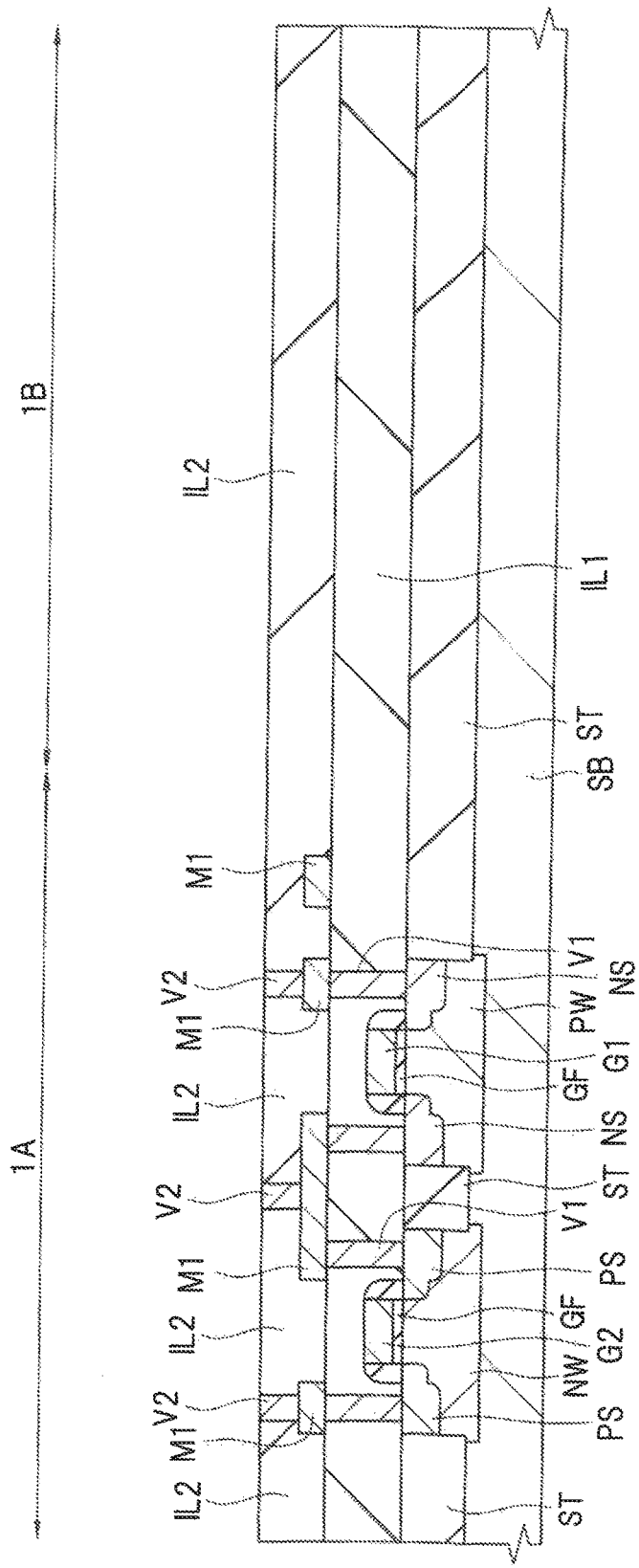
FIG. 12 is a cross-sectional view of a principal part in a manufacturing step of the semiconductor device, continued from FIG. 11.

Then, as shown in FIG. 12, the interlayer insulation film IL2 is formed on the main surface (entire main surface) of the semiconductor substrate SB, in other words, on the interlayer insulation film IL1 so as to cover the wiring M1. The interlayer insulation film IL2 is formed of, for example, a silicon oxide film and can be formed by using, for example, a CVD method. After the film formation of the interlayer insulation film IL2, flatness of the upper surface of the interlayer insulation film IL2 can be increased as needed by polishing the surface (upper surface) of the interlayer insulation film IL2 by a CMP method or others.

Then, the interlayer insulation film IL2 is dry-etched while using a photoresist layer (not shown), which is formed on the interlayer insulation film IL2 by using a photolithography technique, as an etching mask, so that a through hole (penetrating hole, hole) is formed in the interlayer insulation film IL2. Then, an electrically-conductive via portion (connecting conductor portion) V2 is formed by burying an electrically-conductive film in the through hole. The via portions V2 can be also regarded as electrically-conductive plugs. The via portions V2 can be formed by a method similar to that of the plugs V1. However, the material of the electrically-conductive film of the via portions V2 can be changed from that of the plugs V1. For example, the plugs V1 are mainly composed of a tungsten film, while the via portions V2 may be mainly composed of an aluminum film.

Figure 13:
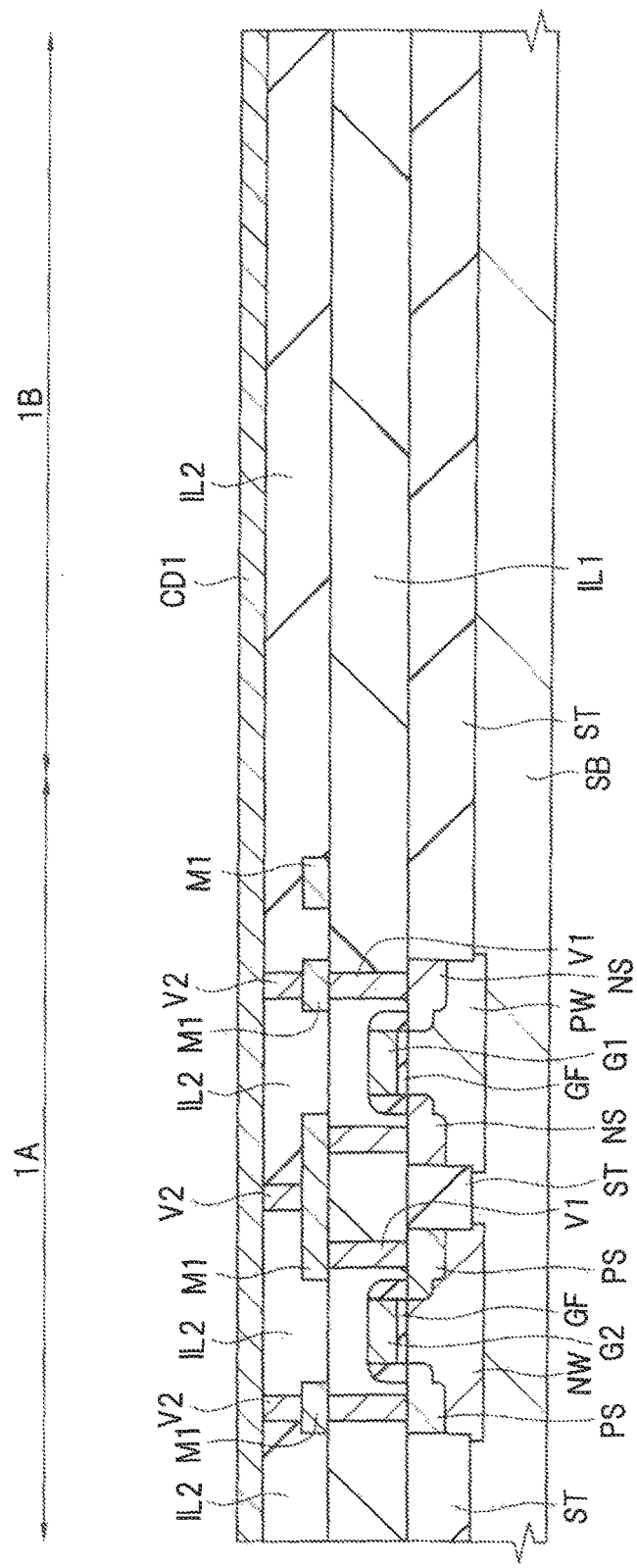
FIG. 13 is a cross-sectional view of a principal part in a manufacturing step of the semiconductor device, continued from FIG. 12.
Figure 14:
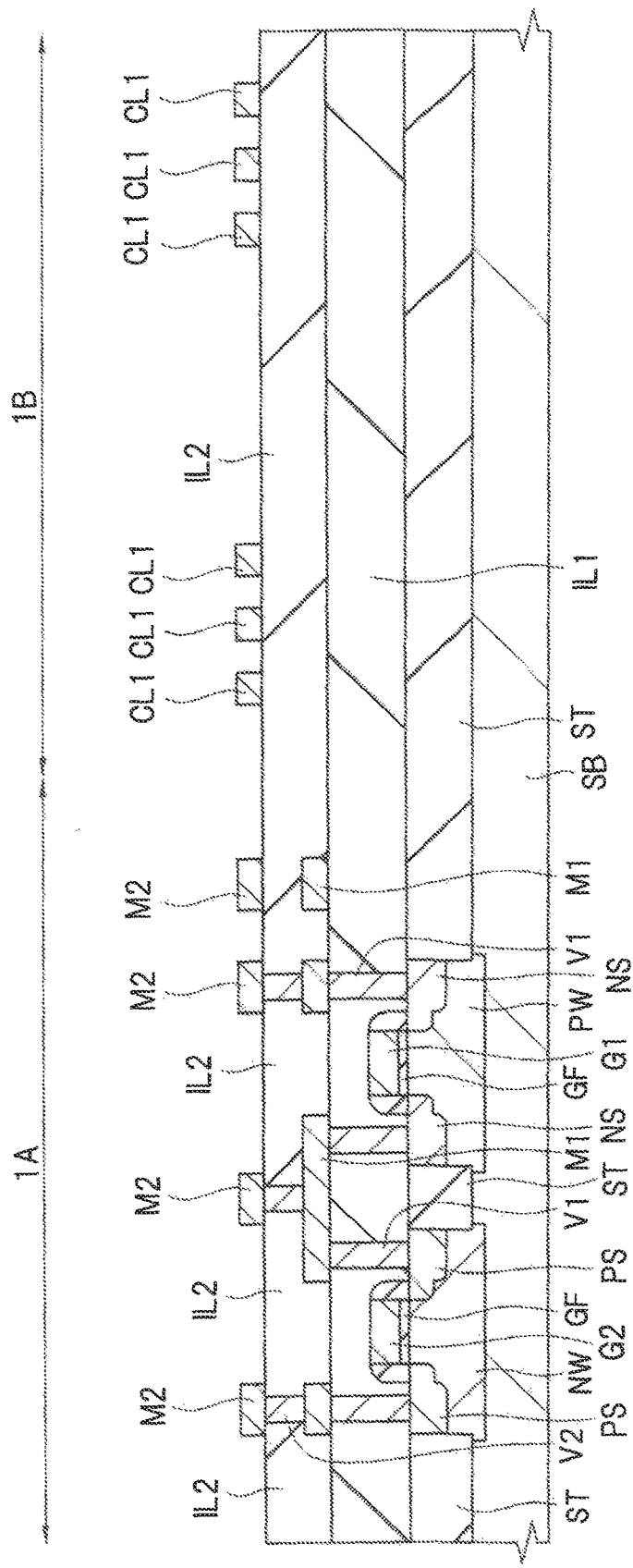
FIG. 14 is a cross-sectional view of a principal part in a manufacturing step of the semiconductor device, continued from FIG. 13.

Then, the wiring M2 of the second wiring layer is formed on the interlayer insulation film IL2, in which the via portions V2 are buried. In order to form the wiring M2, first, as shown in FIG. 13, the electrically-conductive film CD1 for the second wiring layer is formed on the interlayer insulation film IL2, in which the via portions V2 are buried. The electrically-conductive film CD1 is composed of a laminated film of a barrier conductor film (for example, a titanium film, a titanium nitride film, or a laminated film of them), an aluminum film, and a barrier conductor film (for example, a titanium film, a titanium nitride film, or a laminated film of them) in this order from bottom, and can be formed by using a sputtering method or others. The electrically-conductive film CD1 is an electrically-conductive film for the second wiring layer, but also is as an electrically-conductive film for forming the coil CL1. Then, when the electrically-conductive film CD1 is patterned by using a photolithography technique and an etching technique, the wiring M2 and the coil CL1 can be formed as shown in FIG. 14. Each of the wiring M2 and the coil CL1 is composed of the patterned electrically-conductive film CD1. The via portion V2 is electrically connected to the wiring M1 since the lower surface thereof is in contact with the wiring M1 and is electrically connected to the wiring M2 since the upper surface thereof is in contact with the wiring M2. Thus, the via portion V2 electrically connects the wiring M1 and the wiring M2.

Here, in the transformer formation region 1B, the coil CL1 is formed in the same layer and the same step as those of the wiring M2 of the second wiring layer. More specifically, when the electrically-conductive film CD1 for the second wiring layer is patterned, the coil CL1 is formed in the transformer formation region 1B. More specifically, the electrically-conductive film CD1 for the second wiring layer also serves as an electrically-conductive film for forming the coil CL1, and, after the electrically-conductive film CD1 is formed, the wiring M2 and the coil CL1 of the second wiring layer are formed by patterning this electrically-conductive film CD1 by using a photolithography technique and an etching technique.

Moreover, here, the case of the formation of the via portions V2 and the wiring M2 in different steps from each other has been explained. As another mode, the via portions V2 and the wiring M2 can be formed in the same step. In this case, the via portions V2 are integrally formed with the wiring M2 or the coil CL1. In this case, the wiring M2 and the coil CL1 are formed by forming through holes for the via portions V2 in the interlayer insulation film IL2, and then, forming the electrically-conductive film CD1 on the interlayer insulation film IL2 so as to bury the through holes, and patterning the electrically-conductive film CD1 by a photolithography technique and an etching technique. In this manner, the wiring M2 and the coil CL1 are formed, and the via portions V2 integrally formed with the wiring M2 or the coil CL1 are also formed.

Meanwhile, here, the case of the formation of the wiring M2 and the coil CL1 by the method of patterning the electrically-conductive film has been explained. As another mode, the wiring M2 and the coil CL1 can be also formed by a damascene method. In this case, the wiring M2 serving as a buried wiring (for example, buried copper wiring) and the coil CL1 can be formed by forming an insulation film on the interlayer insulation film IL2, and then, forming a wiring trench on the insulation film, and burying an electrically-conductive film in the wiring trench. Alternatively, the wiring M2 serving as a buried wiring (for example, buried copper wiring) and the coil CL1 can be also formed by forming a wiring trench on the interlayer insulation film IL2 and burying an electrically-conductive film in the wiring trench.

Figure 15:
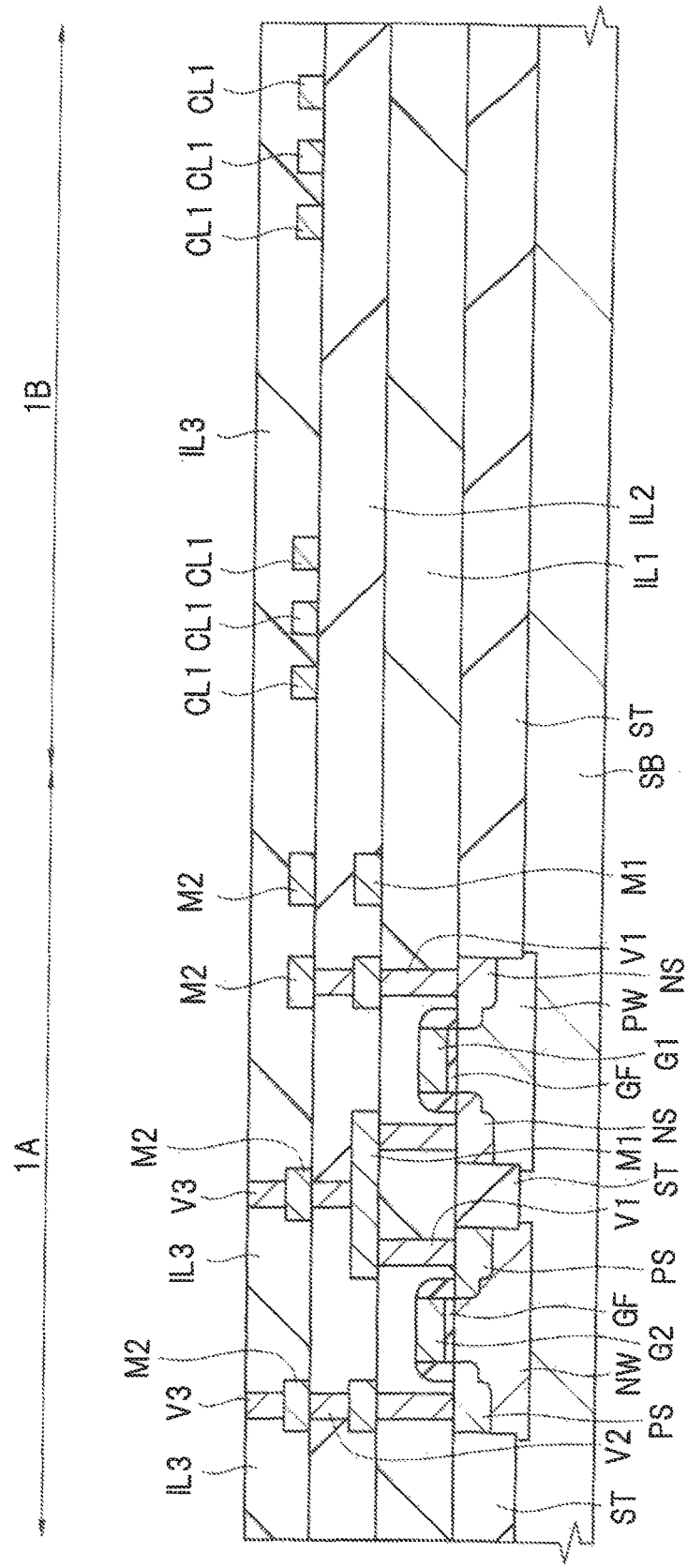
FIG. 15 is a cross-sectional view of a principal part in a manufacturing step of the semiconductor device, continued from FIG. 14.

Then, as shown in FIG. 15, the interlayer insulation film IL3 is formed on the main surface (entire main surface) of the semiconductor substrate SB, in other words, on the interlayer insulation film IL2 so as to cover the wiring M2. The interlayer insulation film IL3 is composed of, for example, a silicon oxide film and can be formed by using, for example, a CVD method. After the film formation of the interlayer insulation film IL3, flatness of the upper surface of the interlayer insulation film IL3 can be increased as needed by, for example, polishing the surface (upper surface) of the interlayer insulation film IL3 by a CMP method or others.

Then, through holes (penetrating holes, holes) are formed in the interlayer insulation film IL3 by dry-etching the interlayer insulation film IL3 while using a photoresist layer (not shown), which is formed on the interlayer insulation film IL3 by using a photolithography technique, as an etching mask. Then, the electrically-conductive via portions (connecting conductor portions) V3 are formed by burying an electrically-conductive film in the through holes. The via portions V3 can be also regarded as electrically-conductive plugs. The via portions V3 can be formed by a similar electrically-conductive material and a similar method as those of the vias V2.

Figure 16:
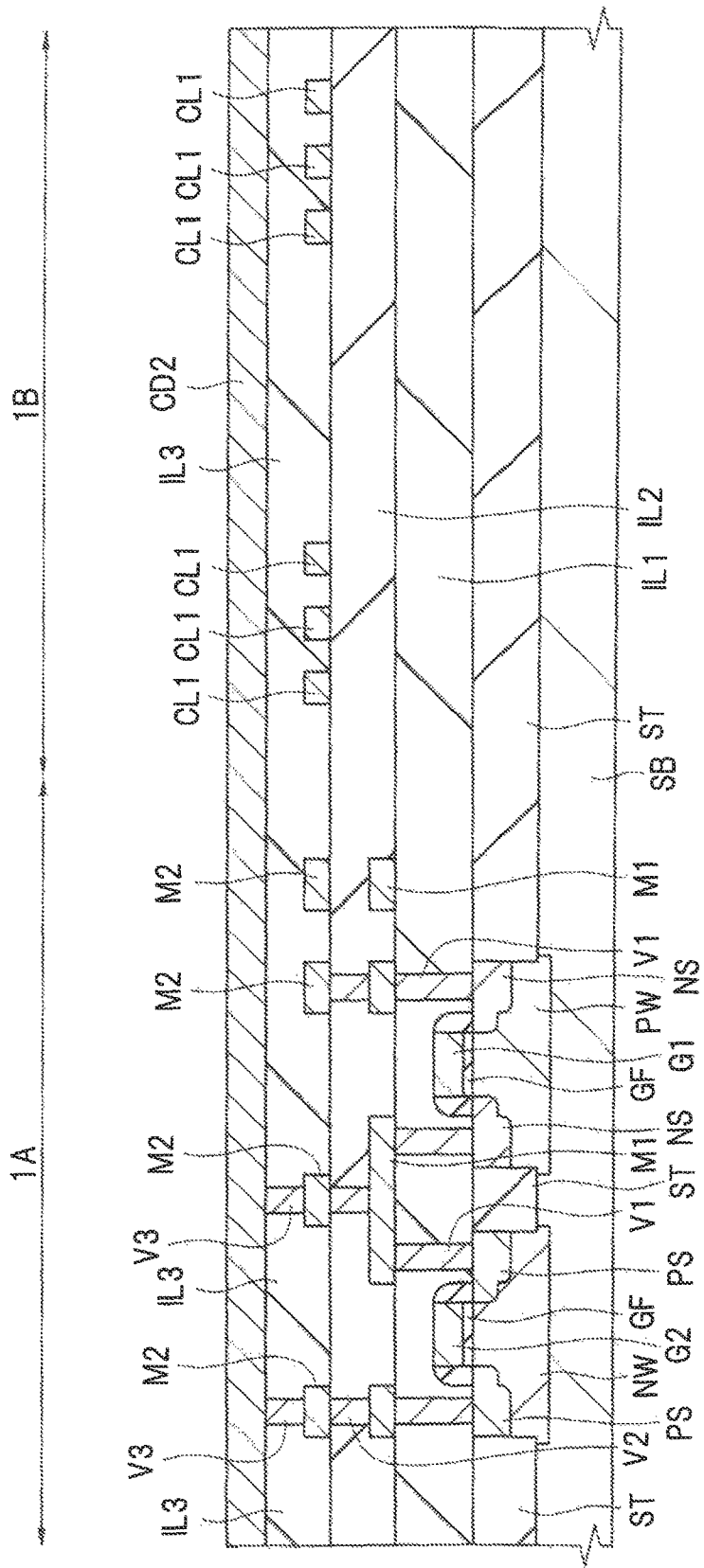
FIG. 16 is a cross-sectional view of a principal part in a manufacturing step of the semiconductor device, continued from FIG. 15.
Figure 17:
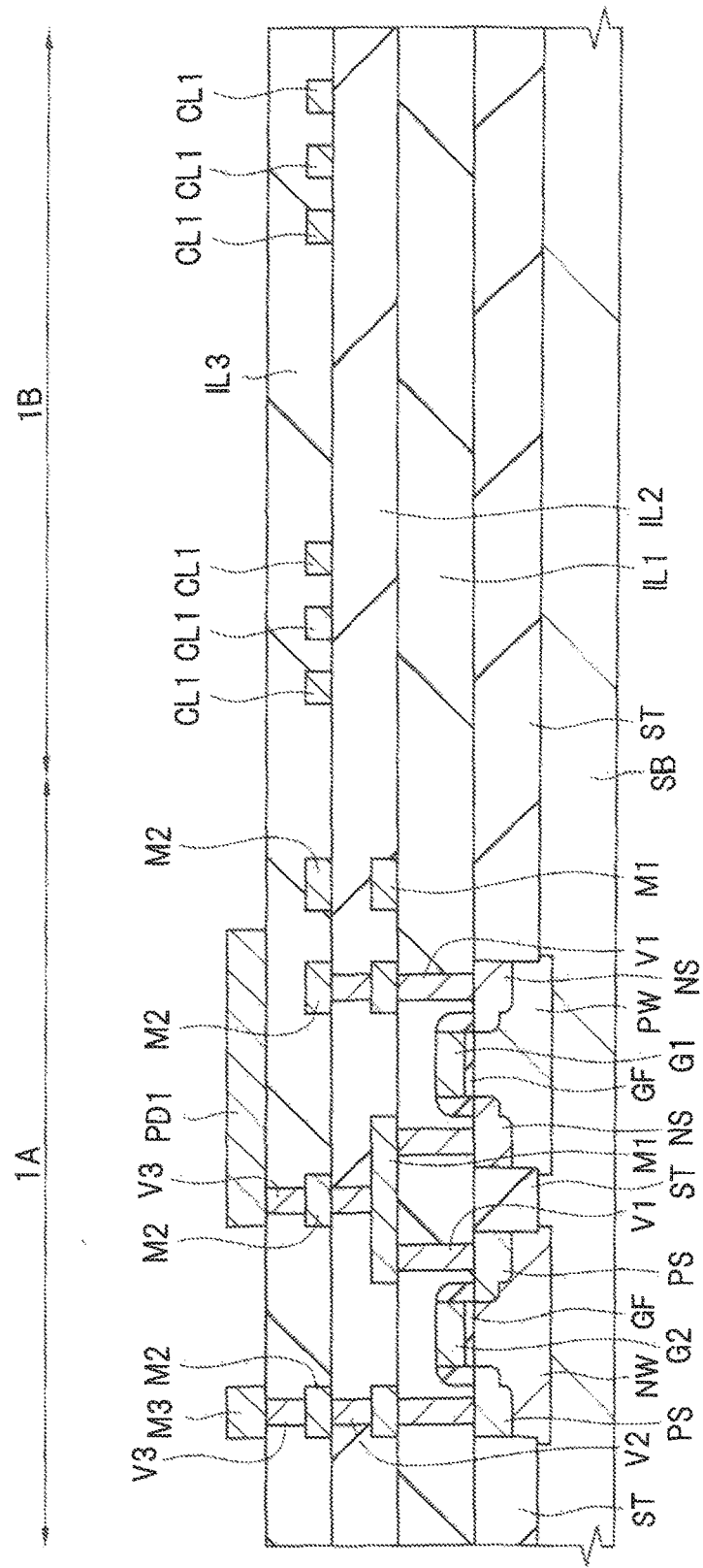
FIG. 17 is a cross-sectional view of a principal part in a manufacturing step of the semiconductor device, continued from FIG. 16.

Then, the wiring M3 of the third wiring layer is formed on the interlayer insulation film IL3 in which the via portions V3 are buried. In order to form the wiring M3, first, as shown in FIG. 16, the electrically-conductive film CD2 for the third wiring layer is formed on the interlayer insulation film IL3 in which the via portions V3 are buried. The electrically-conductive film CD2 is composed of, for example, a laminated film of a barrier conductor film (for example, a titanium film, a titanium nitride film, or a laminated film of them), an aluminum film, and a barrier conductor film (for example, a titanium film, a titanium nitride film, or a laminated film of them) in this order from bottom, and can be formed by using a sputtering method or others. The electrically-conductive film CD2 is an electrically-conductive film for the third wiring layer, but also is an electrically-conductive film for forming the pad PD1. Then, the wiring M3 and the pad PD1 can be formed by patterning the electrically-conductive film CD2 by using a photolithography technique and an etching technique as shown in FIG. 17. Each of the wiring M3 and the pad PD1 is composed of the patterned electrically-conductive film CD2. The via portion V3 is electrically connected to the wiring M2 since the lower surface thereof is in contact with the wiring M2 and is electrically connected to the wiring M3 or the pad PD1 since the upper surface thereof is in contact with the wiring M3 or the pad PD1. In other words, the via portion V3 electrically connects the wiring M2 and the wiring M3 or electrically connects the wiring M2 and the pad PD1.

Also, here, the case of the formation of the via portions V3 and the wiring M3 in different steps from each other has been explained. As another mode, the via portions V3, the wiring M3, and the pad PD1 can be formed in the same step. In this case, the via portions V3 are integrally formed with the wiring M3 or the pad PD1. In this case, the wiring M3 and the pad PD1 are formed by forming through holes for the via portions V3 in the interlayer insulation film IL3, and then, forming the electrically-conductive film CD2 on the interlayer insulation film IL3 so as to bury the through holes, and patterning the electrically-conductive film CD2 by using a photolithography technique and an etching technique. In this manner, the wiring M3 and the pad PD1 are formed, and the via portions V3 integrally formed with the wiring M3 or the pad PD1 are also formed.

The planar shape of the pad PD1 may be, for example, a planar shape of a substantially rectangular shape having a side larger than the wiring width of the wiring M3. The pad PD1 is preferably an aluminum pad mainly containing aluminum, and the wiring M3 is preferably an aluminum wiring mainly containing aluminum.

As an aluminum film used as the aluminum pad and the aluminum wiring, note that a compound film or an alloy film of Al (aluminum) and Si (silicon), a compound film or an alloy film of Al (aluminum) and Cu (copper), or a compound film or an alloy film of Al (aluminum), Si (silicon), and Cu (copper) can be preferably used. The composition ratio of Al (aluminum) is preferably larger than 50 atomic % (in other words, Al rich).

Figure 18:
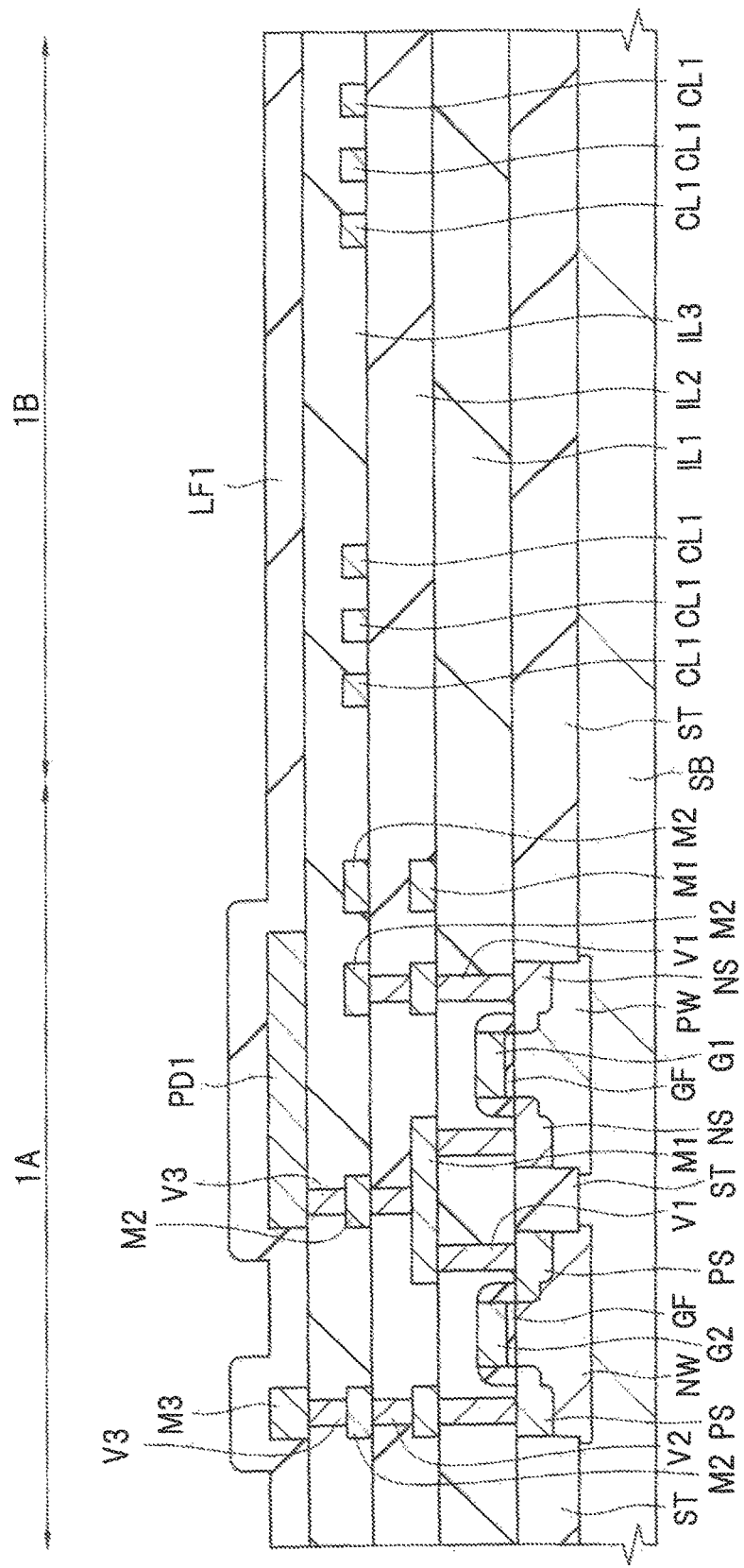
FIG. 18 is a cross-sectional view of a principal part in a manufacturing step of the semiconductor device, continued from FIG. 17.

Then, as shown in FIG. 18, the silicon oxide film LF1 is formed on the main surface (entire main surface) of the semiconductor substrate SB, in other words, on the interlayer insulation film IL3 so as to cover the wiring M3 and the pad PD1. The silicon oxide film LF1 can be formed by a CVD method or others. As a film formation method of the silicon oxide film LF1, a HDP (High Density Plasma)-CVD method is particularly preferable. The thickness (formed film thickness) of the silicon oxide film LF1 can be, for example, about 1 to 6 μm.

In a stage prior to the formation of the silicon oxide film LF1, the wiring M3 and the pad PD1 are exposed. However, after the formation of the silicon oxide film LF1, the wiring M3 and the pad PD1 are covered by the silicon oxide film LF1, and therefore, are not exposed.

Figure 19:
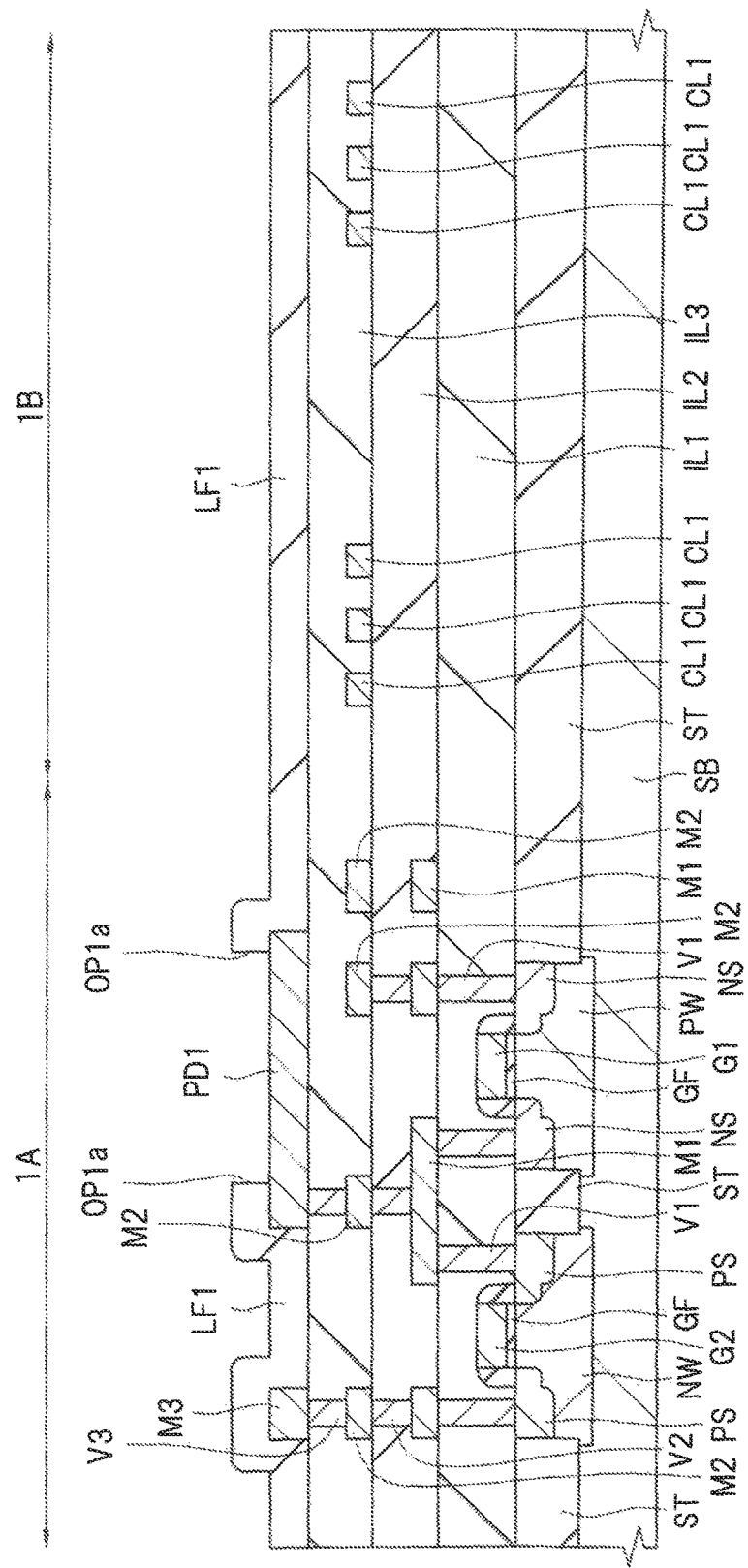
FIG. 19 is a cross-sectional view of a principal part in a manufacturing step of the semiconductor device, continued from FIG. 18.

Then, as shown in FIG. 19, the opening OP1a is formed in the silicon oxide film LF1. The opening OP1a is formed by selectively removing the silicon oxide film LF1 which is on the pad PD1, and the opening OP1a is formed so as to be included within the pad PD1 in a planar view. For example, the opening OP1a can be formed in the silicon oxide film LF1 by forming the silicon oxide film LF1, and then, forming a photoresist pattern (not shown) on the silicon oxide film LF1 by using a photolithography technique, and dry-etching the silicon oxide film LF1 while using the photoresist pattern as an etching mask. The opening OP1a is formed so as to penetrate through the silicon oxide film LF1, and at least a part of the pad PD1 is exposed from the opening OP1a.

When the opening OP1a is formed in the silicon oxide film LF1, the pad PD1 is exposed from the opening OP1a of the silicon oxide film LF1. At this time, while at least a part of the upper surface of the pad PD1 is exposed from the opening OP1a of the silicon oxide film LF1, it is preferred that the side surface (side wall) of the pad PD1 be covered by the silicon oxide film LF1 without being exposed from the opening OP1a of the silicon oxide film LF1. More specifically, in a planar view, although the opening OP1a of the silicon oxide film LF1 is overlapped with the pad PD1, the opening OP1a of the silicon oxide film LF1 is preferably included within the pad PD1, in other words, the outer periphery of the opening OP1a of the silicon oxide film LF1 is preferably inner than the outer periphery of the pad PD1. Moreover, when the opening OP1a is formed in the silicon oxide film LF1, the pad PD1 is exposed from the opening OP1a of the silicon oxide film LF1. However, the wiring M3 excluding the pad PD1 is not exposed since the state in which it is covered by the silicon oxide film LF1 is maintained. Also after this stage, the wiring M3 excluding the pad PD1 is not exposed since the state in which it is covered by the silicon oxide film LF1 is maintained.

Note that "planar view" refers to a case of view in a plane parallel to the main surface of the semiconductor substrate SB.

Figure 20:
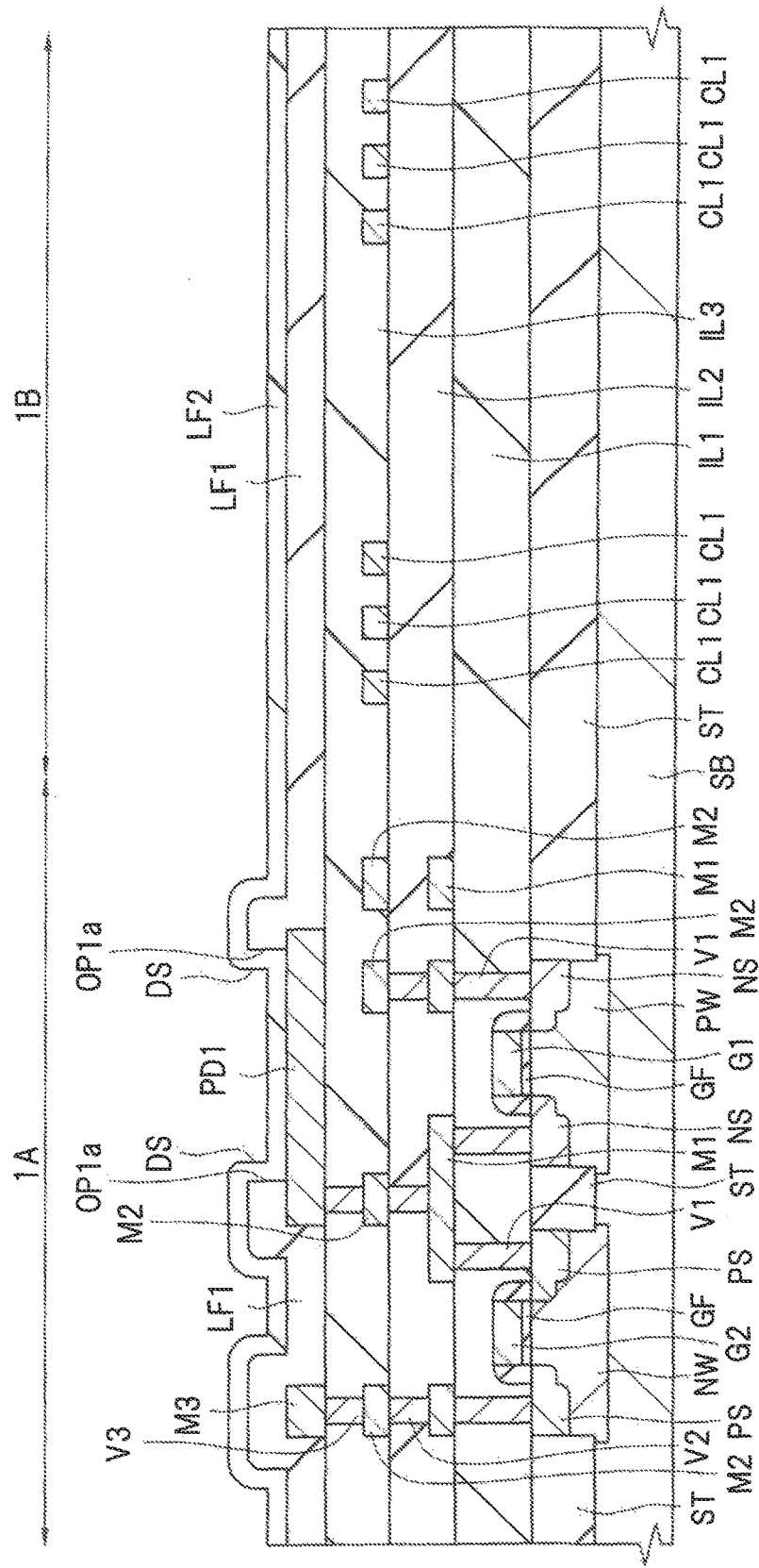
FIG. 20 is a cross-sectional view of a principal part in a manufacturing step of the semiconductor device, continued from FIG. 19.

Then, as shown in FIG. 20, the silicon nitride film LF2 is formed on the main surface (entire main surface) of the semiconductor substrate SB, in other words, on the silicon oxide film LF1. The silicon nitride film LF2 can be formed by a CVD method or others. As the film formation method of the silicon nitride film LF2, a plasma CVD method is particularly preferable. The thickness (formed film thickness) of the silicon nitride film LF2 can be, for example, about 0.5 to 3 μm.

Since the silicon nitride film LF2 is formed on the entire main surface of the semiconductor substrate SB, the silicon nitride film LF2 is formed on the silicon oxide film LF1 and on the pad PD1 exposed from the opening OP1a of the silicon oxide film LF1. In a stage prior to formation of the silicon nitride film LF2, the pad PD1 is exposed from the opening OP1a of the silicon oxide film LF1. However, after the formation of the silicon nitride film LF2, the pad PD1, which has been exposed from the opening OP1a of the silicon oxide film LF1, is covered by the silicon nitride film LF2, and therefore, is not exposed.

Figure 21:
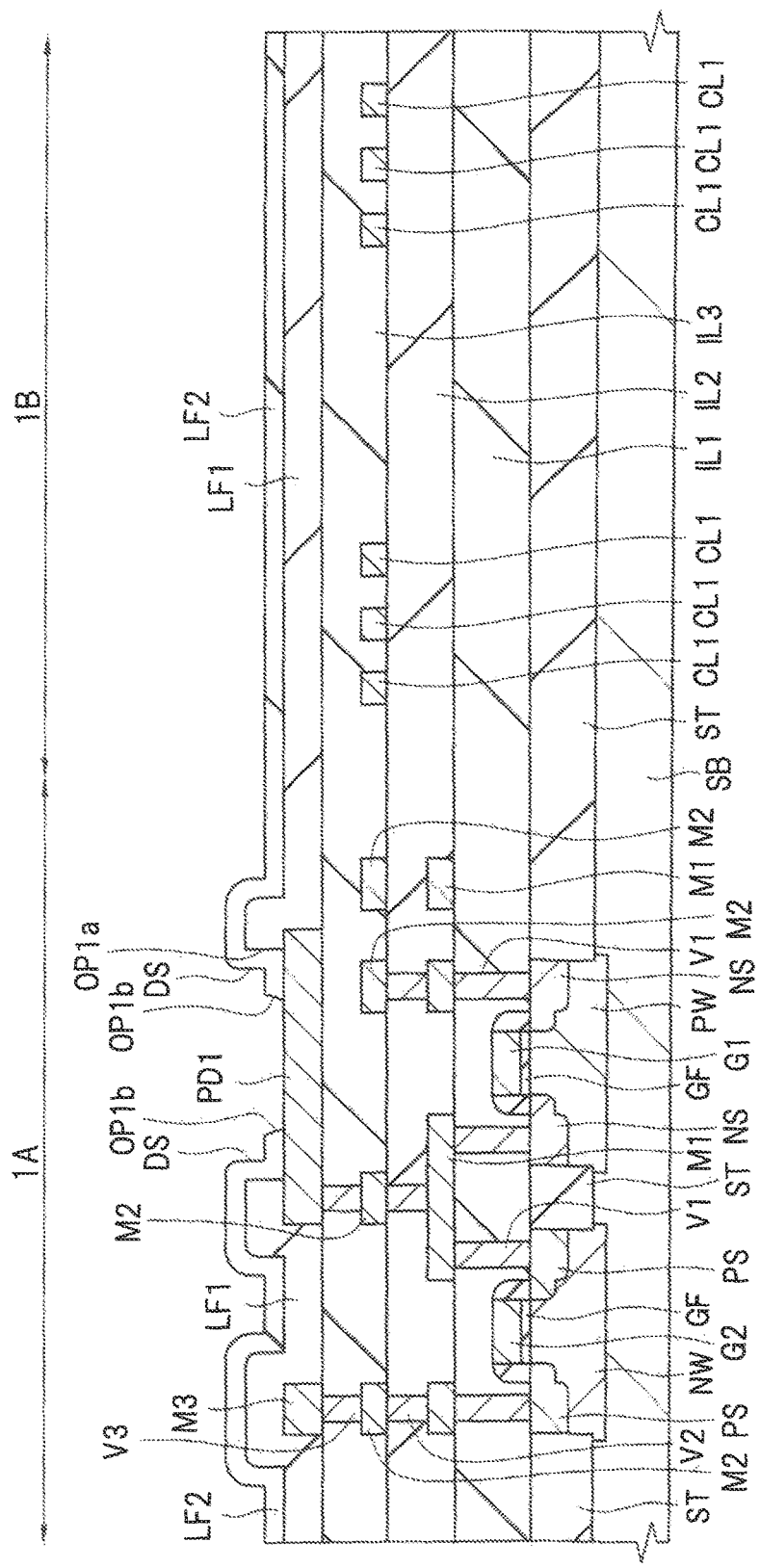
FIG. 21 is a cross-sectional view of a principal part in a manufacturing step of the semiconductor device, continued from FIG. 20.

Then, as shown in FIG. 21, the opening OP1b is formed in the silicon nitride film LF2. The opening OP1b is formed by selectively removing the silicon nitride film LF2 on the pad PD1, and the opening OP1b is formed so as to be included in the pad PD1 in the planar view. For example, the opening OP1b can be formed in the silicon nitride film LF2 by forming the silicon nitride film LF2, and then, forming a photoresist pattern (not shown) on the silicon nitride film LF2 by using a photolithography technique, and dry-etching the silicon nitride film LF2 while using the photoresist pattern as an etching mask. The opening OP1b is formed so as to penetrate through the silicon nitride film LF2, and at least apart of the pad PD1 is exposed from the opening OP1b.

As also seen from FIG. 21 and above-described FIG. 4 and FIG. 5, the opening OP1b is formed so as to be included within the opening OP1a in the planar view. In other words, the plane size (plane area) of the opening OP1b of the silicon nitride film LF2 is smaller than the plane size (plane area) of the opening OP1a of the silicon oxide film LF1, and the opening OP1b of the silicon nitride film LF2 is included within the opening OP1a of the silicon oxide film LF1 in the planar view. In other words, the plane size (plane area) of the opening OP1a of the silicon oxide film LF1 is larger than the plane size (plane area) of the opening OP1b of the silicon nitride film LF2, and the opening OP1a of the silicon oxide film LF1 is included within the opening OP1b of the silicon nitride film LF2 in the planar view. In other words, in the planar view, the opening OP1b of the silicon nitride film LF2 is overlapped with the opening OP1a of the silicon oxide film LF1, and the outer periphery of the opening OP1b of the silicon nitride film LF2 is inside the outer periphery of the opening OP1a of the silicon oxide film LF1.

Therefore, in the stage of the formation of the silicon nitride film LF2, the inner wall of the opening OP1a of the silicon oxide film LF1 is covered by the silicon nitride film LF2. Even when the opening OP1b is formed in the silicon nitride film LF2 thereafter, the inner wall of the opening OP1a of the silicon oxide film LF1 is still covered by the silicon nitride film LF2.

More specifically, in a case in which the opening OP1b of the silicon nitride film LF2 is protruded from the opening OP1a of the silicon oxide film LF1 in the planar view, when the opening OP1b is formed in the silicon nitride film LF2, the inner wall of the opening OP1a of the silicon oxide film LF1 is exposed without being covered by the silicon nitride film LF2. On the other hand, as seen in the present embodiment, in the case in which the opening OP1b of the silicon nitride film LF2 is included within the opening OP1a of the silicon oxide film LF1 in the planar view, even when the opening OP1b is formed in the silicon nitride film LF2, the inner wall of the opening OP1a of the silicon oxide film LF1 is covered by the silicon nitride film LF2. Therefore, in the planar region where the pad PD1 is formed, the silicon oxide film LF1 is not exposed since it is covered by the silicon nitride film LF2. This state is maintained in the formation of the opening OP1b and thereafter. In other words, after the film formation of the silicon nitride film LF2, the silicon oxide film LF1 is not exposed.

Moreover, the inner wall of the opening OP1b of the silicon nitride film LF2 is preferably tapered. In this manner, the rewiring RW can be easily formed on the inner wall of the opening OP1b of the silicon nitride film LF2 later.

Moreover, on the upper surface of the silicon nitride film LF2, a step portion DS caused by the inner wall of the opening OP1a of the silicon oxide film LF1 is formed. The step part DS is more preferred to be covered by the resin film LF3 in a stage of the formation of the resin film LF3 and the formation of the opening OP1c in the resin film LF3 later. In this manner, since the steps on the underlying base are reduced when the rewiring RW is to be formed later, the rewiring RW can be easily formed.

Figure 22:
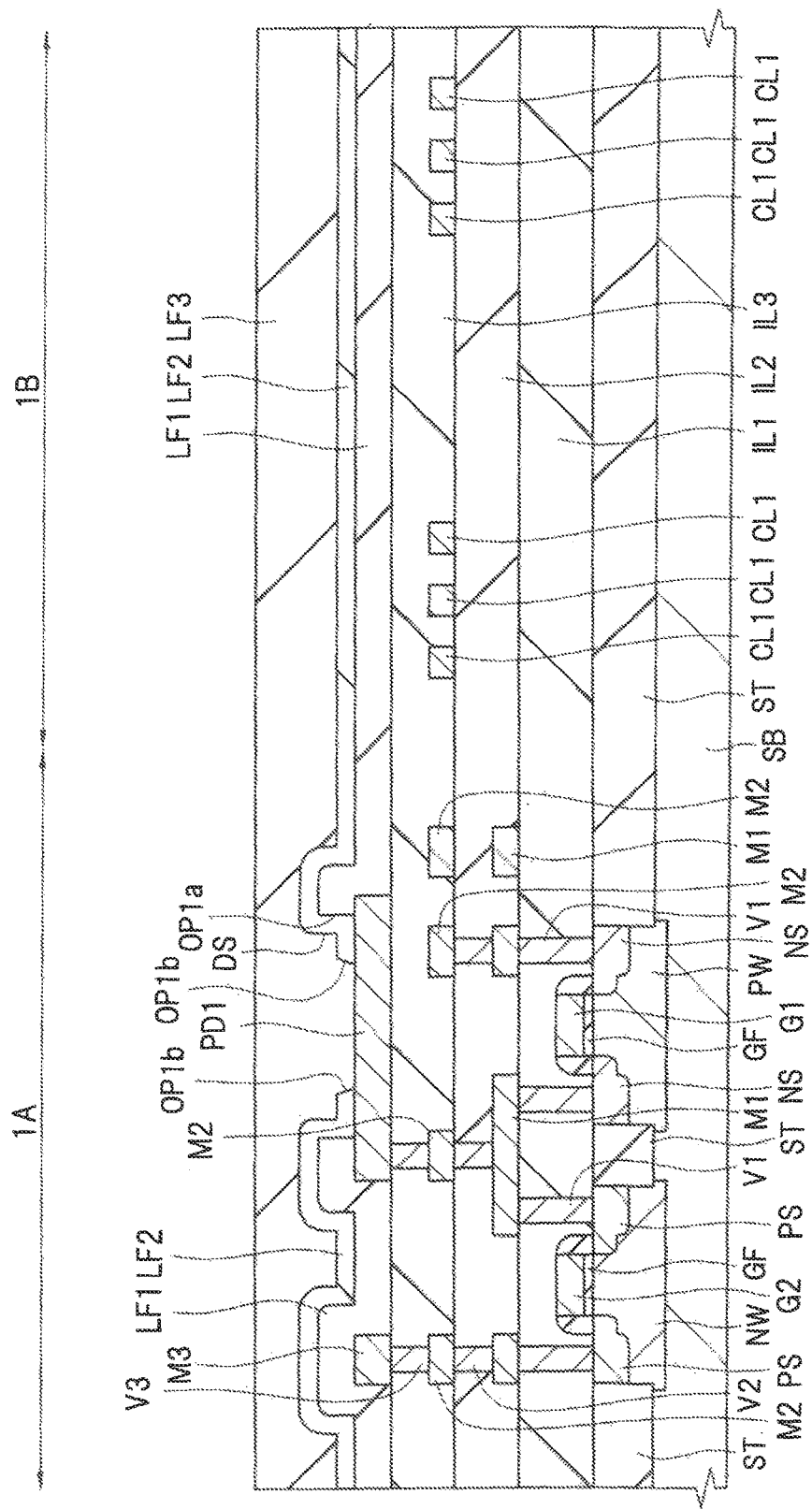
FIG. 22 is a cross-sectional view of a principal part in a manufacturing step of the semiconductor device, continued from FIG. 21.

Then, as shown in FIG. 22, the resin film LF3 is formed on the main surface (entire main surface) of the semiconductor substrate SB, in other words, on the silicon nitride film LF2. Since the resin film LF3 is formed on the entire main surface of the semiconductor substrate SB, the resin film LF3 is formed on the silicon nitride film LF2 and on the pad PD1, which is exposed from the opening OP1b of the silicon nitride film LF2.

As the resin film LF3, a polyimide film or others can be preferably used. The resin film LF3 can be formed by, for example, an application method. Specifically, a polyimide film serving as the resin film LF3 can be formed by applying a precursor solution of polyimide onto the main surface of the semiconductor substrate SB while rotating the semiconductor substrate SB by using a so-called spin coat (rotating application) method, and then, drying it. The thickness (formed film thickness) of the resin film LF3 can be, for example, about 1 to 20 μm.

Since the resin film LF3 is formed on the entire main surface of the semiconductor substrate SB, the resin film LF3 is formed on the silicon nitride film LF2 and on the pad PD1, which has been exposed from the opening OP1b of the silicon nitride film LF2. In a stage prior to the formation of the resin film LF3, the pad PD1 is exposed from the opening OP1b of the silicon nitride film LF2. However, after the formation of the resin film LF3, the pad PD1, which has been exposed from the opening OP1b of the silicon nitride film LF2, is covered by the resin film LF3, and therefore, is not exposed.

Figure 23:
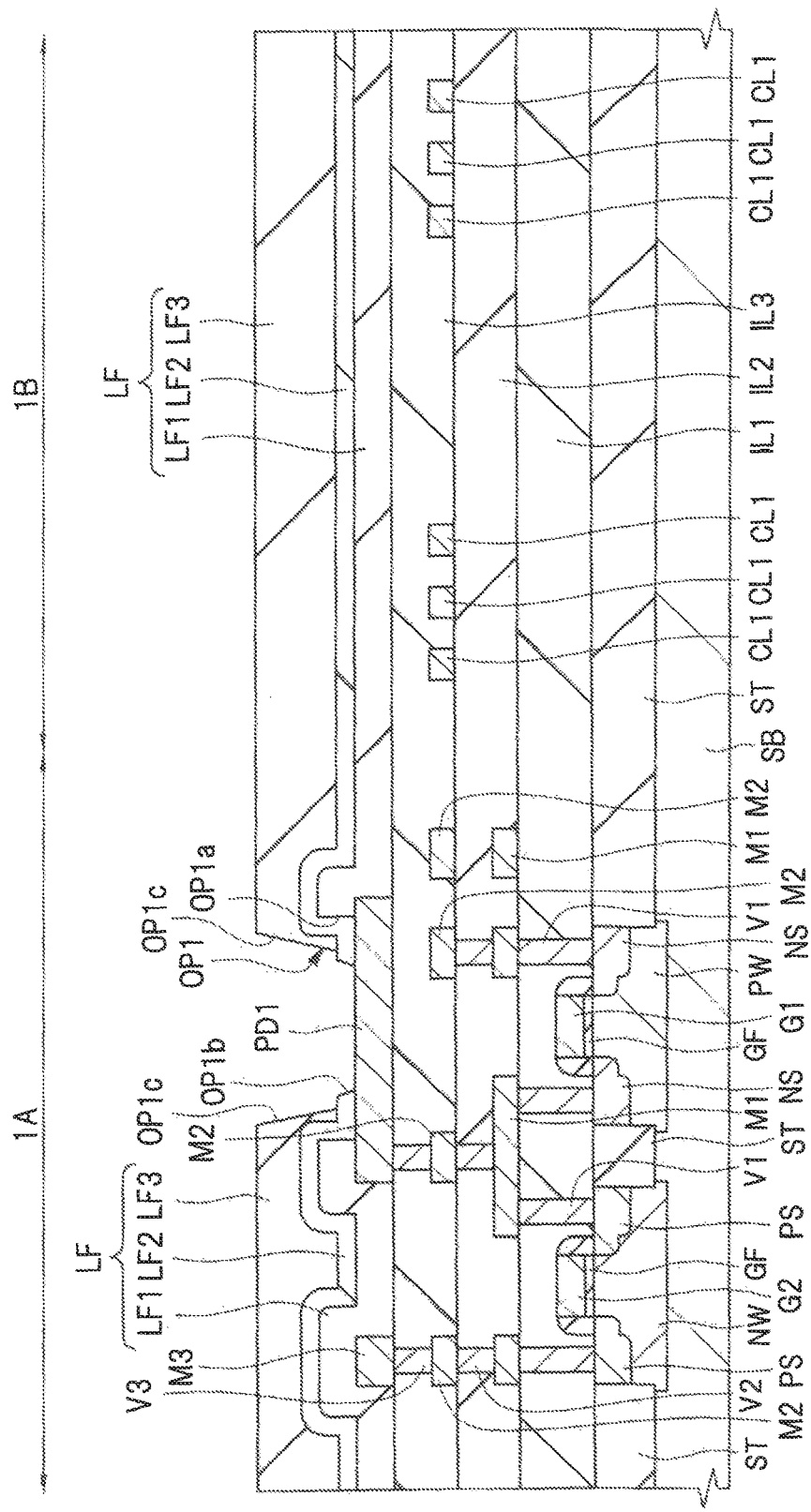
FIG. 23 is a cross-sectional view of a principal part in a manufacturing step of the semiconductor device, continued from FIG. 22.

Then, as shown in FIG. 23, the opening OP1c is formed in the resin film LF3. The opening OP1c can be formed as, for example, follows. Specifically, the opening OP1c is formed in the resin film LF3 by selectively removing the resin film LF3 at a part which is to be the opening OP1c by forming the resin film LF3 as a photosensitive resin film and exposing and developing the resin film LF3 composed of the photosensitive resin. Then, thermal treatment is performed to harden the resin film LF3. The opening OP1c is formed so as to penetrate through the resin film LF3, and at least a part of the pad PD1 is exposed from the opening OP1c.

Moreover, as another mode, the opening OP1c can be also formed in the resin film LF3 by dry-etching the resin film LF3 while using a photoresist layer, which is formed on the resin film LF3 by using a photolithography technique, as an etching mask. In this case, the resin film LF3 is not required to be a photosensitive resin film.

As also seen from FIG. 23 and above-described FIG. 4 and FIG. 5, the opening OP1c is formed so as to include the opening OP1b in the planar view. More specifically, the plane size (plane area) of the opening OP1c of the resin film LF3 is larger than the plane size (plane area) of the opening OP1b of the silicon nitride film LF2, and the opening OP1c of the resin film LF3 includes the opening OP1b of the silicon nitride film LF2 in the planar view. In other words, the plane size (plane area) of the opening OP1b of the silicon nitride film LF2 is smaller than the plane size (plane area) of the opening OP1c of the resin film LF3, and the opening OP1b of the silicon nitride film LF2 is included in the opening OP1c of the resin film LF3 in the planar view. More specifically, in the planar view, the opening OP1c of the resin film LF3 is overlapped with the opening OP1b of the silicon nitride film LF2, and the outer periphery of the opening OP1c of the resin film LF3 is outside the opening OP1b of the silicon nitride film LF2.

Therefore, in a stage of the formation of the resin film LF3, the inner wall of the opening OP1b of the silicon nitride film LF2 is covered by the resin film LF3. However, when the opening OP1c is formed in the resin film LF3 thereafter, the inner wall of the opening OP1b of the silicon nitride film LF2 is not covered by but exposed from the resin film LF3.

More specifically, in the case in which the opening OP1c of the resin film LF3 is included within the opening 1b of the silicon nitride film LF2 in the planar view, even when the opening OP1c is formed in the resin film LF3, the inner wall of the opening OP1b of the silicon nitride film LF2 is still covered by the resin film LF3. On the other hand, as seen in the present embodiment, in the case in which the opening OP1c of the resin film LF3 is included within the opening OP1b of the silicon nitride film LF2 in the planar view, when the opening OP1c is formed in the resin film LF3, the inner wall of the opening OP1b is not covered by but exposed from the resin film LF3 of the silicon nitride film LF2.

Moreover, the inner wall of the opening OP1c of the resin film LF3 is preferably tapered. In this manner, the rewiring RW can be easily formed later on the inner wall of the opening OP1c of the resin film LF3.

In this manner, the laminated film (laminated insulation film) LF having the opening OP1 from which at least a part of the pad PD1 is exposed is formed. Although the surface of the pad PD1 is exposed from the opening OP1 of the laminated film LF, a part of the pad PD1, in other words, a part of the pad PD1 which is not overlapped with the opening OP1 in the planar view is covered by the laminated film LF. Specifically, the central portion of the pad PD1 is not covered by the laminated film LF, and the outer peripheral portion of the pad PD1 is covered by the laminated film LF. This state is maintained also in the steps after this stage.

The laminated film LF is composed of the silicon oxide film LF1, the silicon nitride film LF2, and the resin film LF3. The laminated film LF has the opening OP1 from which at least a part of the pad PD1 is exposed, and the opening OP1 is composed of the opening OP1c of the resin film LF3, the opening OP1b of the silicon nitride film LF2, and the opening OP1a of the silicon oxide film LF1.

However, since the inner wall of the opening OP1a of the silicon oxide film LF1 is covered by the silicon nitride film LF2, the inner wall of the opening OP1 of the laminated film LF is formed by the inner wall of the opening OP1c of the resin film LF3, the inner wall of the opening OP1b of the silicon nitride film LF2, and the upper surface of the silicon nitride film LF2 which is positioned between the inner wall of the opening OP1c and the inner wall of the opening OP1b and is not covered by the resin film LF3.

In this manner, the semiconductor substrate SB is subjected to a wafer process as seen in FIG. 7 to FIG. 23. The wafer process is also referred to as a previous (front-end production) process. The wafer process here generally refers to the steps of forming various elements (here, MISFET, etc.), wiring layers (here, the wirings M1, M2, and M3), and pad electrodes (here, the pad PD1) on the main surface of a semiconductor wafer (the semiconductor substrate SB), forming a surface protective film (here, the laminated film LF), and then, obtaining a state in which each electrical test for a plurality of chip regions formed on the semiconductor wafer can be performed by using a probe, etc. Each of the chip regions of the semiconductor wafer corresponds to the region from which one semiconductor chip is acquired.

Therefore, the laminated film LF becomes an uppermost layer and a surface protective film in the semiconductor wafer, which has been subjected to the wafer process. Moreover, the wiring M3 of the third wiring layer becomes the uppermost layer wiring, and the pad PD1 is formed by this third wiring layer.

The electrical test for each chip region of the semiconductor wafer (the semiconductor substrate SB) can be performed by performing a probe test (wafer test) by utilizing the pad PD1, which is exposed from the opening OP1 of the laminated film LF. Specifically, in each of the chip regions of the semiconductor wafer (the semiconductor substrate SB), an electrical test for each of the chip regions is performed while a probe (probe needle, test probe) for testing abuts on the pad PD1, which is exposed from the opening OP1 of the laminated film LF. Based on a result of the probe test, each of the chip regions of the semiconductor wafer (the semiconductor substrate SB) is sorted to be a non-defective or defective, or the data of the measurement result of the probe test is fed back to each manufacturing step, so that the result can help yield improvement and reliability improvement. Therefore, although the probe test can be omitted, the probe test is preferably performed.

Figure 24:
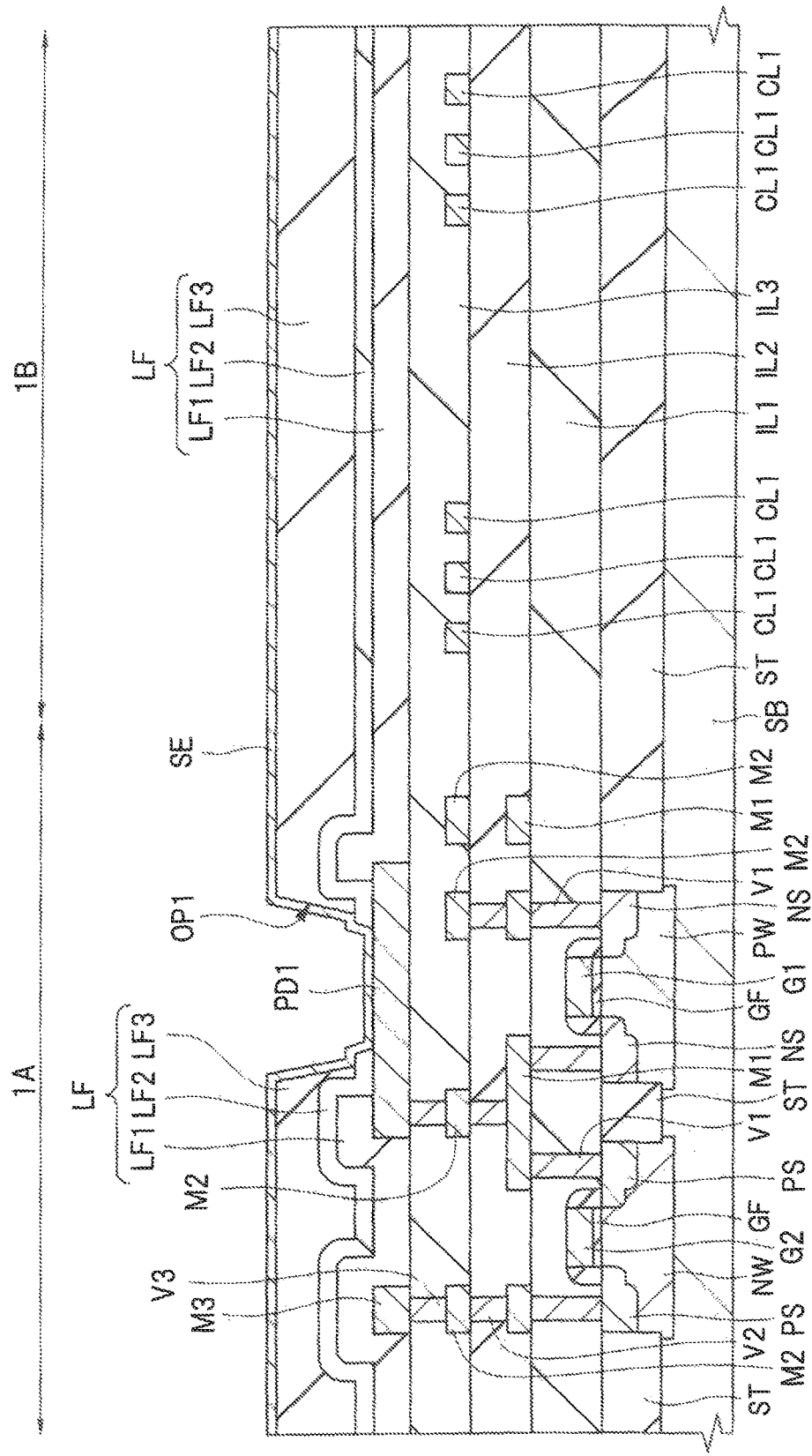
FIG. 24 is a cross-sectional view of a principal part in a manufacturing step of the semiconductor device, continued from FIG. 23.

After the structure of above-described FIG. 23 is obtained by the wafer (previous (front-end production) treatment) process as described above, the probe test is performed as needed, and, then, a seed film (seed layer) SE is formed on the main surface (entire main surface) of the semiconductor substrate SB, in other words, on the laminated film LF including the pad PD1 exposed from the opening OP1 of the laminated film LF as shown in FIG. 24. The seed film SE is a film which is to function later as a seed layer (power feed layer) for electrolytic plating.

The seed film SE is composed of, for example, a laminated film of a chromium (Cr) film and a copper (Cu) film on the chromium (Cr) film, and can be formed by, for example, a sputtering method. In this manner, the seed film SE is formed on the pad PD1 which is exposed from the bottom portion of the opening OP1, and on the laminated film LF including the part on the inner wall of the opening OP1. Since the surface of the laminated film LF except for the opening OP1 is the resin film LF3, the seed film SE is formed on the resin film LF3 so as to be in contact with the resin film LF3.

Regarding the film thickness of the seed film SE, for example, the chromium (Cr) film can be of about 75 nm, and the copper (Cu) film can be of about 250 nm. Moreover, the chromium (Cr) film in the lower layer side of the seed film SE can function as a barrier conductor film having, for example, a copper diffusion preventing function and a function to improve adhesiveness with the resin film LF3. However, the barrier conductor film is not limited to the chromium (Cr) film, and, for example, a titanium (Ti) film, a titanium tungsten (TiW) film, a titanium nitride (TiN) film, a tungsten (W) film, or others can be also used.

Figure 25:
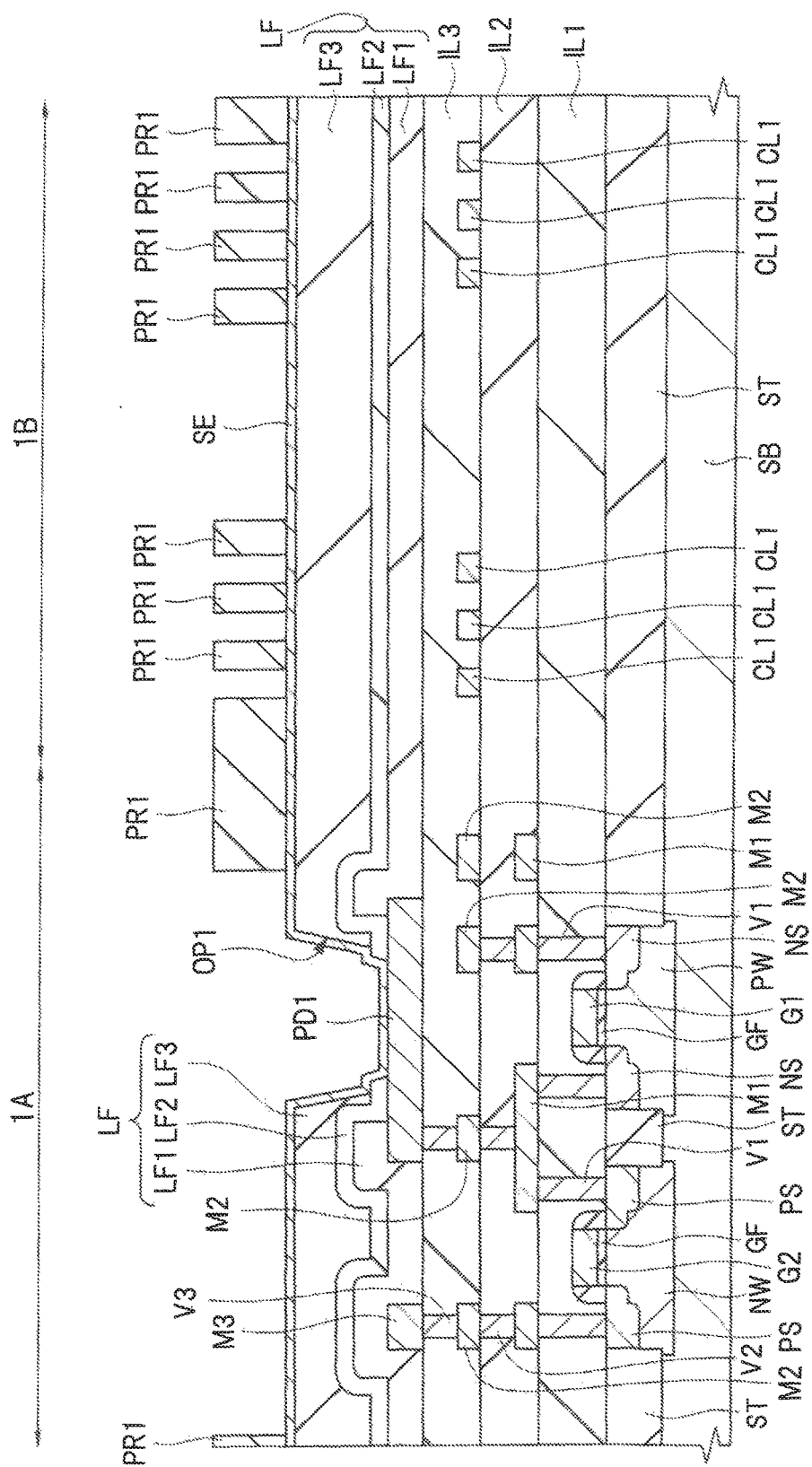
FIG. 25 is a cross-sectional view of a principal part in a manufacturing step of the semiconductor device, continued from FIG. 24.

Then, as shown in FIG. 25, a resist pattern (photoresist pattern) PR1 composed of a patterned resist film is formed on the seed film SE by forming a resist film (photoresist film) on the seed film SE, and then, patterning the resist film by using a photolithography method (specifically, by exposure and development).

The resist pattern PR1 is formed in the regions except for the regions where the rewiring RW, the pad PD2, the coil CL2, and the pad PD3 are to be formed, and the seed film SE is exposed in the region where the rewiring RW is to be formed, in the region where the pad PD2 is to be formed, in the region where the coil CL2 is to be formed, and in the region where the pad PD3 is to be formed. In other words, the resist pattern PR1 has openings (trenches) in the region where the rewiring RW is to be formed, in the region where the pad PD2 is to be formed, in the region where the coil CL2 is to be formed, and in the region where the pad PD3 is to be formed.

Figure 26:
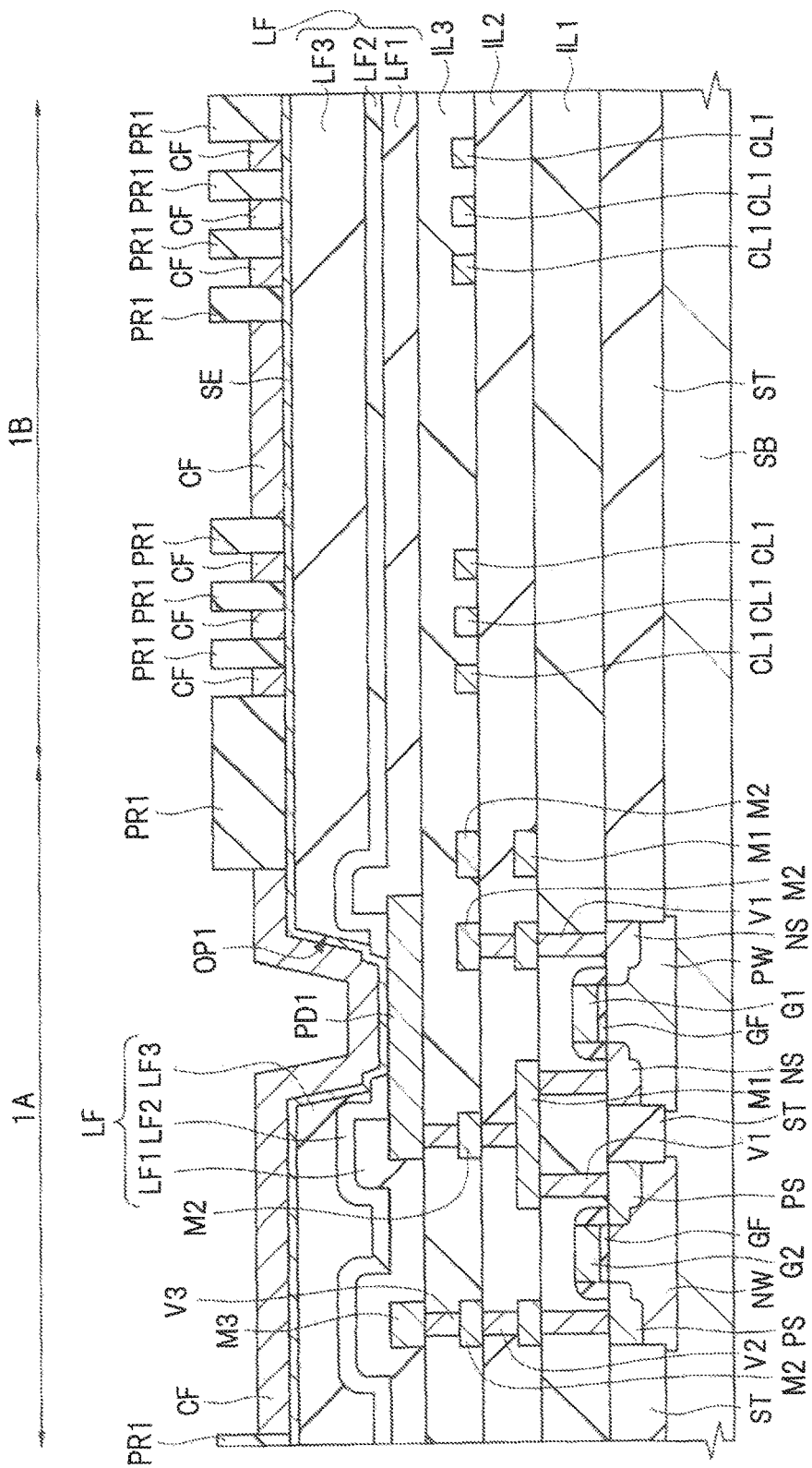
FIG. 26 is a cross-sectional view of a principal part in a manufacturing step of the semiconductor device, continued from FIG. 25.

Then, as shown in FIG. 26, a copper (Cu) film CF is formed by an electrolytic plating method on the seed film SE which is exposed from the openings (trenches) of the resist pattern PR1. In this manner, the copper film CF is selectively formed on the seed film SE in the regions which are not covered by the resist pattern PR1. The film thickness of the copper film CF can be, for example, about 4 to 10 μm. The copper film CF is formed in the region where the rewiring RW is to be formed, in the region where the pad PD2 is to be formed, in the region where the coil CL2 is to be formed, and in the region where the pad PD3 is to be formed.

Figure 27:
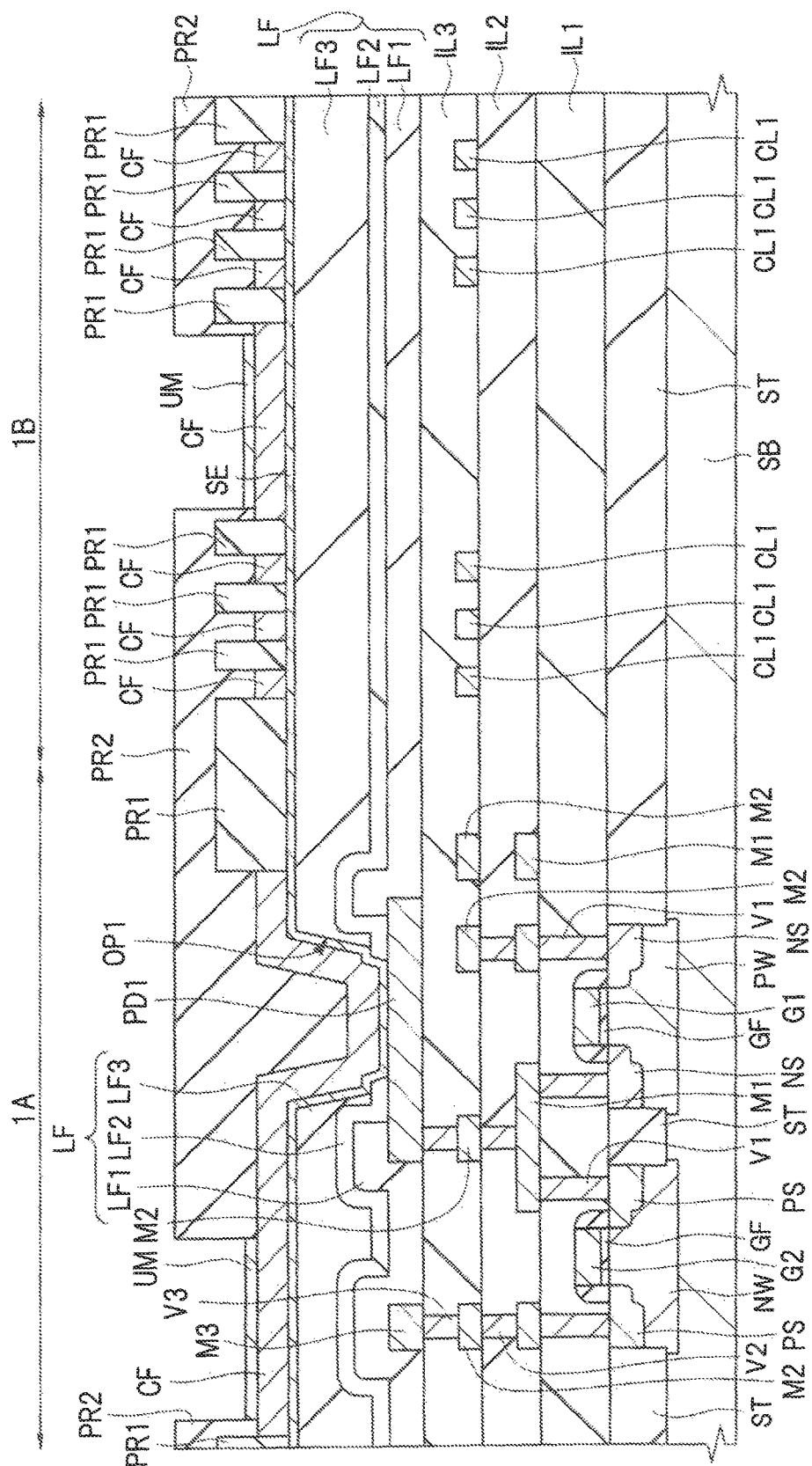
FIG. 27 is a cross-sectional view of a principal part in a manufacturing step of the semiconductor device, continued from FIG. 26.

Then, a resist pattern (photoresist pattern) PR2 composed of a patterned resist film is formed as shown in FIG. 27 by forming another resist film (photoresist film) on the resist pattern PR1 including the copper film CF and then patterning the resist film by using a photolithography method (specifically, performing exposure and development).

The resist pattern PR2 is formed in the region except for the region where the underlying metal film UM at the pad PD2 is to be formed, and the copper film CF is exposed in the regions where the underlying metal film UM is to be formed. In other words, the resist pattern PR2 has an opening in the region where the underlying metal film UM is to be formed.

Then, as shown in FIG. 27, the underlying metal film UM is formed on the copper film CF exposed from the openings of the resist pattern PR2 by an electrolytic plating method. In this manner, the underlying metal film UM is formed on the copper film CF in the regions which are not covered by the resist pattern PR2. The underlying metal film UM is formed on the copper film CF of the part which becomes the pad PD2 and on the copper film CF of the part which becomes the pad PD3. The underlying metal film UM is composed of, for example, a laminated film of a nickel (Ni) film and a gold (Au) film on the nickel (Ni) film. The film thickness of nickel (Ni) at this time can be, for example, about 1.5 μm, and the film thickness of the gold (Au) film can be, for example, about 2 μm.

Figure 28:
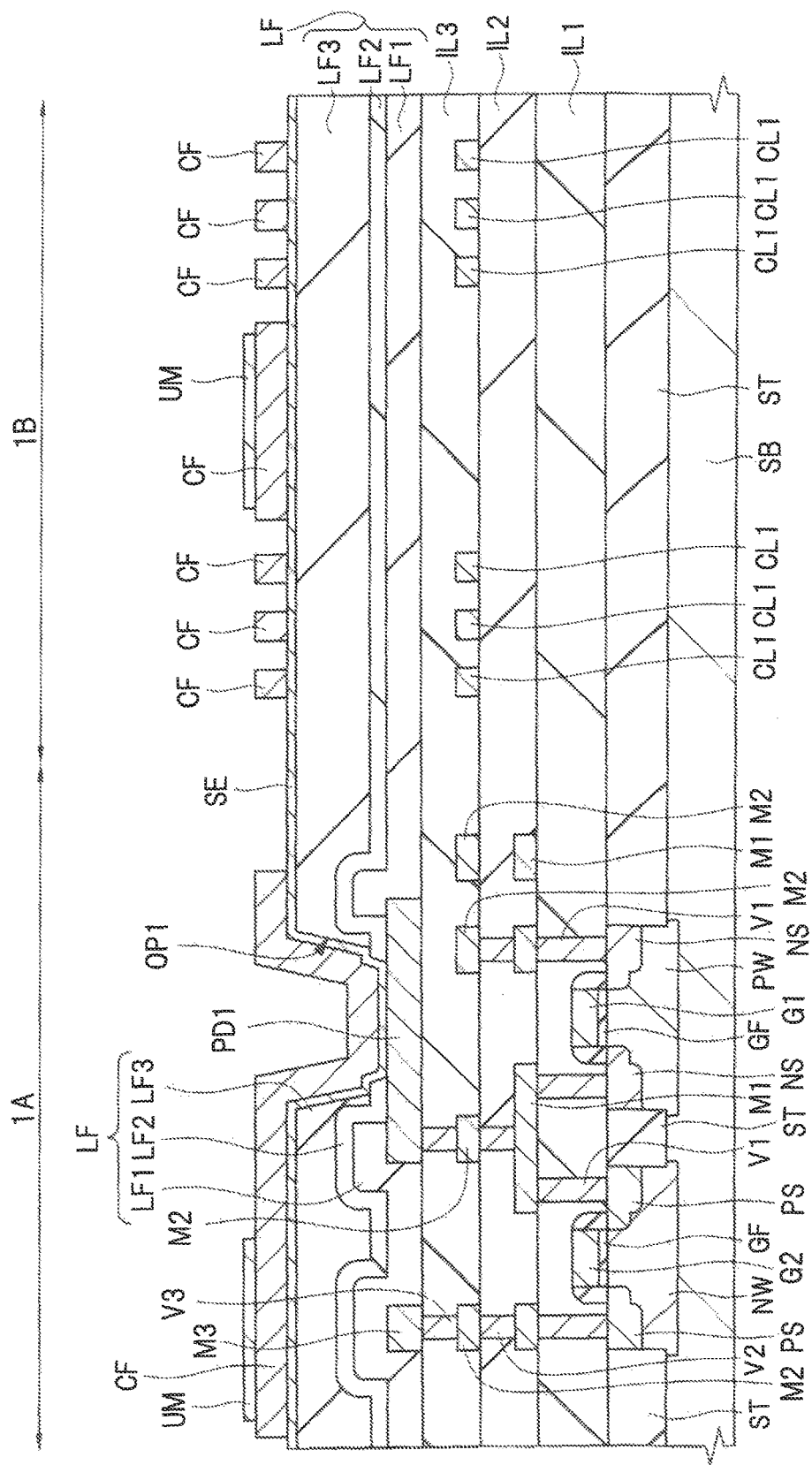
FIG. 28 is a cross-sectional view of a principal part in a manufacturing step of the semiconductor device, continued from FIG. 27.

Then, as shown in FIG. 28, the resist pattern PR2 and the resist pattern PR1 are removed. In this manner, the copper film CF is exposed, and the seed film SE in the regions where the copper film CF is not formed (in other words, the seed film SE of the part not covered by the copper film CF) is also exposed.

Meanwhile, the present embodiment has explained the case in which the copper film CF is formed, and then, the resist pattern PR2 is formed without removing the resist pattern PR1, the underlying metal film UM is then formed, and the resist patterns PR2 and PR1 are then removed. As another mode, after the copper film CF is formed, the resist pattern PR2 can be formed after the resist pattern PR1 is removed, and then, the resist pattern PR2 can be removed after the underlying metal film UM is formed.

Figure 29:
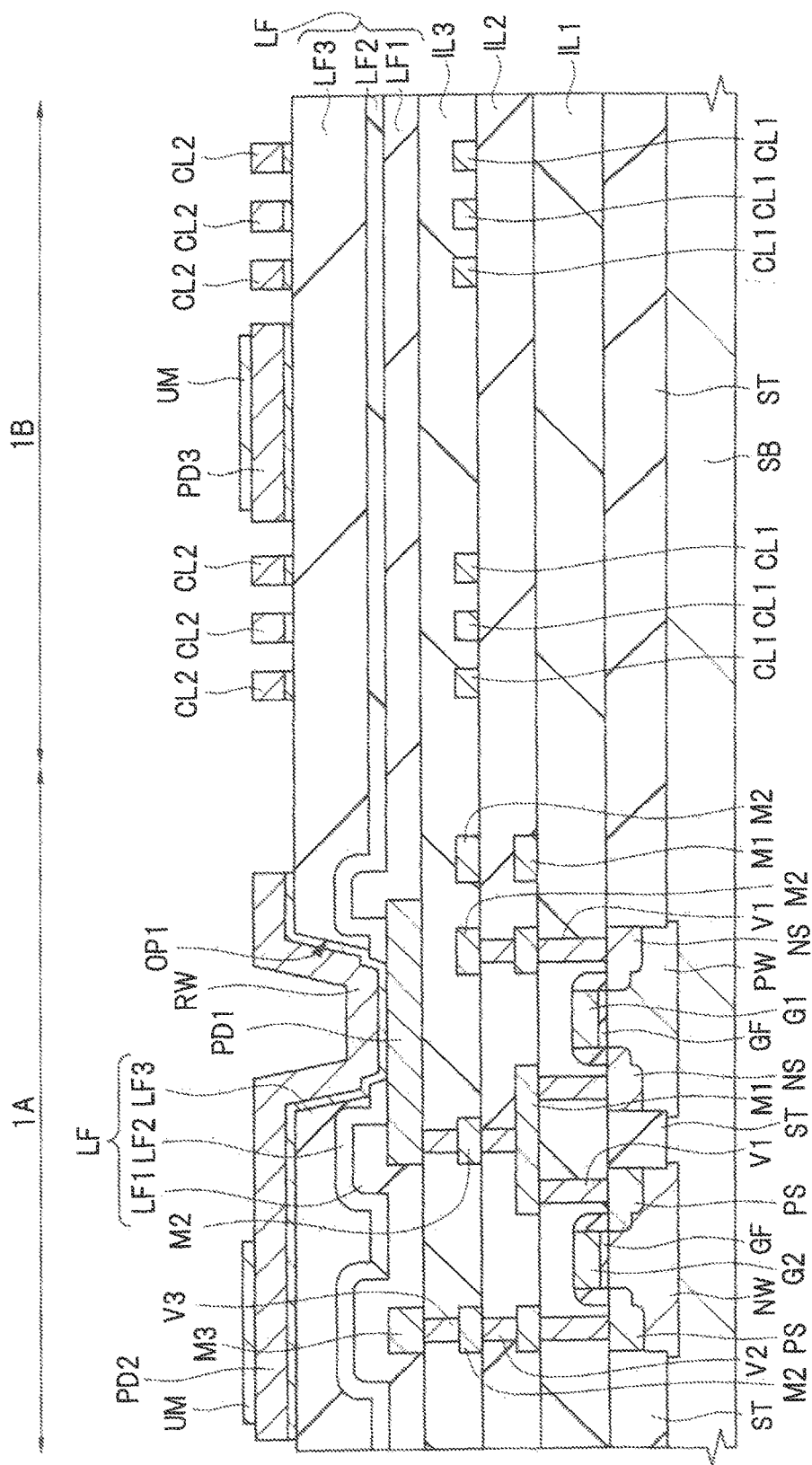
FIG. 29 is a cross-sectional view of a principal part in a manufacturing step of the semiconductor device, continued from FIG. 28.

Then, as shown in FIG. 29, the seed film SE of the parts which are not covered by the copper film CF is removed by etching. At this time, the seed film SE of the parts which are not covered by the copper film CF, in other words, the seed film SE positioned below the copper film CF remains without being removed. The etching at this time is preferred to be such etching as much as removing the seed film SE of the parts not covered by the copper film CF but not as much as excessively etching the copper film CF and the underlying metal film UM.

In this manner, the rewiring RW, the pad PD2, the coil CL2, and the pad PD3, which are composed of the seed film SE and the copper film CF, are formed. That is, each of the rewiring RW, the pad PD2, the coil CL2, and the pad PD3 is composed of the laminated film of the seed film SE and the copper film CF on the seed film SE.

The rewiring RW, the pad PD2, the coil CL2, and the pad PD3 are formed on the resin film LF3 of the laminated film LF. However, the rewiring RW is formed on the laminated film LF including the pad PD1 exposed from the opening OP1 and is electrically connected to the pad PD1. The rewiring RW is also connected to the pad PD2, and, specifically, the pad PD2 is integrally formed with the rewiring RW. Therefore, the pad PD1 and the pad PD2 are electrically connected via the rewiring RW. Moreover, the coil CL2 is connected to the pad PD3, and, specifically, the pad PD3 is integrally formed with the coil CL2.

Note that the underlying metal film UM is formed on the copper film CF configuring the pad PD2 and on the copper film CF configuring the pad PD3. The underlying metal film UM on the pad PD2 can be also regarded as a part of the pad PD2, and the underlying metal film UM on the pad PD3 can be also regarded as a part of the pad PD3.

Moreover, in the present embodiment, the case of the usage of copper (Cu) as a main material of the rewiring RW (in other words, the case of the usage of the copper film CF as a main conductor film of the rewiring RW) has been explained. As another mode, gold (Au) can be used as the main material of the rewiring RW (in other words, a gold film can be used instead of the copper film CF as the main conductor film of the rewiring RW). The pad PD2, the coil CL2, and the pad PD3 are formed by the electrically conductive film of the same layer as the rewiring RW. Therefore, in the case of the usage of copper (Cu) as the main material of the rewiring RW, the main materials of the pad PD2, the coil CL2, and the pad PD3 also become copper (Cu). In the case of the usage of gold (Au) as the main material of the rewiring RW, the main materials of the pad PD2, the coil CL2, and the pad PD3 also become gold (Au). In the case of the usage of gold (Au) as the main material of the rewiring RW, corrosion resistance can be improved since gold (Au) is excellent in corrosion resistance. On the other hand, in the case of the usage of copper (Cu) as the main material of the rewiring RW as described in the present embodiment, the performance can be improved, and the manufacturing cost can be reduced since copper (Cu) has low resistance and inexpensive.

Figure 30:
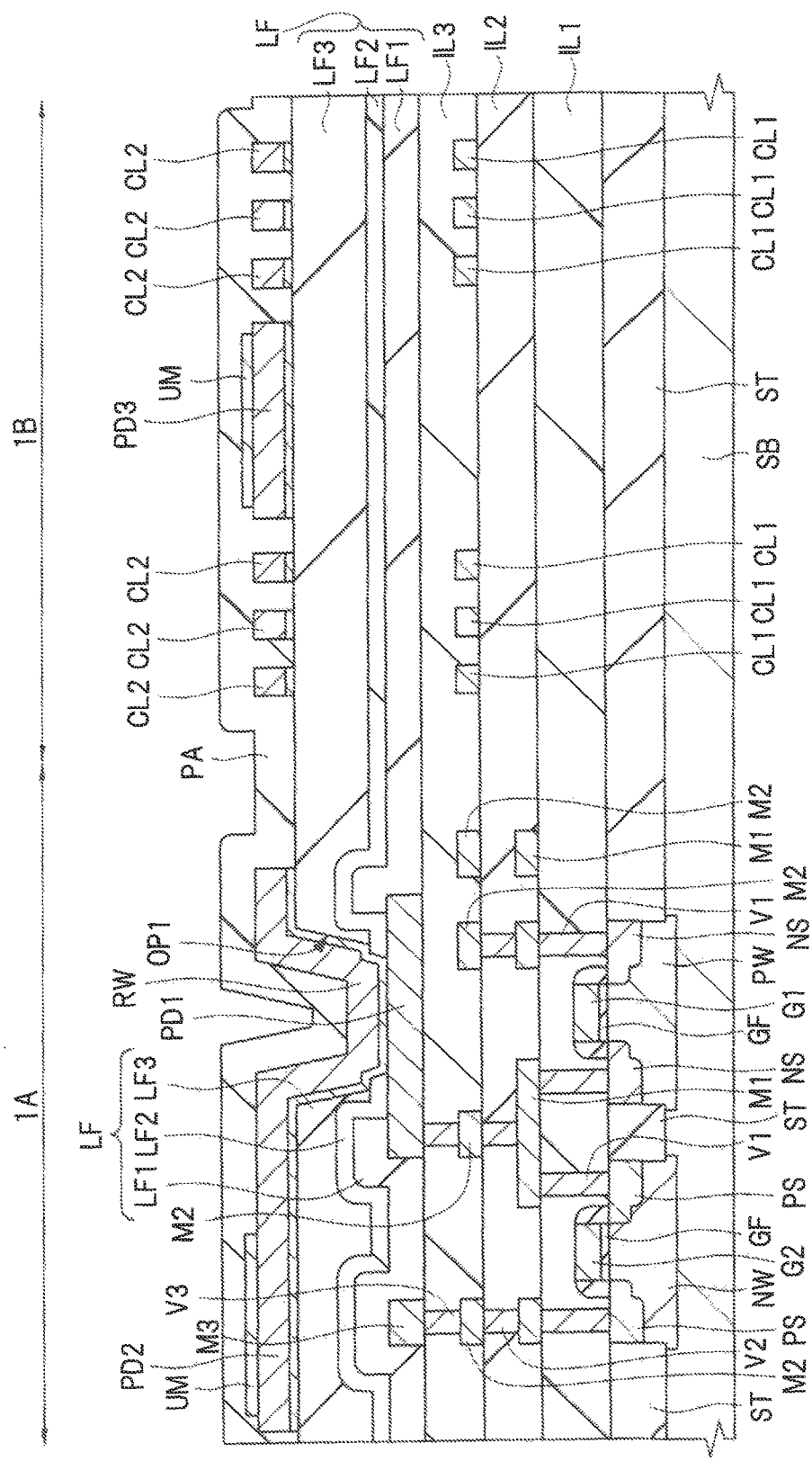
FIG. 30 is a cross-sectional view of a principal part in a manufacturing step of the semiconductor device, continued from FIG. 29.

Then, as shown in FIG. 30, the insulative protective film (surface protective film, insulation film, protective insulation film) PA is formed on the main surface (entire main surface) of the semiconductor substrate SB, in other words, on the laminated film LF so as to cover the rewiring RW, the pad PD2, the coil CL2, and the pad PD3. As the protective film PA, a resin film is preferred, and, for example, a polyimide film can be preferably used.

The protective film PA can be formed by, for example, a coating method. Specifically, a polyimide film serving as the protective film PA can be formed by applying a polyimide precursor solution onto the main surface of the semiconductor substrate SB while rotating the semiconductor substrate SB by using a so-called spin coat (rotating application) method, and then, drying it.

Figure 31:
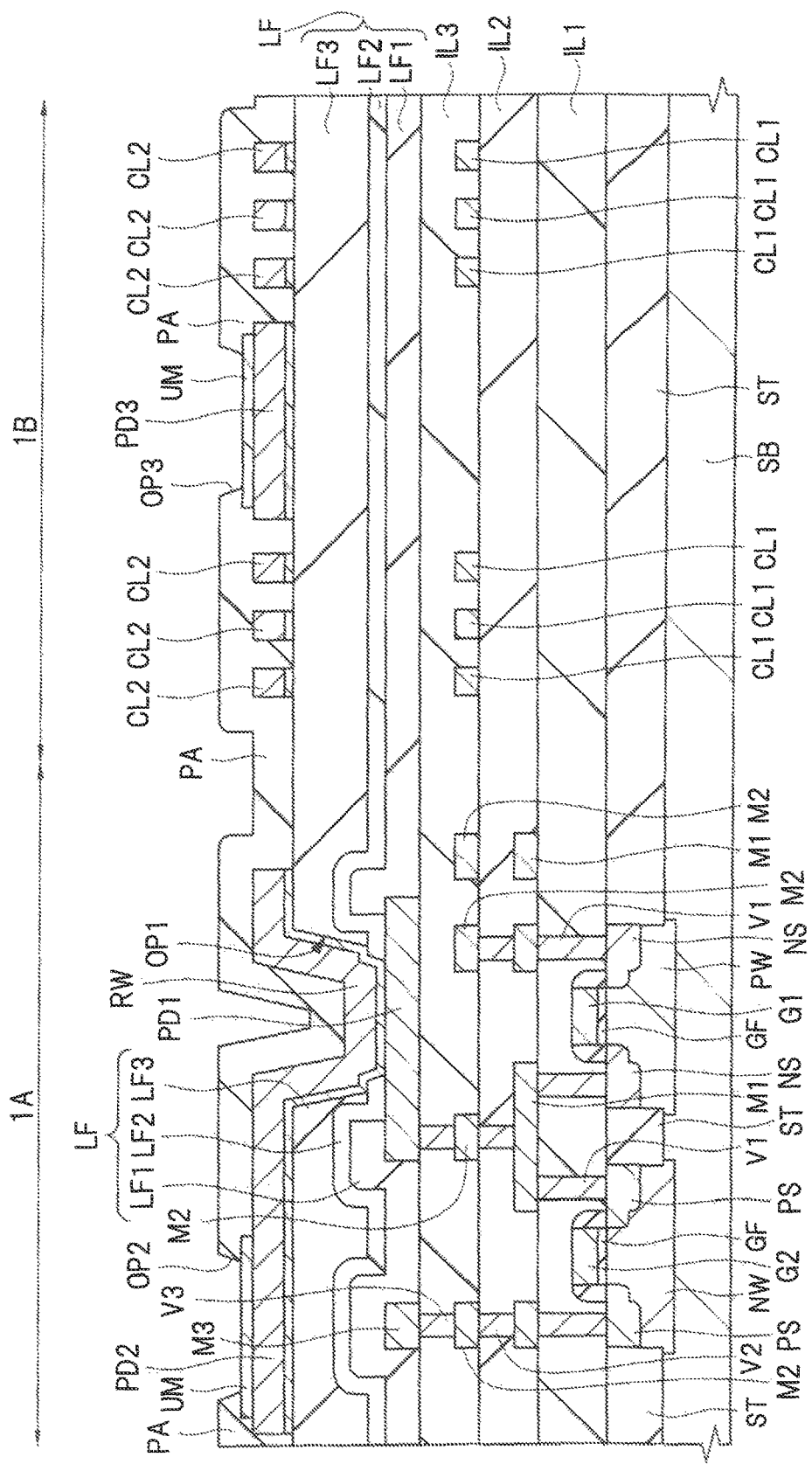
FIG. 31 is a cross-sectional view of a principal part in a manufacturing step of the semiconductor device, continued from FIG. 30.

Then, as shown in FIG. 31, the openings OP2 and OP3 are formed in the protective film PA. The openings OP2 and OP3 can be formed as, for example, follows. That is, the protective film PA of the parts which are to be the openings OP2 and OP3 is selectively removed by forming the protective film PA as a photosensitive resin film, and exposing and developing the protective film PA composed of the photosensitive resin, so that the opening OP2 and the opening OP3 are formed in the protective film PA. Then, thermal treatment is performed to harden the protective film PA. The opening OP2 and the opening OP3 are formed so as to penetrate through the protective film PA, at least a part of the pad PD2 is exposed from the opening OP2, and at least a part of the pad PD3 is exposed from the opening OP3. If the underlying metal film UM has been formed on the pads PD2 and PD3, the underlying metal film UM on the pad PD2 is exposed from the opening OP2, and the underlying metal film UM on the pad PD3 is exposed from the opening OP3.

In the manufacture of the semiconductor package, if the pads PD2 and PD3 are subjected to wire bonding, the later-described bonding wires BW are connected to the underlying metal film UM exposed from each of the openings OP2 and OP3. By providing the underlying metal film UM, the electrically-conductive connecting members such as the bonding wires (BW) can be easily and exactly connected to the pads PD2 and PD3.

Moreover, as another mode, the opening OP2 can be also formed in the protective film PA by dry etching the protective film PA by using a photoresist layer, which is formed on the protective film PA by using a photolithography technique, as an etching mask. In this case, the protective film PA may not be a photosensitive resin film.

The pads PD2 and PD3 (or the underlying metal film UM on the pads PD2 and PD3) are exposed from the openings OP2 and OP3 of the protective film PA. However, the rewiring RW and the coil CL2 are coated and protected by the protective film PA. When a resin film (organic insulation film) such as polyimide resin is used for the protective film PA of the uppermost layer, handling of the semiconductor chip can be facilitated since the comparatively soft resin film (organic insulation film) serves as the uppermost layer.

Then, the semiconductor substrate SB is cut (diced) and divided into (separated into pieces of) a plurality of semiconductor chips. In this manner, the semiconductor chip is acquired from each chip region of the semiconductor substrate SB (semiconductor wafer). Note that the semiconductor substrate SB may be thinned by performing back-surface grinding to the semiconductor substrate SB before the dicing.

<Regarding Main Characteristics and Effects of Semiconductor Device (Semiconductor Chip)>

In the present embodiment, the semiconductor device (semiconductor chip) has the coil CL1 formed on the semiconductor substrate SB via the first insulation film (in this case, the interlayer insulation films IL1 and IL2), the second insulation film (in this case, the interlayer insulation film IL3) formed on the semiconductor substrate SB so as to cover the first insulation film and the coil CL1, and the pad PD1 formed on the second insulation film and arranged at the position not overlapped with the coil CL1 in the planar view. Furthermore, the semiconductor device has the laminated film LF formed on the second insulation film and having the opening OP1 from which the pad PD1 is exposed, the coil CL2 formed on the laminated film LF and arranged above the coil CL1, and the rewiring RW (first wiring) formed on the laminated film LF including the pad PD1 exposed from the opening OP1 and electrically connected to the pad PD1. The coil CL1 and the coil CL2 are not connected by a conductor, but are magnetically coupled to each other.

As one of main characteristics of the present embodiment, the laminated film LF is composed of the silicon oxide film LF1, the silicon nitride film LF2 on the silicon oxide film LF1, and the resin film LF3 on the silicon nitride film LF2, and the silicon oxide film LF1, the silicon nitride film LF2, and the resin film LF3 are interposed between the coil CL1 and the coil CL2.

The laminated film LF is an insulation film which is formed after formation of the pad PD1 and before formation of the rewiring RW and the coil CL2. Therefore, the pad PD1 is partially covered by the laminated film LF, and the coil CL2 and the rewiring RW are formed on the laminated film LF. Therefore, if a test step (probe test) is performed by using the pad PD1, the laminated film LF can function as an uppermost-layer film (surface protective film). The pad PD1 is partially covered by the laminated film LF, and this is because the pad PD1 of the part not overlapped with the opening OP1 in the planar view is covered by the laminated film LF, and specifically, the central portion of the pad PD1 is not covered by the laminated film LF while the outer peripheral portion of the pad PD1 is covered by the laminated film LF.

In the present embodiment, it is important to form the laminated film LF to be the laminated film obtained by laminating the silicon oxide film LF1, the silicon nitride film LF2, and the resin film LF3 in this order. Since the laminated film LF is interposed between the coil CL1 and the coil CL2, the silicon oxide film LF1, the silicon nitride film LF2, and the resin film LF3 are interposed between the coil CL1 and the coil CL2.

When a silicon oxide film, a silicon nitride film, and a resin film (for example, polyimide film) are compared with one another in a breakdown voltage, the silicon oxide film tends to have the highest breakdown voltage, and the resin film (for example, polyimide film) tends to have the second highest breakdown voltage. In other words, when the silicon oxide film, the silicon nitride film, and the resin film (for example, polyimide film) are compared with one another in the breakdown voltage per unit thickness, the silicon oxide film has the highest one, and the resin film (for example, polyimide film) has the second highest one. Since a large potential difference is generated between the coil CL1 and the coil CL2 in some cases, it is desired to increase the breakdown voltage between the coil CL1 and the coil CL2 as much as possible in terms of improvement of reliability of the semiconductor chip having the coils CL1 and CL2, reliability of the semiconductor package including the semiconductor chip, or reliability of the electronic device using the semiconductor package. Therefore, since the laminated film LF interposed between the coil CL1 and the coil CL2 includes the silicon oxide film LF1, the breakdown voltage between the coil CL1 and the coil CL2 can be improved. More specifically, since the silicon oxide film LF1 having a relatively high breakdown voltage per unit thickness is interposed between the coil CL1 and the coil CL2, the breakdown voltage between the coil CL1 and the coil CL2 can be improved.

However, since the silicon oxide film has moisture absorbency, the silicon oxide film is not desired to be the uppermost layer film (surface film). The surface of the laminated film LF serves as the outermost surface when a test step (probe test) is performed by using the pad PD1. If the silicon oxide film absorbs moisture, there is a risk of reduction in the reliability of the semiconductor device. Moreover, if the resin film (for example, polyimide film) is directly formed on the silicon oxide film, there is such a risk that the moisture in the resin film (for example, polyimide film) is diffused into the silicon oxide film so that the silicon oxide film absorbs the moisture.

Therefore, in the present embodiment, the silicon oxide film LF1 is not used as the uppermost layer of the laminated film LF, and the resin film is not directly formed on the silicon oxide film LF1. More specifically, in the present embodiment, the silicon nitride film LF2 is formed on the silicon oxide film LF1 so as to be in contact with the silicon oxide film LF1. Since the silicon nitride film LF2 is formed on the silicon oxide film LF1, moisture absorbing of the silicon oxide film can be suppressed or prevented.

In order to increase the breakdown voltage between the coil CL1 and the coil CL2, there is a viewpoint to increase the breakdown voltage per unit thickness of the insulation film interposed between the coil CL1 and the coil CL2 and a viewpoint to increase the thickness of the insulation film. Since the silicon oxide film LF1 has the high breakdown voltage per unit thickness, the thickness thereof is desired to be increased as much as possible from the viewpoint of improving the breakdown voltage. However, it is not easy to increase the thickness in terms of film formation. Moreover, if the thickness of the silicon oxide film LF1 is excessively increased, there is such a risk that the semiconductor substrate SB (semiconductor wafer) tends to cause warpage during manufacturing. Moreover, since the silicon nitride film has the breakdown voltage per unit thickness which is not so high, increase in the breakdown voltage by the silicon nitride film is disadvantageous from the viewpoint of improvement of the breakdown voltage. Therefore, in the present embodiment, the breakdown voltage between the coil CL1 and the coil CL2 is increased by inclusion of the resin film LF3 in the laminated film LF. More specifically, if the breakdown voltage is tried to be increased only by the silicon oxide film LF1, there is a difficulty in terms of manufacturing to form the thick silicon oxide film, and there is a risk of warpage of the semiconductor substrate SB (semiconductor wafer). However, if the breakdown voltage is increased also by the resin film LF3, such risks can be overcome. However, since there is a risk of moisture absorption of the silicon oxide film, the silicon oxide film LF1 can be prevented from the moisture absorption by interposing the silicon nitride film LF2 between the silicon oxide film LF1 and the resin film LF3 instead of forming the resin film LF3 directly on the silicon oxide film LF1.

In this manner, in the present embodiment, the breakdown voltage is improved by the inclusion of the silicon oxide film LF1 in the laminated film LF. Furthermore, also by inclusion of the resin film LF3 in the laminated film LF, the breakdown voltage is further improved, the difficulty in terms of manufacturing is eliminated, and the problem of the warpage of the semiconductor substrate SB (semiconductor wafer) during manufacturing is eliminated. Furthermore, by interposing the silicon nitride film LF2 between the silicon oxide film LF1 and the resin film LF3, the problem of the moisture absorption of the silicon oxide film LF1 is eliminated. Therefore, it is important to form the laminated film LF to be the laminated film obtained by laminating the silicon oxide film LF1, the silicon nitride film LF2, and the resin film LF3 in this order. In this manner, the reliability of a semiconductor device (semiconductor chip) having the coils CL1 and CL2 can be improved. Moreover, the reliability of a semiconductor package (semiconductor device) including the semiconductor chip having the coils CL1 and CL2 or the reliability of an electronic device using the semiconductor package can be improved.

Moreover, the formation of the resin film LF3 as the uppermost layer of the laminated film LF has such advantages that the test step can be easily performed and handling is facilitated when the test step (probe test) is performed by using the pad PD1. More specifically, the resin film LF3 serves as the uppermost surface in the test step (probe test), and handling is easier in the soft uppermost surface. From this viewpoint, the polyimide film is preferable as the resin film LF3 because the polyimide film is soft (has flexibility), and therefore, the test step can be easily performed, and handling is facilitated by forming the polyimide film as the uppermost surface in the test step (probe test).

Moreover, the silicon oxide film and the polyimide film have the opposite stress directions to each other when being formed on the semiconductor substrate (semiconductor wafer), and therefore, the directions of warpage of the semiconductor substrate (semiconductor wafer) are opposite to each other. Therefore, when the polyimide film is used as the resin film LF3, warpage of the semiconductor substrate SB (semiconductor wafer) due to the stress of the silicon oxide film LF1 can be cancelled out by the stress of the polyimide film, and therefore, an effect that warpage of the semiconductor substrate SB (semiconductor wafer) during manufacturing can be suppressed or prevented is obtained.

Moreover, the silicon nitride film LF2 plays a role to prevent the silicon oxide film LF1 from the moisture absorption. Therefore, the thickness of the silicon nitride film LF2 is more preferred to be 0.5 μm or larger. In this manner, the silicon oxide film LF1 can be exactly prevented from the moisture absorption.

Moreover, since the silicon nitride film LF2 has a lower breakdown voltage per unit thickness than that of the silicon oxide film LF1, it is advantageous to increase the breakdown voltage by not the silicon nitride film LF2 but the silicon oxide film LF1 from the viewpoint of the improvement of the breakdown voltage. Moreover, when the silicon nitride film and the silicon oxide film are compared with each other, the silicon nitride film more easily causes the warpage of the semiconductor substrate (semiconductor wafer) when it is formed on the semiconductor substrate (semiconductor wafer). Therefore, if the thickness of the silicon nitride film LF2 is excessively increased, there is a risk of warpage in the semiconductor substrate SB (semiconductor wafer).

Therefore, the thickness of the silicon oxide film LF1 is more preferred to be thicker (larger) than the thickness of the silicon nitride film LF2 In other words, the thickness of the silicon nitride film LF2 is more preferred to be thinner (smaller) than the thickness of the silicon oxide film LF1. In this manner, the breakdown voltage between the coil CL1 and the coil CL2 can be improved, and warpage of the semiconductor substrate SB (semiconductor wafer) can be suppressed or prevented. Moreover, in this viewpoint, the silicon nitride film LF2 is further preferred to be 3 μm or smaller. Here, the thickness of the silicon oxide film LF1 and the thickness of the silicon nitride film LF2 correspond to the thickness of the silicon oxide film LF1 and the thickness of the silicon nitride film LF2 between the coil CL1 and the coil CL2.

Figure 35:
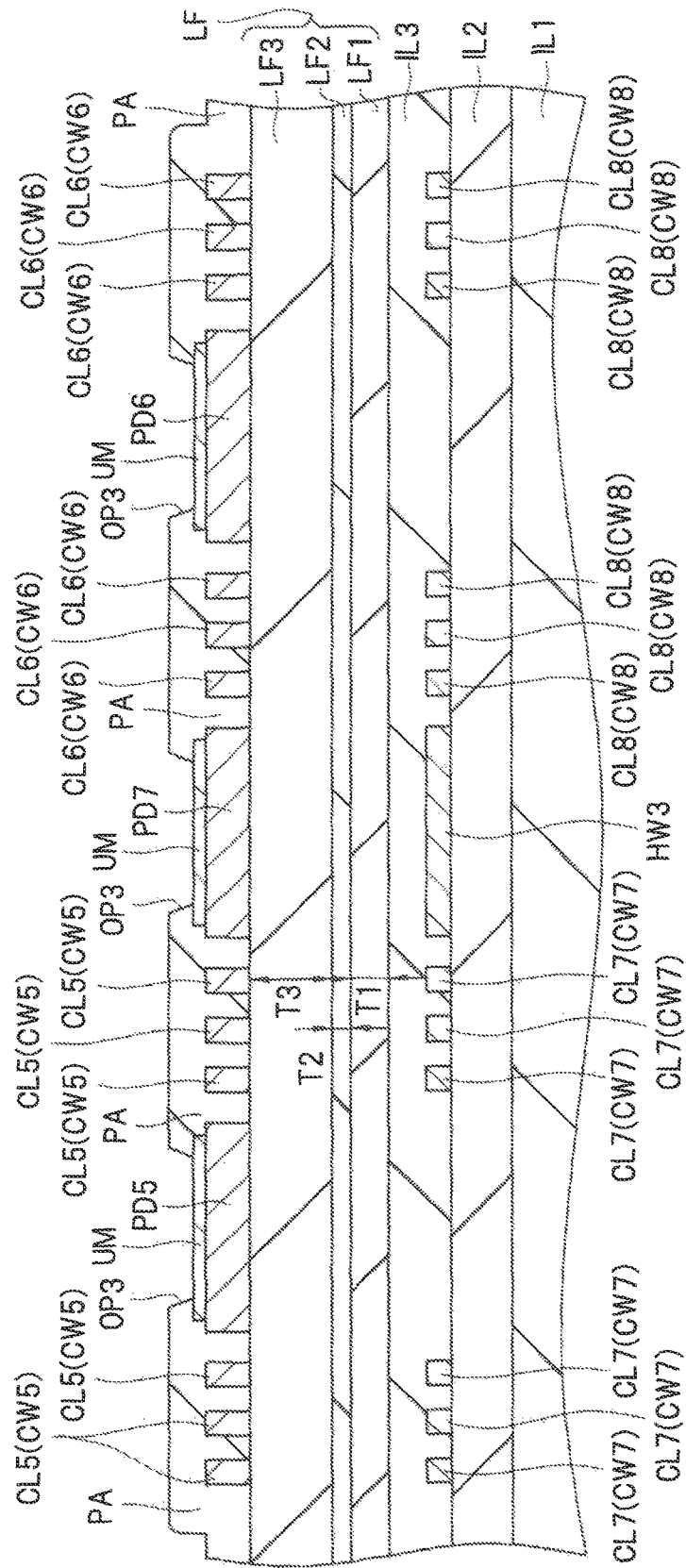
FIG. 35 is a cross-sectional view of a principal part of the semiconductor device of the embodiment.

Note that FIG. 35 shows a thickness T1 which is the thickness of the silicon oxide film LF1, a thickness T2 which is the thickness of the silicon nitride film LF2, and a thickness T3 which is the thickness of the resin film LF3. As described above, the thickness T1 of the silicon oxide film LF1 is preferred to be thicker (larger) than the thickness T2 of the silicon nitride film LF2 (in other words, T1>T2).

Moreover, the laminated film LF has the opening OP1 from which the pad PD1 is exposed so that the central portion of the pad PD1 is not covered by the laminated film LF while the outer peripheral portion of the pad PD1 is covered by the laminated film LF. The opening OP1 of the laminated film LF is formed by the opening OP1$a$ of the silicon oxide film LF1, the opening OP1$b$ of the silicon nitride film LF2, and the opening OP1$c$ of the resin film LF3.

In the present embodiment, as shown also in above-described FIG. 4 and FIG. 5, it is more preferred to include the opening OP1$b$ of the silicon nitride film LF2 in the opening OP1$a$ of the silicon oxide film LF1 in the planar view and to cover the inner wall of the opening OP1$a$ of the silicon oxide film LF1 by the silicon nitride film LF2. In this manner, also on the inner wall of the opening OP1$a$ of the silicon oxide film LF1, the surface of the silicon oxide film LF1 is covered by the silicon nitride film LF2, and therefore, the silicon oxide film LF1 can be more exactly prevented from the moisture absorption. In other words, as different from the present embodiment, if the inner wall of the opening OP1$a$ of the silicon oxide film LF1 is not covered by the silicon nitride film LF2, there is such a risk that the silicon oxide film LF1 absorbs moisture from the inner wall of the opening OP1$a$ of the silicon oxide film LF1. On the other hand, if the inner wall of the opening OP1$a$ of the silicon oxide film LF1 is covered by the silicon nitride film LF2, the silicon oxide film LF1 can be prevented from the moisture absorption from the inner wall of the opening OP1$a$ of the silicon oxide film LF1, and therefore, the moisture absorption of the silicon oxide film LF1 can be more exactly prevented.

Moreover, in the present embodiment, as shown also in above-described FIG. 4 and FIG. 5, it is more preferred to include the opening OP1$b$ of the silicon nitride film LF2 in the opening OP1$c$ of the resin film LF3 in the planar view and not to cover the inner wall of the opening OP1$b$ of the silicon nitride film LF2 by the resin film LF3. In this manner, the exposed area of the pad PD1 (the area of the part of the pad PD1 exposed from the opening OP1 of the laminated film LF) is defined by the opening OP1$b$ of the silicon nitride film LF2. In this manner, variation in the exposed area of the pad PD1 can be suppressed. More specifically, since a resin film (for example, polyimide film) has a larger shrink amount after film formation than that of a silicon nitride film, the plane size (plane area) of the opening OP1$c$ of the resin film LF3 is easier to be varied than the opening OP1$b$ of the silicon nitride film LF2. However, when the inner wall of the opening OP1$b$ of the silicon nitride film LF2 is configured to be not covered by the resin film LF3, even the variation in the shrink amount of the resin film LF3 does not affect the exposed area of the pad PD1 since the exposed area of the pad PD1 is defined by the opening OP1$b$ of the silicon nitride film LF2. Therefore, variation in the exposed area of the pad PD1 can be suppressed. Therefore, the test step (probe test) utilizing the pad PD1 can be more easily and exactly performed.

Moreover, in the present embodiment, it is more preferred to cover the step portion DS on the upper surface of the silicon nitride film LF2 formed in accordance with the inner wall of the opening OP1$a$ of the silicon oxide film LF1 by the resin film LF3. In this manner, the unevenness in the base which forms the rewiring RW is reduced, and therefore, formation of the rewiring RW is facilitated, and the rewiring RW can be more exactly formed. Therefore, the rewiring RW can be more exactly formed by utilizing a plating method. Moreover, since the plating film is difficult to be disconnected, the reliability of the rewiring RW can be improved.

Moreover, in the present embodiment, it is preferred to taper the inner wall of the opening OP1$b$ of the silicon nitride film LF2 and to taper the inner wall of the opening OP1$c$ of the resin film LF3. In this manner, the rewiring RW extended from an upper part of the pad PD1 to an upper part of the laminated film can be easily formed, and the rewiring RW can be more exactly formed. For example, when an underlying seed layer (for electric power feed) (corresponding to the above-described seed film SE) for forming the rewiring RW by electrolytic plating is formed by a sputtering method or others, the seed layer can be exactly formed, and failure in the formation of the seed layer can be prevented. Therefore, disconnection defects of the seed layer can be prevented, and the plating layer for the rewiring RW can be exactly formed.

Here, if the inner wall of the opening OP1$b$ of the silicon nitride film LF2 is tapered, the inner wall of the opening OP1$b$ is inclined from the direction perpendicular to the main surface of the semiconductor substrate SB so that the size (plane size) of the opening OP1$b$ is larger on the upper side than the lower side. Moreover, if the inner wall of the opening OP1$c$ of the resin film LF3 is tapered, the inner wall of the opening OP1$c$ is inclined from the direction perpendicular to the main surface of the semiconductor substrate SB so that the size (plane size) of the opening OP1$c$ is larger on the upper side than the lower side.

Moreover, the silicon oxide film LF1 is preferred to be formed by HDP (High Density Plasma)-CVD method. Since the silicon oxide film LF1 is the lowest layer of the laminated film LF, the silicon oxide film LF1 is formed so as to be in contact with the wiring (in this case, the wiring M3) of the same layer as the pad PD1 and cover the wiring (in this case, the wiring M3). The thickness of the silicon oxide film LF1 is preferred to be increased in order to increase the breakdown voltage. However, in order to enable burying of the part between adjacent wirings of the wiring (in this case, the wiring M3) in the same layer as the pad PD1 even in the large thickness, it is preferred to apply a film formation method having good burying characteristics. A silicon oxide film formed by the HDP-CVD method has good burying characteristics. Therefore, by forming the silicon oxide film LF1 by the HDP-CVD method, the thickness of the silicon oxide film LF1 can be increased while preventing the failure in the burying between the wirings (in this case, the wiring M3) in the same layer as the pad PD1. Therefore, the reliability of the semiconductor device can be further improved. Note that the silicon oxide film formed by the HDP-CVD method is referred to as a HDP-CVD oxide film. Moreover, if the silicon oxide film LF1 is formed by the HDP-CVD method, the plasma density in the film formation is preferred to be about $1\times10^{11}$ to $1\times10^{12}/cm^3$. In not the high-density plasma CVD but normal plasma CVD, the plasma density is generally about $1\times10^9$ to $1\times10^{19}/cm^3$.

Moreover, as described above, the reliability of the semiconductor device is improved by, for example, improving the breakdown voltage of the coil CL2 and the coil CL1 by arranging the laminated structure of the insulation film between the coil CL2 and the coil CL1 arranged on top and bottom. The coil CL2 and the rewiring RW are formed in the same layer, and the shortest distance between the coil CL2 and the rewiring RW in the planar view is preferred to be larger than the interval (top-bottom direction interval) between the coil CL2 and the coil CL1. In this manner, the breakdown voltage between the coil CL2 and the rewiring RW can be also ensured. The shortest distance between the coil CL2 and the rewiring RW in the planar view can be, for example, 100 μm or larger.

And, the resin film LF3 is most preferred to be a polyimide film. The polyimide film has high solvent resistance, high heat resistance, and high mechanical strength. As the resin film LF3, in addition to the polyimide film, other organic insulation film such as an epoxy based, PBO based, acrylic based, or WRP based resin can be also used.

<Regarding Coil Configuration>

Next, a configuration of the coil configuring the transformer TR1 formed within the semiconductor chip CP1 will be described.

Figure 32:
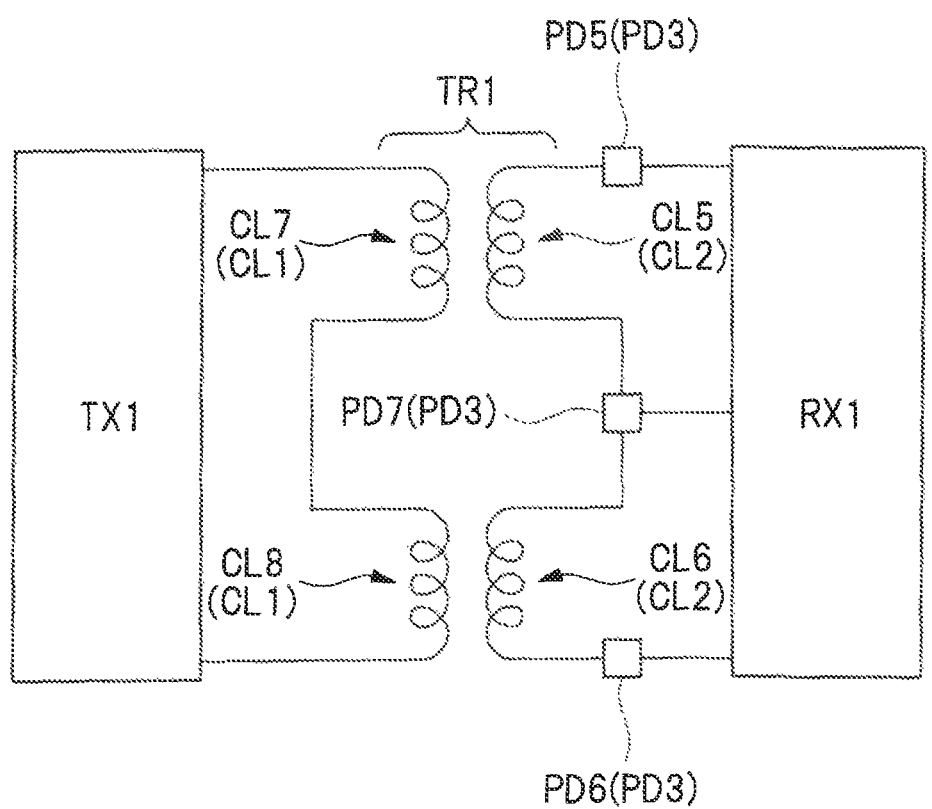
FIG. 32 is a circuit diagram showing a circuit configuration of a transformer formed inside the semiconductor device of the embodiment.
Figure 33:
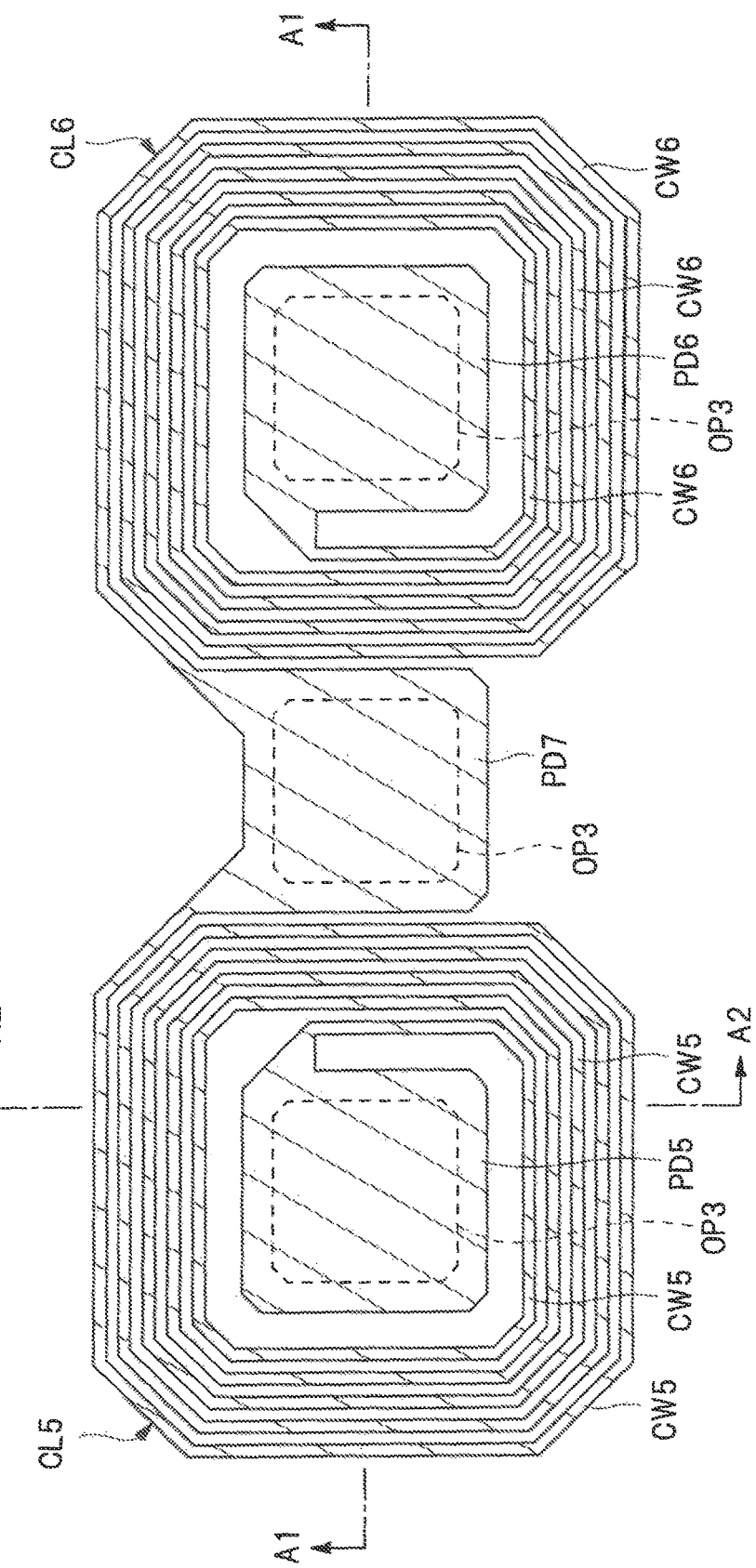
FIG. 33 is a plan view of a principal part of the semiconductor device of the embodiment.
Figure 34:
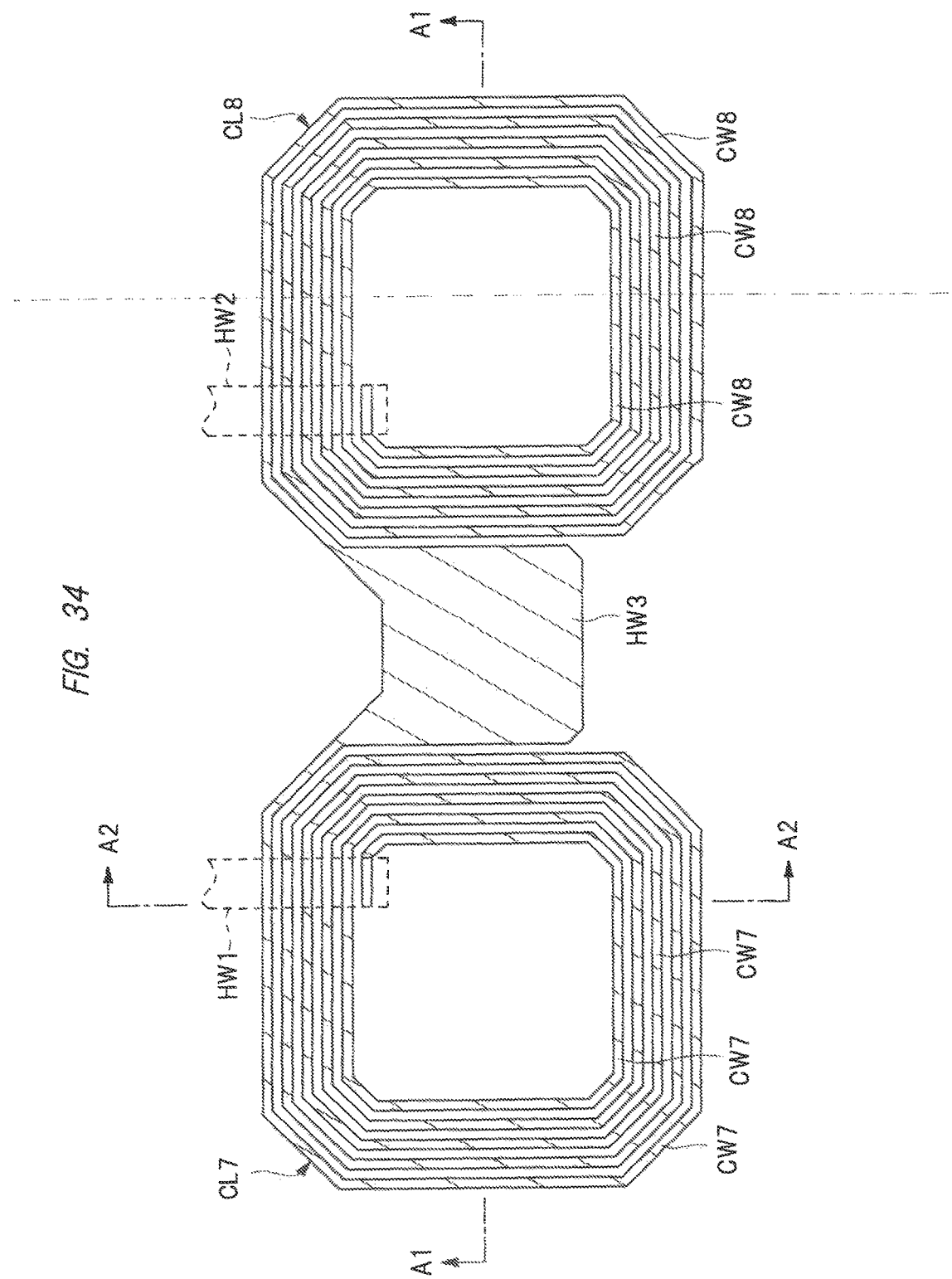
FIG. 34 is a plan view of a principal part of the semiconductor device of the embodiment.
Figure 36:
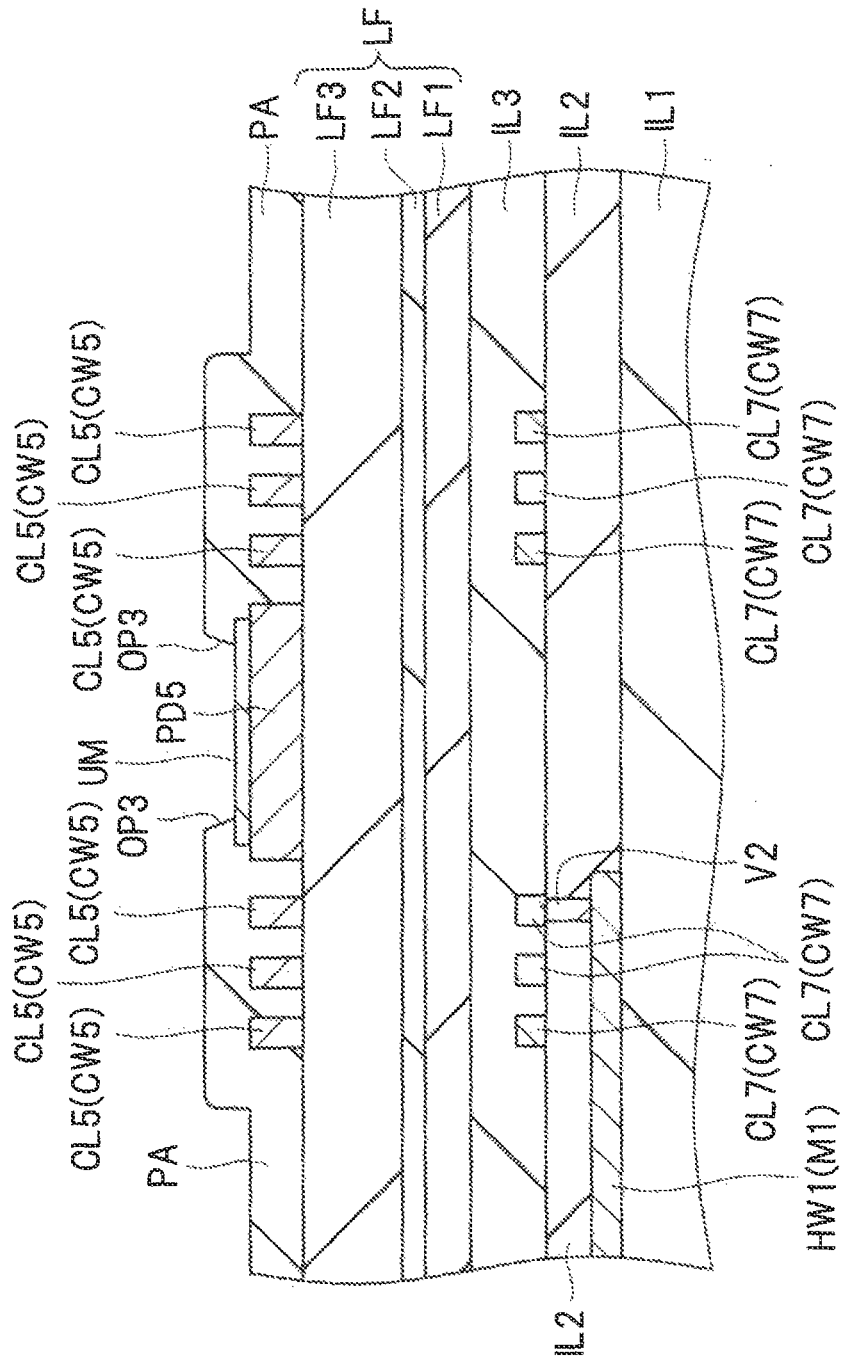
FIG. 36 is a cross-sectional view of a principal part of the semiconductor device of the embodiment.

FIG. 32 is a circuit diagram showing a circuit configuration of the transformer TR1 formed within the semiconductor chip CP1. FIG. 33 and FIG. 34 are plan views of a principal part of the semiconductor chip CP1 of this embodiment, and plan views of the coils formed in the above-described transformer formation region 1B. FIG. 35 and FIG. 36 are cross-sectional views of a principal part of the semiconductor chip CP1 of this embodiment, and cross-sectional views of the above-described transformer formation region 1B.

Note that FIG. 33 and FIG. 34 show the same flat region in the semiconductor chip CP1 as each other. However, layers shown in these drawings are different from each other so that FIG. 34 shows a lower layer than that shown in FIG. 33. Specifically, FIG. 33 shows the secondary coil (coils CL5 and CL6) of the transformer TR1 formed in the semiconductor chip CP1, and FIG. 34 shows the primary coil (coils CL7 and CL8) of the transformer TR1 formed in the semiconductor chip CP1. Further, in order to easily understand a relative positional relationship between the primary coil (CL7 and CL8) and the leading wirings (the lead wirings HW1 and HW2), the lead wirings HW1 and HW2 are shown by a dotted line in FIG. 34. Also, cross-sectional views taken along a line A1-A1 in FIG. 33 and FIG. 34 correspond to FIG. 35, and cross-sectional views taken along a line A2-A2 in FIG. 33 and FIG. 34 correspond to FIG. 36.

As described above, the primary coil and the secondary coil for the transformer TR1 are formed within the semiconductor chip CP1, and the primary coil of the primary coil and the secondary coil is formed on a lower side, and the secondary coil thereof is formed on an upper side. That is, the secondary coil is arranged above the primary coil, and the primary coil is arranged below the secondary coil.

Here, the primary coil and the secondary coil are composed of two coils, respectively. That is, the transformer TR1 is composed of two transformers, and these two transformers are operated differentially, so that noise resistance becomes high.

Therefore, as shown in FIG. 32, the present embodiment adopts a configuration that the primary coil (corresponding to the above-described coil CL1a) of the transformer TR1 is formed of a coil CL7 and a coil CL8 connected in series, while the secondary coil (corresponding to the above-described coil CL2a) of the transformer TR1 is formed of a coil CL5 and a coil CL6 connected in series between a pad PD5 and a pad PD6. In this case, the coil CL7 and the coil CL5 are magnetically coupled (inductively coupled) to each other, while the coil CL8 and coil CL6 are magnetically coupled (inductively coupled) to each other. The coils CL7 and CL8 connected in series are connected to the transmission circuit TX1. Further, a pad PD7 is electrically connected between the coil CL5 and the coil CL6. These coils CL5, CL6, CL7 and CL8 and pads PD5, PD6 and PD7 and transmission circuit TX1 are formed within the semiconductor chip CP1. The pads PD5, PD6 and PD7 of the semiconductor chip CP1 are connected to the reception circuit RX1 within the semiconductor chip CP2 through conductive connection members such as the later-described bonding wires BW and the internal wirings of the semiconductor chip CP2.

Therefore, in the semiconductor chip CP1, when a current is flowed by feeding a transmission signal from the transmission circuit TX1 to the coil CL7 and the coil CL8 which are the primary coil, induced electromotive force is generated in the coil CL5 and the coil CL6 which are the secondary coil in accordance with change of a current flowing in the coil CL7 and coil CL8 so that an induction current flows. The induced electromotive force or the induction current generated in the coil CL5 and coil CL6 can be detected by the reception circuit RX1 within the semiconductor chip CP2 from the pads PD5, PD6 and PD7 through conductive connection members such as the later-described bonding wire BW and the internal wirings of the semiconductor chip CP2. In this manner, a signal from the transmission circuit TX1 of the semiconductor chip CP1 can be transmitted to the reception circuit RX1 of the semiconductor chip CP2 through the coils CL7, CL8, CL5 and CL6 through the electromagnetic induction. Since a fixed potential (a ground potential, a GND potential, a power source potential or others) is supplied from the semiconductor chip CP2 to the pad PD7, the induced electromotive force or the induction current of the coil CL5 and the induced electromotive force or the induction current of the coil CL6 can be detected and differentially controlled (operated).

A specific configuration of these coils CL5, CL6, CL7 and CL8 and pads PD5, PD6 and PD7 will be described below with reference to FIG. 33 to FIG. 36.

The coil CL7 and the coil CL8 correspond to the above-described coil CL1, the coil CL5 and the coil CL6 correspond to the above-described coil CL2, and the pads PD5, PD6, and PD7 correspond to the above-described pad PD3. Therefore, if the transformer of FIG. 33 to FIG. 36 is applied to the above-described structure of FIG. 3 or to the manufacturing steps of the above-described FIG. 7 to FIG. 31, the above-described coil CL1 is replaced by the coils CL7 and CL8 of FIG. 33 to FIG. 36, the above-described coil CL2 is replaced by the coils CL5 and CL6 of FIG. 33 to FIG. 36, and the above-described pad PD3 is replaced by the pads PD5, PD6, and PD7 of FIG. 33 to FIG. 36 in FIG. 3 and FIG. 7 to FIG. 31 described above.

First of all, a specific configuration of the coils CL5 and CL6 configuring the secondary coil and the pads (the pad electrode, the bonding pad) PD5, PD6 and PD7 connected thereto will be described.

As shown in FIG. 32 to FIG. 36, two coils (inductors) CL5 and CL6 are connected in series between the pad PD5 and the pad PD6. The pad PD7 is electrically connected between the coil CL5 and the coil CL6.

The coil CL5 and the coil CL6 are formed in the same layer as each other within the semiconductor chip CP1, the coil CL5 is formed of a spirally-winding coil wiring CW5

(in a coil shape, a loop shape), and the coil CL6 is formed of a spirally-winding coil wiring CW6 (in a coil shape, a loop shape). Further, each of the coil CL5 and the coil CL6 is formed on a plane. Each of the coil CL5 and the coil CL6 can be regarded as an inductor. Since the coils CL5 and CL6 correspond to the above-described coil CL1, they are formed in the layer where the coil CL1 is formed in accordance with the above-described method of forming the coil CL1. Also, since the pads PD5, PD6, and PD7 correspond to the above-described pad PD3, they are formed in the layer where the pad PD3 is formed in accordance with the above-described method of forming the pad PD3.

Further, as shown in FIG. 32 to FIG. 36, two coils (inductors) CL7 and CL8 are connected in series. The coil CL7 and the coil CL8 are formed in the same layer as each other within the semiconductor chip CP1, the coil CL7 is formed of a spirally-winding coil wiring CW7 (in a coil shape, a loop shape), and the coil CL8 is formed of a spirally-winding coil wiring CW8 (in a coil shape, a loop shape). Further, each of the coil CL7 and the coil CL8 is formed on a plane. Each of the coil CL7 and the coil CL8 can be regarded as an inductor. Since the coils CL7 and CL8 correspond to the above-described coil CL2, they are formed in the layer where the coil CL2 is formed in accordance with the above-described method of forming the coil CL2.

As seen also from FIG. 35 and FIG. 36, the coils CL7 and L8 are formed within the semiconductor chip CP1 in a lower layer than the coils CL5 and CL6. That is, within the semiconductor chip CP1, the coil CL5 and the coil CL6 are formed in the same layer as each other and the coil CL7 and the coil CL8 are formed in the same layer as each other. However, the coils CL7 and L8 are arranged in a lower layer than the coils CL5 and CL6, and the coils CL5 and CL6 are arranged in an upper layer than the coils CL7 and CL8.

The coil CL7 is arranged just below the coil CL7, and the coil CL8 is arranged just below the coil CL6. That is, the coil CL7 is arranged so as to overlap with the coil CL5 in a plan view, and the coil CL8 is arranged so as to overlap with the coil CL6 in a plan view. In other words, the coil CL5 is arranged just above the coil CL7, and the coil CL6 is arranged just above the coil CL8. That is, the coil CL5 is arranged so as to overlap with the coil CL7 in a plan view, and the coil CL6 is arranged so as to overlap with the coil CL8 in a plan view.

The coil CL5 and the coil CL7 are magnetically coupled to each other, and the coil CL6 and the coil CL8 are magnetically coupled to each other. That is, the coil CL5 and the coil CL7 are not connected to each other by a conductor but are magnetically coupled to each other, and the coil CL6 and the coil CL8 are not connected to each other by a conductor but are magnetically coupled to each other. On the other hand, the coil CL5 and the coil CL6 are connected to each other by a conductor, and the coil CL7 and the coil CL8 are connected to each other by a conductor.

Since the pads PD5, PD6, and PD7 correspond to the above-described pad PD3, and the coils CL5 and CL6 (coil wirings CW5, CW6) correspond to the above-described coil CL2, the pads PD5, PD6, and PD7 and the coils CL5 and CL6 (coil wirings CW5, CW6) are formed in same layer as each other, and are formed also in the same layer as the above-described rewiring RW and the above-described pad PD2. Specifically, all of the coils CL5 and CL6 (coil wirings CW5, CW6) and the pads PD5, PD6, and PD7 are composed of the laminated film of the above-described seed film SE and the copper film CF on the seed film SE, and are formed on the above-described resin film LF3. However, on the surfaces of the pads PD5, PD6, and PD7, the above-described underlying metal film UM is formed. While the coil wirings CW5 and CW6 (coil wirings CW5, CW6) are covered with the uppermost protection film PA of the semiconductor chip CP1, the pads PD5, PD6 and PD7 are exposed from opening portion OP3 provided in the protection film PA. In FIG. 33, the opening portion OP3 is shown with a dotted line.

Also, as shown in FIG. 33 to FIG. 35, the pad PD5 is arranged inside the spiral of the coil CL5, and one end of the coil CL5 is connected to the pad PD5. That is, the coil CL5 is formed by winding the coil wiring CW5 connected to the pad PD5 around the pad PD5 a plurality of times. In the case shown in FIG. 33, the coil CL5 is formed by winding the coil wiring CW5 connected to the pad PD5 around the pad PD5 at a right-hand turn (clockwise). Since the coil wirings CW5 do not intersect with each other, the coil wiring CW5 connected to the pad PD5 is gradually shifted to the side far from the pad PD5 each time of the right-hand turn (clockwise) winding around the pad PD5.

Further, the pad PD6 is arranged inside the spiral of the coil CL6, and one end of the coil CL6 is connected to the pad PD6. That is, the coil CL6 is formed by winding the coil wining CW6 connected to the pad PD6 around the pad PD6 a plurality of times. In the case shown in FIG. 33, the coil CL6 is formed by winding the coil wiring CW6 connected to the pad PD6 around the pad PD6 at a left-hand turn (counterclockwise). Since the coil wirings CW6 do not intersect with each other, the coil wiring CW6 connected to the pad PD6 is gradually shifted to the side far from the pad PD6 each time of the left-hand turn (counterclockwise) winding of the coil wiring CW6 around the pad PD6.

Here, the term "right-hand turn" has the same meaning as the term "clockwise", while the term "a left-hand turn" has the same meaning as the term "counterclockwise". When the "winding diction (spiral direction) of a coil or a coil wiring" is described, the winding direction indicates a winding direction formed from the inside of the spiral to the outside thereof when the coil or the coil winding is viewed from the above, the apparently-clockwise winding in the viewing from the inside of the spiral to the outside thereof as viewed from above is referred to as "right winding", and the apparently-counterclockwise winding in the viewing from the inside of the spiral to the outside thereof as viewed from above is referred to as "left winding". For example, in the case of the description of the winding direction of the coil CL5 of the semiconductor chip CP1, when a surface side (the surface side is a side on which the pad is formed) of the semiconductor chip CP1 is viewed from above of the semiconductor chip CP1 (FIG. 33 and FIG. 34 correspond to the viewing), the apparently-clockwise winding in the viewing from the inside of the spiral of the coil CL5 to the outside thereof is referred to as "right winding", and the apparently-counterclockwise winding therein is referred to as "left winding".

The number of windings (the number of turns) of the coil CL5 (the coil winding CW5) and the number of windings (the number of turns) of the coil CL6 (the coil winding CW6) are changeable as necessary. However, it is preferable that the number of windings of the coil CL5 (the coil winding CW5) and the number of windings of the coil CL6 (the coil winding CW6) are the same. Further, it is preferable that a size (a diameter) of the coil CL5 and a size (a diameter) of the coil CL6 are the same. Moreover, it is preferable that a self-inductance of the coil CL5 and a self-inductance of the coil CL6 are the same.

Also, in FIG. 33, the coil CL5 is wound at the right-hand turn, and the coil CL6 is wound at the left-hand turn.

However, as another mode, the coil CL5 can be wound at the left-hand turn, and the coil CL6 can be wound at the right-hand turn. Further, in FIG. 33, the pad PD7 is arranged between the coil CL5 and the coil CL6. As another mode, the pad PD7 can be arranged in a region other than the part between the coil CL5 and the coil CL6.

The other end (an end portion opposed to an end portion connected to the pad PD5) of the coil CL5 (the coil winding CW5) and the other end (an end portion opposed to an end portion connected to the pad PD6) of the coil CL6 (the coil winding CW6) are connected to the pad PD7. Therefore, the above-described other end of the coil CL5 (the coil wiring CW5) and the above-described other end of the coil CL6 (the coil wiring CW6) are electrically connected to each other through the pad PD7.

Here, the above-described other end of the coil CL5 (the coil wiring CW5) corresponds to an outer end portion (the outside of the spiral) of the coil CL5 (the coil wiring CW5), and the above-described other end of the coil CL6 (the coil wiring CW6) corresponds to an outer end portion (the outside of the spiral) of the coil CL6 (the coil wiring CW. That is, the coil CL5 (the coil wiring CW5) has an inner end portion (the inside of the spiral) and an outer end portion (the outside of the spiral) which are end portions opposed to each other, and the inner end portion among them is connected to the pad PD5 while the outer end portion is connected to the pad PD7. Further, the coil CL6 (the coil wiring CW6) has an inner end portion (the inside of the spiral) and an outer end portion (the outside of the spiral) which are end portions opposed to each other, and the inner end portion among them is connected to the pad PD6 while the outer end portion is connected to the pad PD7. Therefore, in a planar view, the pad PD7 is arranged between the coil CL5 and the coil CL6, and arranged between the pad PD5 and the pad PD6. The respective decisions (lengths of sides) of the pads PD5, PD6, and PD7 can be almost equal to one another.

Further, since the coils CL5 and CL6 are formed on the resin film LF3, as shown in FIG. 33, it is preferable that each angle of the coil CL5 and CL6 (the coil wirings CW5 and CW6) is set at an obtuse angle (angle larger than 90°) in a plan view. This is because the resin film, especially, a polyimide film is weak to a right angle or an acute angle of a metal pattern. By setting each angle of the coils CL5 and CL6 (the coil wirings CW5 and CW6) at the obtuse angle (angle larger than 90°), the reliability of the underlying resin film LF3 of the coils CL5 and CL6 and the protection film PA covering the coils CL5 and CL6 can be improved. Further, this manner causes large effect especially when the underlying resin film LF3 of the coils CL5 and CL6 or the protection film PA covering the coils CL5 and CL6 is a polyimide film. In the case shown in FIG. 33, each plane shape of the coils CL5 and CL6 (the coil wirings CW5 and CW6) is substantially octagonal, and therefore, each angle of the coils CL5 and CL6 (the coil wirings CW5 and CW6) is about 135°.

Next, the coils CL7 and CL8 will be further described with reference to FIG. 34 to FIG. 36.

As also seen from FIG. 34, no pad is arranged inside the spiral of the coil CL7. An inner end portion (the inside of the spiral) of the coil CL7 (coil wiring CW7) is electrically connected through a via portion to a lead wiring HW1 arranged in a lower layer than the coil wiring CW7. This via portion is positioned between the coil wiring CW7 and the lead wiring HW1 to connect the coil wiring CW7 and the lead wiring HW1. When the coil wiring CW7 is formed in the same layer as the second wiring layer, the lead wiring HW1 is formed in the same layer as the first wiring layer which is one-level lower than the coil wiring CW7, that is, formed in the wiring M1, and the above-described via portion connecting the coil wiring CW7 and the lead wiring HW1 corresponds to a via portion V2. A wiring in the same layer as or in the different layer from the lead wiring HW1 is connected to the lead wiring HW1, and is connected to the one corresponding to the transmission circuit TX1 formed in the semiconductor chip CP1 through the inner wiring of the semiconductor chip CP1.

The coil CL7 is formed by winding the coil wiring CW7 connected to the lead wiring HW1 through the via portion a plurality of times. Note that it is preferable that the coil wiring CW7 does not wind in a region (position) just below the pad PD5, and the coil wiring CW7 winds so as to surround the region (position) just below the pad PD5.

In the case shown in FIG. 34, the coil CL7 is formed by winding the coil wiring CW7 connected to the lead wiring HW1 through the via portion around the region (position) just below the pad PD5 at a right-hand turn (clockwise). Since the coil wirings CW7 do not intersect with each other, the coil wiring CW7 connected to the lead wiring HW1 through the via portion is gradually shifted from the center of the spiral to the far side circulates for every right-hand turn (clockwise) winding around the region (position) just below the pad PD5.

Further, no pad is arranged inside the spiral of the coil CL8. An inner end portion (the inside of the spiral) of the coil CL8 (coil wiring CW8) is electrically connected to a lead wiring HW2 arranged in a lower layer than the coil wiring CW8 through a via portion. This via portion is positioned between the coil wiring CW8 and the lead wiring HW2 to connect the coil wiring CW8 and the lead wiring HW2. When the coil wiring CW8 is formed in the same layer as the second wiring layer, the lead wiring HW2 is formed in the same layer as the first wiring layer which is one-level lower than the coil wiring CW8, that is, formed in the wiring M1, and the above-described via portion connecting the coil wiring CW8 and the lead wiring HW2 corresponds to a via portion V2. A wiring in the same layer as or in the different layer from the lead wiring HW2 is connected to the lead wiring HW2, and is connected to the one corresponding to the transmission circuit TX1 formed in the semiconductor chip CP1 through the inner wiring of the semiconductor chip CP1.

The coil CL8 is formed by winding the coil wiring CW8 connected to the lead wiring HW2 through the via portion a plurality of times. Note that it is preferable that the coil wiring CW8 does not wind in a region (position) just below the pad PD6, and the coil wiring CW8 winds so as to surround the region (position) just below the pad PD6.

In the case shown in FIG. 34, the coil CL8 is formed by winding the coil wiring CW8 connected to the lead wiring HW2 via the via portion around the region (position) just below the pad PD6 at a left-hand turn (counterclockwise). Since the coil wirings CW8 do not intersect with each other, the coil wiring CW8 connected to the lead wiring HW2 through the via portion is gradually shifted from the center of the spiral to the far side for every left-hand turn (counterclockwise) winding around the region (position) just below the pad PD6.

The number of windings (the number of turns) of the coil CL7 (the coil winding CW7) and the number of windings (the number of turns) of the coil CL8 (the coil winding CW8) are changeable as necessary. However, it is preferable that the number of windings of the coil CL7 (the coil winding CW7) and the number of windings of the coil CL8 (the coil winding CW8) are the same. Further, it is preferable that a size (a diameter) of the coil CL7 and a size (a diameter) of the coil CL8 are the same. Moreover, it is preferable that a self-inductance of the coil CL7 and a self-inductance of the coil CL8 are the same. Also, it is preferable that a mutual inductance between the coils CL5 and CL7 which are magnetically coupled to each other and a mutual inductance between the coils CL6 and CL8 which are magnetically coupled to each other are the same. Further, in FIG. 34, the coil CL7 is wound at the right-hand turn, and the coil CL8 is wound at the left-hand turn. However, as another mode, the coil CL7 can be wound at the left-hand turn, and the coil CL8 can be wound at the right-hand turn.

An outer end portion of the coil CL7 (the coil winding CW7) and an outer end portion of the coil CL8 (the coil winding CW8) are connected to the connection wiring (connecting wiring) HW3 provided between the coil CL7 and the coil CL8, and are electrically connected to each other through this connection wiring HW3. That is, an inner end portion of the inner end portion (the inside of the spiral) and the outer end portion (the outside of the spiral) of the coil CL7 (the coil winding CW7) is connected to the lead wiring HW1 in a lower layer than that of the coil CL7 through the via portion, and the outer end portion thereof is connected to the lead wiring HW3 in the same layer as that of the coil CL7. Also, an inner end portion of the inner end portion (the inside of the spiral) and the outer end portion (the outside of the spiral) of the coil CL8 (the coil winding CW8) is connected to the lead wiring HW2 in a lower layer than that of the coil CL8 through the via portion, and the outer end portion thereof is connected to the connection wiring HW3 in the same layer as that of the coil CL8. Therefore, one end portion (the outer end portion) of the coil CL7 (the coil wiring CW7) and one end portion (the outer end portion) of the coil CL8 (the coil wiring CW8) are electrically connected through the connection wiring HW3.

Note that the inner end portion (the inside of the spiral) of the coil CL7 or the coil wiring CW7 and the outer end portion (the outside of the spiral) thereof are end portions positioned opposed to each other, and the inner end portion (the inside of the spiral) of the coil CL8 or the coil wiring CW8 and the outer end portion (the outside of the spiral) thereof are end portions opposed to each other.

The connection wiring HW3 is formed in the same layer as those of the coil CL7 (the coil wiring CW7) and the coil CL8 (the coil wiring CW8), and the connection wiring HW3 is a wiring for electrically connecting the outer end portion of the coil CL7 (the coil wiring CW7) and the outer end portion of the coil CL8 (the coil wiring CW8). The connection wiring HW3 is arranged between the coil cL7 and the coil CL8. Therefore, when the pad PD7 is arranged between the coil CL5 and the coil CL6, the connection wiring HW3 is arranged immediately below the pad PD7. While the connection wiring HW3 can have the almost same planar shape (planar dimension) as that of the pad PD7, the connection wiring HW3 can have a different planar shape (planar dimension) from that of the pad PD7 because of not functioning as a pad (Thus, not being connection with such a connection member as a bonding wire). For example, the outer end portion of the coil CL7 (the coil wiring CW7) and the outer end portion of the coil CL8 (the coil wiring CW8) can be connected by the connection wiring HW3 having a width as almost the same as those of the coil wirings CW7 and CW8. However, if the connection wiring HW3 having the wiring width larger than each wiring width of the coil wirings CW7 and CW8 is provided between the coil cL7 and the coil cL8 in a planar view, the wiring resistance can be reduced.

The coil CL7 and the coil CL8 connected in series correspond to the above-described coil CL1a on the primary side (thus, the above-described coil CL1) of the transformer TR1, and the coil CL5 and the coil CL6 connected in series correspond to the above-described coil CL2a on the secondary side (thus, the above-described coil CL2) of the transformer TR1. The lead wirings HW1 and HW2 are connected to the transmission circuit TX1 formed within the semiconductor chip CP1 through the internal wirings (M1 to M3) of the semiconductor chip CP1. The above-described pads PD5, PD6 and PD7 are connected to the reception circuit RX1 formed within the semiconductor chip CP2 through conductive connection members such as the above-described bonding wirings BW connected to these PD5, PD6 and PD7 and the internal wirings of the semiconductor chip CP2.

Therefore, when a signal for transmission is sent from the transmission circuit TX1 to the lead wirings HW1 and HW2, a current flows in the coil CL7 and coil CL8 connected in series between the lead wiring HW1 and the lead wiring HW2. At this time, since the coil CL7 and the coil CL8 are connected in series, a current flowing in the coil CL7 and a current flowing in the coil CL8 are substantially the same as each other in a magnitude. The coil CL5 and the coil CL7 are not connected by a conductor but are magnetically coupled to each other, while the coil CL6 and the coil CL8 are not connected by a conductor but are magnetically coupled to each other. Therefore, when a current flow in the coil CL7 and the coil CL8 on the primary side, induced electromotive forces are generated in the coil CL5 and the coil CL6 on the secondary side in accordance with change of the current, and an induction current flows.

Further, the above-described transformer TR2 of the semiconductor chip CP2 can be formed as similar to the transformer TR1 of the semiconductor chip CP1. Therefore, also in the semiconductor chip CP2, the above-described coils CL7 and CL8 are formed as the above-described coil CL1b, the above-described coils CL5 and CL6 are formed as the above-described coil CL2b, and the above-described pads PD5, PD6 and PD7 connected to the coils CL5 and CL6 can be formed.

Further, the pad PD5 is arranged inside (inside the spiral of) the coil CL5 (coil wiring CW5), while the pad PD6 is arranged inside (inside the spiral of) the coil CL6 (coil wiring CW6).

By arranging the pad PD5 inside the coil CL5 (the coil wiring CW5), the inner end portion of the coil CL5 can be connected to the pad PD5 without forming a lead wiring (the lead wiring for connecting the pad PD5 and the coil CL5). Therefore, since it is not required to form a lead wiring for the pad PD5 in the lower layer than the coil CL5 (the coil wiring CW5), a breakdown voltage between the coil CL5 and the coil CL7 has a dominant influence on a breakdown voltage of the transformer, so that the breakdown voltage of the transformer can be further improved. Further, since it is not required to form the lead wiring for the pad PD5, it is not required to form a via portion for connection to the lead wiring, so that a manufacturing cost or a manufacturing time can also be suppressed. This also can be said for the pad PD6 and the coil CL6.

Moreover, an inner end of the coil CL7 (the coil wiring CW7) is connected to the lead wiring HW1 in a layer lower than the coil wiring CW7 through a via portion, and an inner end of the coil CL8 (the coil wiring CW8) is connected to the lead wiring HW2 in a layer lower than the coil wiring CW8 through a via portion. As another mode, one or both of the lead wirings HW1 and HW2 can be provided in a layer upper than the coils CL7 and CL8 but lower than the coils CL5 and C16. However, even in this case, the lead wirings HW1 and HW2 are formed in a layer lower than the laminated film LF. However, in terms of the improvement of the breakdown voltage, the case of the formation of both of the lead wirings HW1 and HW2 in a layer lower than the coils CL7 and CL8 is more advantageous, so that the breakdown voltage between the coil CL5 and the coil CL7 and the breakdown voltage between the coil CL6 and the coil CL8 become dominant as the breakdown voltage of the transformer, and the breakdown voltage of the transformer can be further improved.

Moreover, a slit (opening) can be also provided in the lead wirings HW1 and HW2. The slit can be a slit having a long side along each extending direction of the lead wirings HW1 and HW2, and a single or a plurality of slits can be provided in each of the lead wirings HW1 and HW2. When currents flow to the coils CL7 and CL8 on the primary side or when induction currents flow to the coils CL5 and CL6 on the secondary side, magnetic flux is generated so as to penetrate through the coils CL5, CL6, CL7, and CL8. However, if the slits are provided in the lead wirings HW1 and HW2, eddy currents can be suppressed or prevented from being generated in the lead wirings HW1 and HW2 due to the magnetic flux.

Further, in the present embodiment, the coil CL5 and the coil CL6 are formed in the same layer, and the coil CL7 and the coil CL8 are formed in the same layer. The coils CL7 and CL8 are formed in the lower layer than the coil CL5 and CL6. By arranging the coils CL5 and CL6 to be connected to the pads PD5, PD6 and PD7 among the coils CL5, CL6 and the coils CL7, CL8 on an upper layer side, the coils CL5 and CL6 are easily connected to the pads PD5, PD6 and PD7. Further, by forming the coil CL5 and the coil CL6 in the same layer, and forming the coil CL7 and the coil CL8 in the same layer, a mutual inductance between the coils CL5 and CL7 and a mutual inductance between the coils CL6 and CL8 are easily coincided with each other. Therefore, a signal is easily appropriately transmitted through the coils CL5, CL6, CL7 and CL8. Further, the number of layers required to form the coils CL5, CL6, CL7 and CL8 can be suppressed. Therefore, the semiconductor chip is easily designed. This configuration is also advantageous for downsizing of the semiconductor chip.

Moreover, as shown in FIG. 33, an inner end of the coil CL5 (the coil wiring CW5) is connected to the pad PD5, an inner end of the coil CL6 (the coil wiring CW6) is connected to the pad PD6, and an outer end of the coil CL5 (the coil wiring CW5) and an outer end of the coil CL6 (the coil wiring CW6) are connected to the pad PD7. The connecting positions between the pads PD5, PD6, and PD7 with the coils CL5 and CL6 (the coil wirings CW5 and CW6) are preferred to be not the centers of the sides of the pads PD5, PD6, and PD7 but vicinities of corners of the pads PD5, PD6, and PD7. The connecting positions between the pads PD5, PD6, and PD7 with the coils CL5 and CL6 (the coil wirings CW5 and CW6) tend to become the easily-disconnected parts. However, if the above-described connecting positions are set in the respective corner portions of the pads PD5, PD6, and PD7, occurrence of disconnection at the above-described connecting parts can be suppressed or prevented. This is because of the following two reasons.

First, the first reason will be explained. The disconnection at the connecting position between the pad and the coil easily occurs when a bonding wire is connected to the pad later. Therefore, at each of the pads PD5, PD6, and PD7, disconnection is difficult to occur if the connecting position between the pad and the coil is distant from the wire bonding position (the position at which the bonding wire is connected) as much as possible. At each of the pads PD5, PD6, and PD7, the wire bonding position is almost at the central portion of the pad. Therefore, when the connecting position between the pad and the coil is set in not the center of the side of each of the pads PD5, PD6, and PD7 but the vicinity of the corner of each of the pads PD5, PD6, and PD7, the distance between the wire bonding position and the connecting position between the pad and the coil can be increased. In this manner, disconnection at the connecting positions between the pads PD5, PD6, and PD7 and the coils CL5 and CL6 (the coil wirings CW5 and CW6) can be suppressed or prevented.

Next, the second reason will be explained. When wire bonding is to be performed to the pad, ultrasonic-wave vibrations are applied thereto so that the vibration direction of the ultrasonic-wave vibrations is a direction parallel (longitudinal direction or lateral direction) to the side of the pad. Therefore, if the connecting position between the pad and the coil is set at the center of the side of each of the pads PD5, PD6, and PD7, the vibrations caused by the ultrasonic waves are applied also to the connecting position between the pad and the coil, and therefore, disconnection easily occurs. On the other hand, when the connecting position between the pad and the coil is set in not the center of the side of each of the pads PD5, PD6, and PD7 but the vicinity of the corner of each of the pads PD5, PD6, and PD7, the vibrations caused by the ultrasonic waves in the wire bonding are difficult to be applied to the connecting position between the pad and the coil. Therefore, disconnection at the connecting positions between the pads PD5, PD6, and PD7 and the coils CL5 and CL6 (the coil wirings CW5 and CW6) can be suppressed or prevented.

Therefore, the connecting positions between the pads PD5, PD6, and PD7 and the coils CL5 and CL6 (the coil wirings CW5 and CW6) are preferred to be in not the centers of the sides of the pads PD5, PD6, and PD7 but the vicinities of the corners of the pads PD5, PD6, and PD7. Here, the planar shape of each of the pads PD5, PD6, and PD7 is a substantially rectangular shape, a chamfered rectangular shape, a corner-rounded rectangular shape, or others. FIG. 33 shows the case in which the planar shape of each of the pads PD5, PD6, and PD7 is the chamfered rectangular planar shape. If the planar shape of each of the pads PD5, PD6, and PD7 is a rectangular shape, the coil CL5 or CL6 (the coil wiring CW5 or CW6) maybe connected to not the center of the side of the rectangle but the position shifted to the corner side of the rectangle. If the planar shape of each of the pads PD5, PD6, and PD7 is the rectangular-corner-chamfered shape or the rectangle-corner-rounded rectangle, the coil CL5 or CL6 (the coil wiring CW5 or CW6) can be connected to not the center of the side of the rectangle serving as the base but the position shifted to the corner side of the rectangle serving as the base.

<Regarding Modification Example of the Configuration of Coils>

Figure 37:
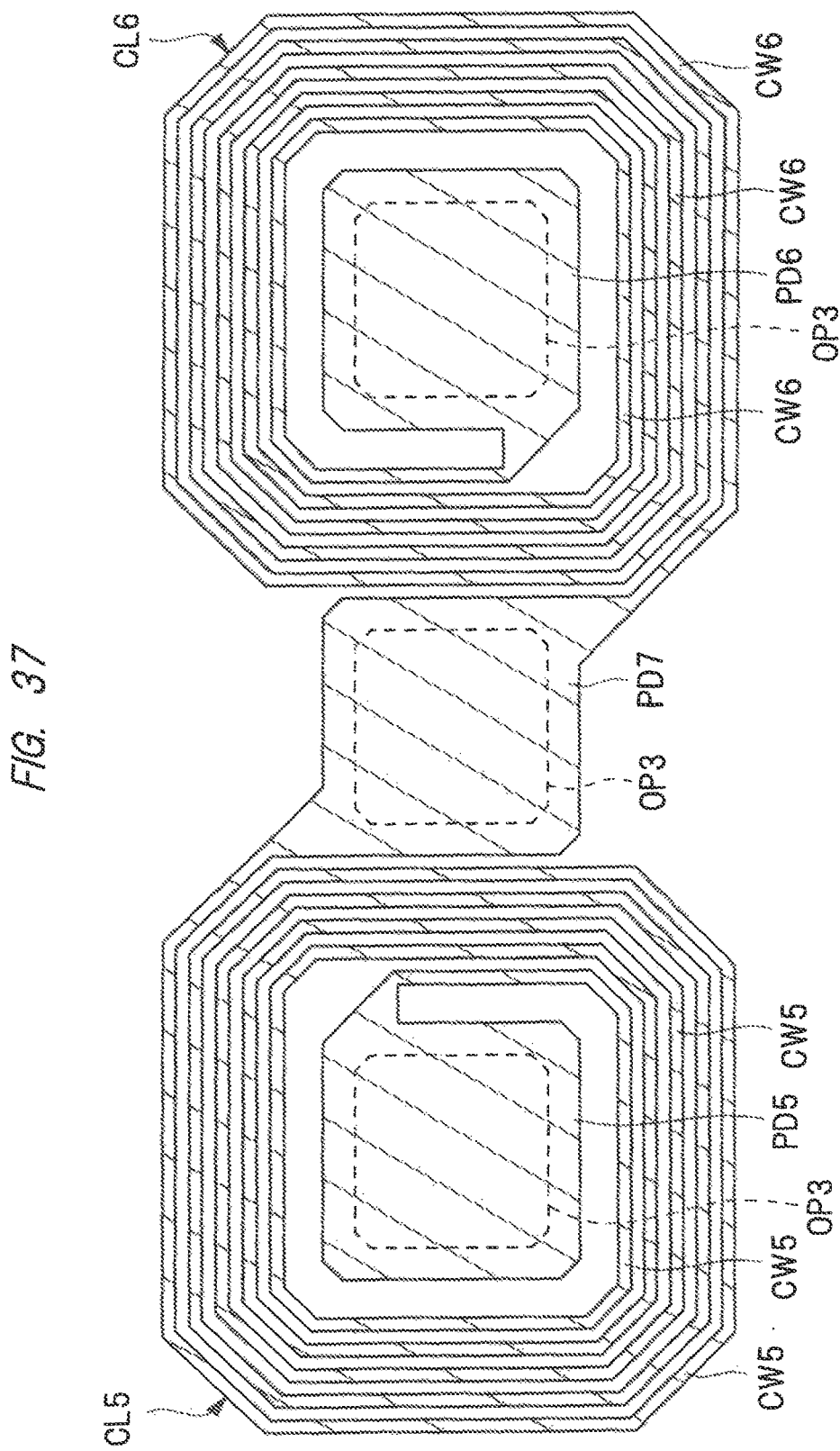
FIG. 37 is a plan view of a principal part of a semiconductor device of a study example.
Figure 38:
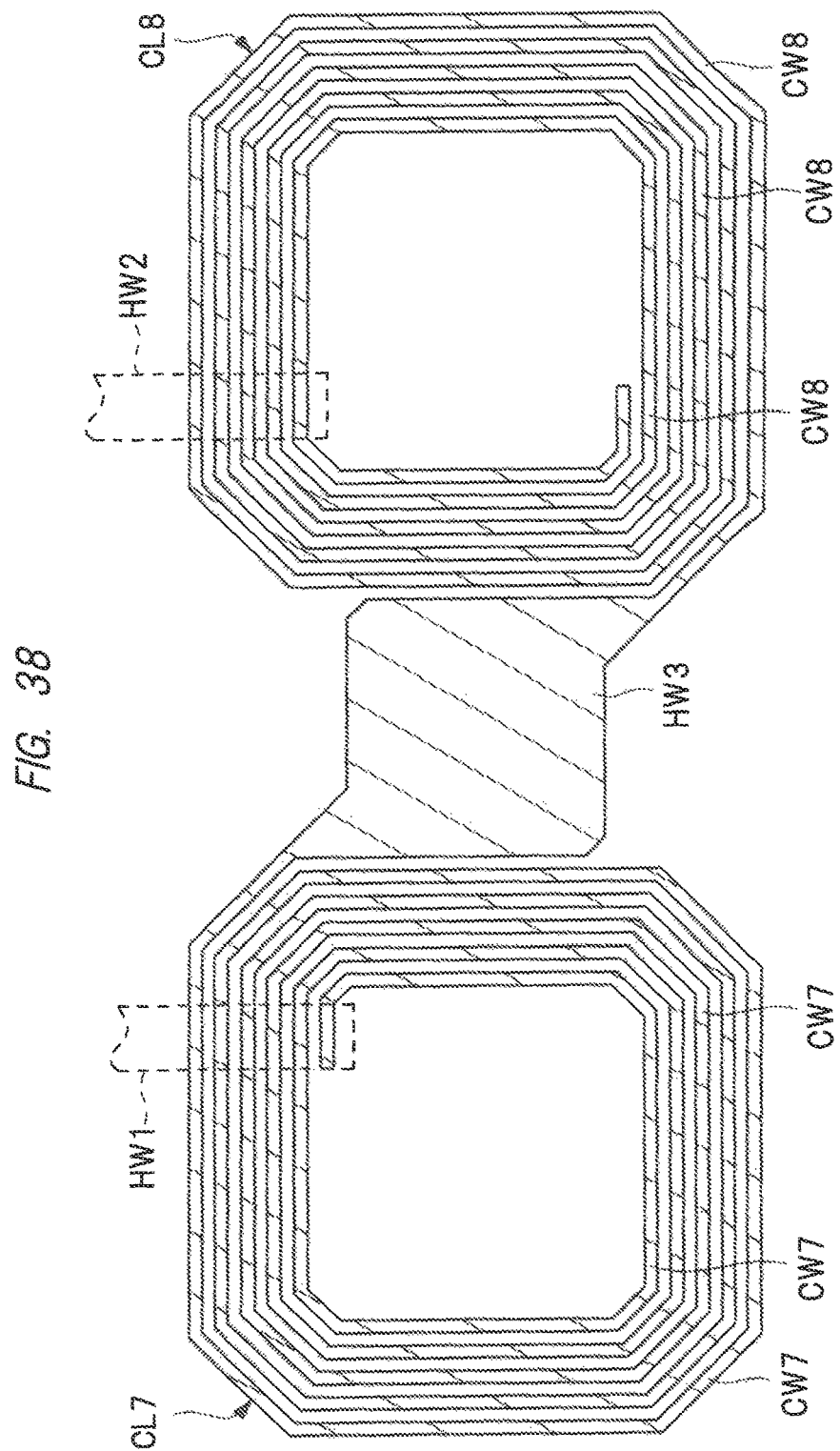
FIG. 38 is a plan view of a principal part of a semiconductor device of a study example.

Next, a modification example of the configuration of the coils configuring the transformer formed in the semiconductor chip will be explained. FIG. 37 and FIG. 38 are plan views of a principal part of a modification example of the semiconductor chip CP1 (or the semiconductor chip CP2) and show plan views of the coils formed in the above-described transformer formation region 1B. FIG. 37 is a diagram corresponding to FIG. 33 described above and shows the secondary-side coils (the coils CL5 and CL6) of the transformer formed in the semiconductor chip CP1 (or the semiconductor chip CP2), and FIG. 38 is a diagram corresponding to FIG. 34 described above and shows the primary-side coils (the coils CL7 and CL8) of the transformer. Moreover, in order to easily understand the relative positional relations among the primary-side coils (CL7 and CL8) and the wirings for leading (the lead wirings HW1 and HW2), the lead wirings HW1 and HW2 are shown by dotted lines in FIG. 38.

In the case of FIG. 33 and FIG. 34 described above, the coil winding directions of the primary-side coils CL7 and CL8 are opposite to each other in the coil CL7 and the coil CL8, and the coil winding directions of the secondary-side coils CL5 and CL6 are opposite to each other in the coil CL5 and the coil CL6. In other words, one of the coil CL7 and the coil CL8 is wound at the right-hand turn, and the other one is wound at the left-hand turn. One of the coil CL5 and the coil CL6 is wound at the right-hand turn, and the other one is wound at the left-hand turn.

On the other hand, in the case of FIG. 37 and FIG. 38, the coil winding directions of the primary-side coils CL7 and CL8 are the same as each other in the coil CL7 and the coil CL8, and the coil winding directions of the secondary-side coils CL5 and CL6 are the same as each other in the coil CL5 and the coil CL6. In other words, the coil CL7 and the coil CL8 are both wound at the right-hand turn or at the left-hand turn, and the coil CL5 and the coil CL6 are both wound at the right-hand turn or at the left-hand turn. In the case of FIG. 38, both of the coils CL7 and CL8 are wound at the right-hand turn. However, as another mode, both of the coils CL7 and CL8 may be wound at the left-hand turn. Also, in the case of FIG. 37, both of the coils CL5 and CL6 are wound at the right-hand turn. However, as another mode, both of the coils CL5 and CL6 may be wound at the left-hand turn.

Other configurations of the coils CL5, CL6, CL7, and CL8, the pads PD5, PD6, and PD7, and the lead wirings HW1 and HW2 of FIG. 37 and FIG. 38 are similar to those explained with reference to FIG. 32 to FIG. 36 described above. Therefore, here, repetitive explanations thereof are omitted.

The winding directions of the coil CL7 and the coil CL8 are opposite to each other in the case of FIG. 33 and FIG. 34 described above. Therefore, when currents flow to the coil CL7 and the coil CL8 connected in series, the directions of flows of the currents in the coil CL7 and the coil CL8 become the same as each other, and therefore, the magnetic fluxes of the same direction in the coil CL7 and the coil CL8 are generated by the same current flow direction. Therefore, when induction currents flow to the secondary-side coils CL5 and CL6, the direction of the current flowing to the coil CL5 and the direction of the current flowing to the coil CL6 become the same as each other, and the direction of the magnetic flux generated so as to penetrate through the coil CL5 by the induction current flowing to the coil CL5 and the direction of the magnetic flux generated so as to penetrate through the coil CL6 by the induction current flowing to the coil CL6 become the same as each other because of the same current flow direction. Therefore, when signals are transmitted from the transmission circuit to the reception circuit through the transformer, the direction of the magnetic flux generated so as to penetrate through the magnetically-coupled coils CL5 and CL7 and the direction of the magnetic flux generated so as to penetrate through the magnetically-coupled coils CL6 and CL8 become the same as each other.

Here, a direction of a current (or a direction of a current flow) in a coil indicates a current flowing in the coil in a right-hand turn (clockwise) or a current flowing in the coil in a left-hand turn (counterclockwise) when the coil (or the coil wiring) is viewed from above. Therefore, when two coils are described to be the same as each other in the direction of the current (the same as each other in the direction of the current flow) in the coil, the description corresponds to a state of the right-hand turn (clockwise) current flow in both two coils or a state of the left-hand turn (counterclockwise) current flow in both two coils when the two coils are viewed from above. Further, when two coils are described to be different from each other in the direction of the current (different from each other in the direction of the current flow) in the coil, the description corresponds to a state of the right-hand turn (clockwise) current flow in one of two coils and the left-hand turn (counterclockwise) current flow in the other when the two coils are viewed from above.

On the other hand, the winding directions of the coil CL7 and the coil CL8 are the same as each other in the case of FIG. 37 and FIG. 38 described above. Therefore, when a current flows to the coil CL7 and the coil CL8 connected in series, the flowing directions of the currents in the coil CL7 and the coil CL8 are opposite to each other, and magnetic fluxes in opposite directions to each other are generated in the coil CL7 and the coil CL8 by the opposite current flow direction. Therefore, when induction currents flow to the secondary-side coils CL5 and CL6, the direction of the current flowing to the coil CL5 and the direction of the current flowing to the coil CL6 are opposite to each other, and the direction of the magnetic flux generated by the induction current flowing to the coil CL5 so as to penetrate through the coil CL5 and the direction of the magnetic flux generated by the induction current flowing to the coil CL6 so as to penetrate through the coil CL6 are opposite to each other because of the opposite current flow direction. Therefore, when signals are transmitted from the transmission circuit to the reception circuit through the transformer, the direction of the magnetic flux generated so as to penetrate through the magnetically-coupled coils CL5 and CL7 and the direction of the magnetic flux generated so as to penetrate through the magnetically-coupled coils CL6 and CL8 are opposite to each other.

If the magnetic flux (magnetic field) penetrating through the coils CL5 and CL7 and the magnetic flux (magnetic field) penetrating through the coils CL6 and CL8 have opposite directions to each other, the magnetic flux (magnetic field) penetrating through the coil CL5 and the magnetic flux (magnetic field) penetrating through the coil CL6 can be connected as a loop (in other words, can be closed as a loop). Therefore, in the case of above-described FIG. 37 and FIG. 38, the coils CL5 and CL6 can be suppressed or prevented from acting so that the magnetic fluxes (magnetic fields) are canceled out from each other, and the coils CL7 and CL8 can be suppressed or prevented from acting so that the magnetic fluxes (magnetic fields) are canceled out from each other. Therefore, when signals are transmitted by using induction currents from the primary coil (CL7, CL8) to the secondary coil (CL5, CL6), the signal intensity (received signal intensity) detected by the secondary coil (CL5, CL6) can be improved. Therefore, the performance of the semiconductor chip can be further improved, and performance of the semiconductor device including the semiconductor chip can be further improved.

Figure 39:
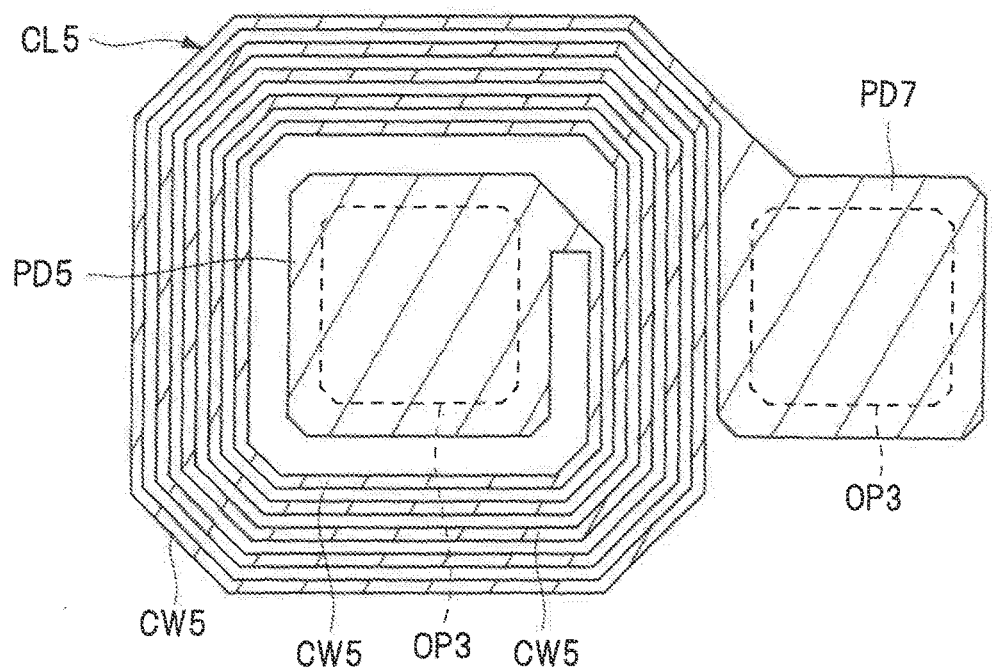
FIG. 39 is a plan view of a principal part of a semiconductor device of another study example.
Figure 40:
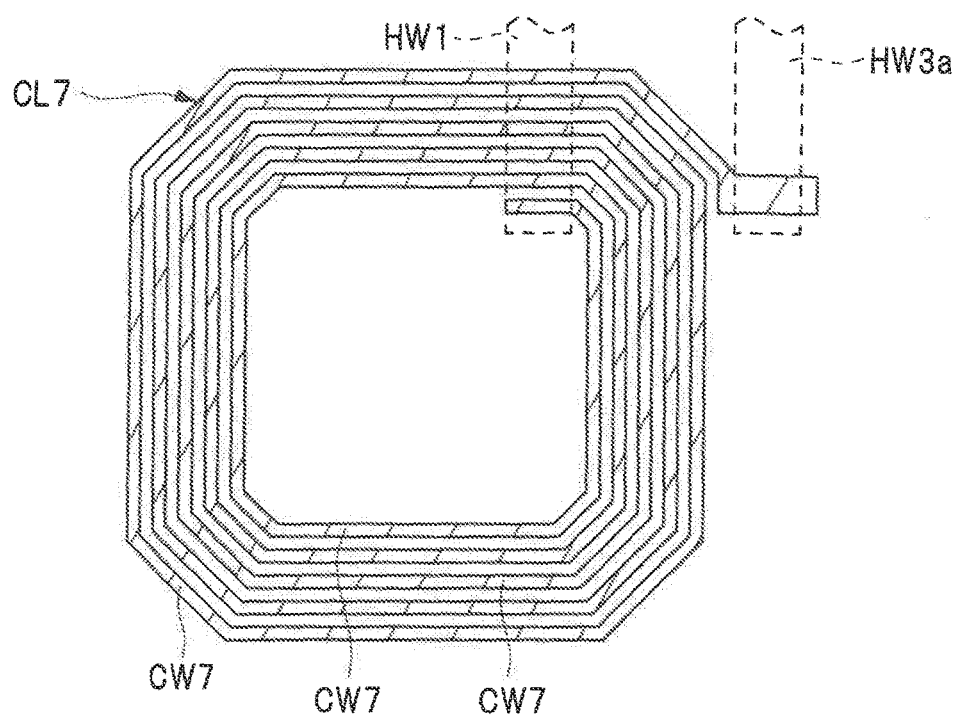
FIG. 40 is a plan view of a principal part of a semiconductor device of another study example.

Next, another modification example of the configuration of the coil configuring the transformer formed in the semiconductor chip will be explained. FIG. 39 and FIG. 40 are plan views of a principal part of another modification example of the semiconductor chip CP1 (or the semiconductor chip CP2) and show plan views of the coils formed in the above-described transformer formation region 1B. FIG. 39 is a diagram corresponding to FIG. 33 described above and shows the secondary-side coil (the coil CL5) of the transformer formed in the semiconductor chip CP1 (or the semiconductor chip CP2), and FIG. 40 is a diagram corresponding to FIG. 34 described above and shows the primary-side coil (the coil CL7) of the transformer. Moreover, in order to easily understand the relative positional relations between the primary-side coil (CL7) and wirings for leading (lead wirings HW1 and HW3a), FIG. 40 shows the lead wirings HW1 and HW3a by dotted lines.

In the case of FIG. 39 and FIG. 40 described above, the primary-side coil is composed of one coil CL5 so that the coil CL6 and the pad PD6 are not formed, and the secondary-side coil is composed of one coil CL7 so that the coil CL8 and the lead wiring HW1 are not formed. An outer end of the coil CL7 is connected to not the connection wiring HW3 but the lead wiring HW3a, and the lead wiring HW3a can be formed in the same layer as or a different layer from the coil CL7. In the case of FIG. 40, the case in which the outer end of the coil CL7 is connected to the lead wiring HW3a, which is provided in the same layer as the lead wiring HW1, through a via portion is shown. However, the lead wiring HW3a may be formed in the same layer as the coil CL7.

Since other configurations of the coils CL5 and CL7, the pads PD5 and PD7, and the lead wirings HW1 and HW3a of FIG. 39 and FIG. 40 are similar to those explained with reference to FIG. 32 to FIG. 36 described above, the repetitive explanations thereof are omitted here. The circuit configuration of the transformer is the same as FIG. 1 described above. For example, if the transformer of FIG. 39 and FIG. 40 is applied to the transformer TR1 of FIG. 1 described above, the coil CL5 is the above-described coil CL1a, and the coil CL7 is the above-described coil CL2a.

In the case of FIG. 32 to FIG. 36 described above and the case of FIG. 37 and FIG. 38 described above, each of the primary coil and the secondary coil is composed of two coils, in other words, the above-described transformer TR1 is composed of two transformers, and the two transformers can be operated with differentials, and therefore, noise resistance can be improved. On the other hand, in the case of FIG. 39 and FIG. 40, each of the primary coil and the secondary coil is composed of one coil, in other words, the above-described transformer TR1 is composed of one transformer, and therefore, the semiconductor chip can be downsized (an area thereof can be reduced).

<Regarding Configuration Example of Semiconductor Package>

Next, a configuration example of the semiconductor package of the present embodiment will be described. Note that the semiconductor package can be regarded to be a semiconductor device.

Figure 41:
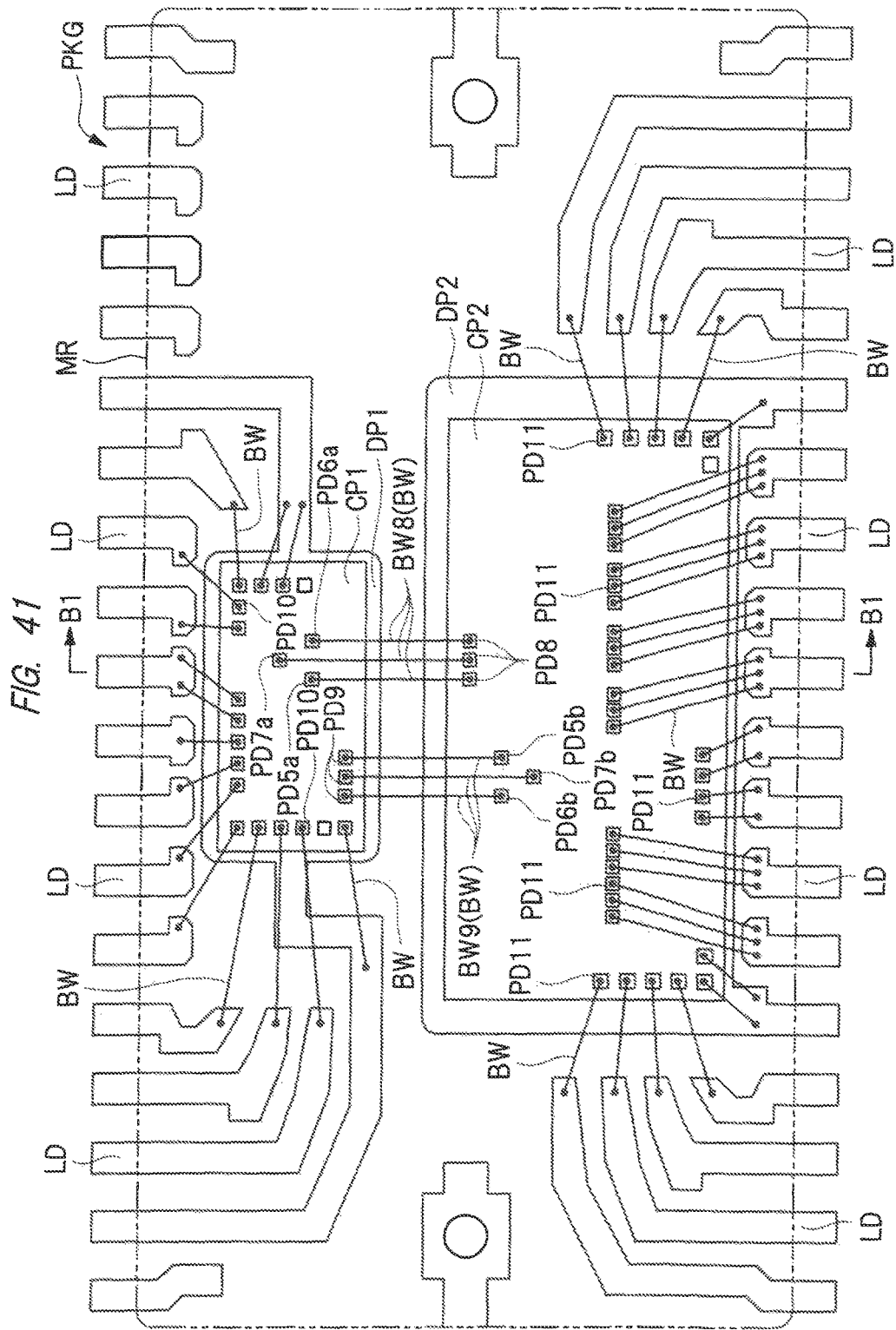
FIG. 41 is a plan view showing a semiconductor package of an embodiment.
Figure 42:
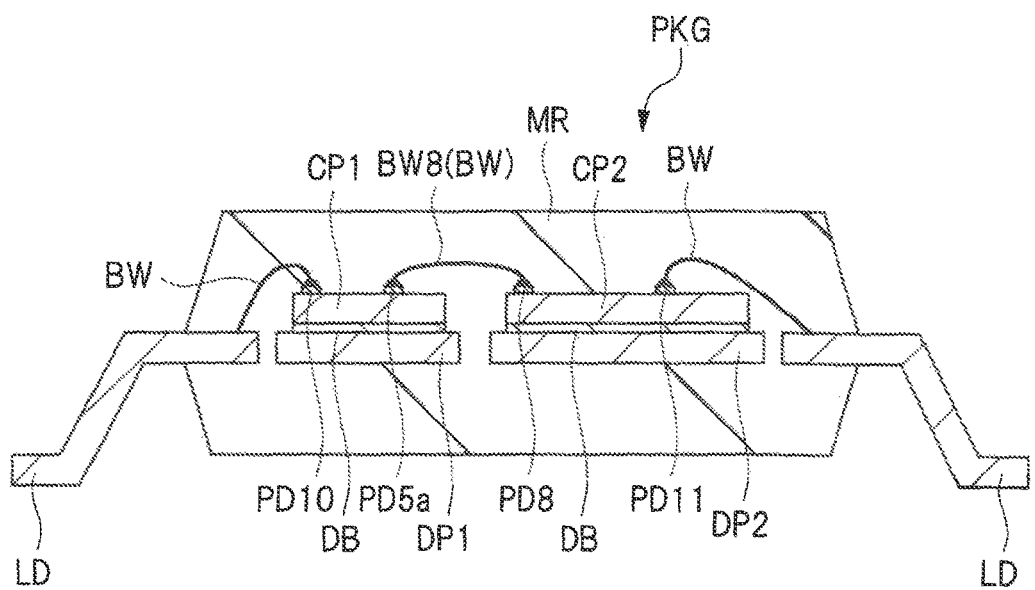
FIG. 42 is a cross-sectional view showing a semiconductor package of an embodiment.

FIG. 41 is a plan view showing a semiconductor package (semiconductor device) PKG of the present embodiment, and FIG. 42 is a cross-sectional view of the semiconductor package PKG. However, in FIG. 41, a sealing resin portion MR is visually transparent, and an outer form (an outer circumference) of the sealing resin portion MR is shown by a two-dot chain line. Further, a cross-sectional view taken along a line B1-B1 in FIG. 41 almost corresponds to FIG. 42.

The semiconductor package PKG shown in FIG. 41 and FIG. 42 is a semiconductor package including the semiconductor chips CP1 and CP2. The configuration of the semiconductor package PKG will be specifically described below.

The semiconductor package PKG shown in FIG. 41 and FIG. 42 includes: the semiconductor chips CP1 and CP2; die pads DP1 and DP2 on which the semiconductor chips CP1 and CP2 are mounted, respectively; a plurality of leads LD made of a conductor; a plurality of bonding wires BW connecting the semiconductor chips CP1 and CP2 and connecting the semiconductor chip CP1 or CP2 and the plurality of leads LD; and a sealing resin portion MR sealing these members.

The sealing resin portion (a sealing portion, a sealing resin, a sealing body) MR is made of resin material such as a thermosetting resin material, and can include a filler or others. The semiconductor chips CP1 and CP2, the die pads DP1 and DP2, the plurality of leads LD and the plurality of bonding wires BW are sealed and protected electrically and mechanically by the sealing resin portion MR. A plain shape (outer shape) of the sealing resin portion MR intersecting its thickness direction can be rectangular (square).

A plurality of pads (pad electrodes, bonding pads) PD10 are formed on a front surface of the semiconductor chip CP1 which is a main surface of the semiconductor chip CP1 on a device formation side. Each pad PD10 of the semiconductor chip CP1 is electrically connected to a semiconductor integrated circuit (such as the above-described control circuit CC) or others formed inside the semiconductor chip CP1. The pad PD10 corresponds to the above-described pad PD2 connected to the above-described rewiring RW in the semiconductor chip CP1.

Pads (pad electrode, bonding pad) PD5a, PD6a and PD7a corresponding to the above-described pads PD5, PD6 and PD7, respectively, are further formed on a surface of the semiconductor chip CP1.

That is, the semiconductor chip CP1 includes: the above-described transmission circuit TX1; the above-described coils CL7 and CL8 (the primary coil) connected to the transmission circuit TX1; the above-described coils CL5 and CL6 (the secondary coil) magnetically coupled to the coils CL7 and CL8, respectively; and the above-described pads PD5, PD6 and PD7 connected to the coils CL5 or CL6. The pad PD5 included in the semiconductor chip CP1 corresponds to the pad PD5a, the pad PD6 included in the semiconductor chip CP1 corresponds to the pad PD6a, and the pad PD7 included in the semiconductor chip CP1 corresponds to the pad PD7a.

Further, the semiconductor chip CP1 further includes: the above-described reception circuit RX2; and a plurality of pads (pad electrode, bonding pad) PD9 connected to the reception circuit RX2. Therefore, pads PD, PD5a, PD6a, PD7a, PD9, and PD10 are formed on a front surface of the semiconductor chip CP1. Note that a pad PD9 of the plurality of pads PD9 of the semiconductor chip CP1 which is connected to the pad PD7b of the semiconductor chip CP2 through a bonding wire BW is a pad for supplying a fixed potential (ground potential, GND potential, power source potential or others).

A plurality of pads PD11 are formed on a surface of the semiconductor chip CP2 which is a main surface of the semiconductor chip CP2 on the device formation side. Each pad PD11 of the semiconductor chip CP2 is electrically connected to a semiconductor integrated circuit (such as the above-described drive circuit DR) formed inside the semiconductor chip CP2. The pad PD11 corresponds to the above-described pad PD2 connected to the above-described rewiring RW in the semiconductor chip CP2.

Pads (pad electrode, bonding pad) PD5*b*, PD6*b* and PD7*b* corresponding to the above-described pads PD5, PD6 and PD7, respectively, are further formed on a surface of the semiconductor chip CP2.

That is, the semiconductor chip CP2 includes: the above-described transmission circuit TX2; the above-described coils CL7 and CL8 (the primary coil) connected to the transmission circuit TX2; the above-described coils CL5 and CL6 (the secondary coil) magnetically coupled to the coils CL7 and CL8, respectively; and the above-described pads PD5, PD6 and PD7 connected to the coils CL5 or CL6. The pad PD5 included in the semiconductor chip CP2 corresponds to the pad PD5*b*, the pad PD6 included in the semiconductor chip CP2 corresponds to the pad PD6*b*, and the pad PD7 included in the semiconductor chip CP2 corresponds to the pad PD7*b*.

Further, the semiconductor chip CP2 further includes: the above-described reception circuit RX1; and a plurality of pads (pad electrode, bonding pad) PD8 connected to the reception circuit RX1. Therefore, pads PD5*b*, PD6*b*, PD7*b*, PD8, and PD11 are formed on a front surface of the semiconductor chip CP2. Note that a pad PD8 of the plurality of pads PD8 of the semiconductor chip CP2 which is connected to the pad PD7*a* of the semiconductor chip CP1 through a bonding wire BW is a pad for supplying a fixed potential (ground potential, GND potential, power source potential or others).

Note that the main surface of the semiconductor chip CP1 on the side on which the pads PD5*a*, PD6*a*, PD7*a* PD9, and PD10 are formed is called "a front surface of the semiconductor chip CP1", and the main surface opposed thereto is called "aback surface of the semiconductor chip CP1". Further, the main surface of the semiconductor chip CP2 on the side on which the pads PD, PD5*b*, PD6*b*, PD7*b*, PD8, and PD11 are formed is called "a front surface of the semiconductor chip CP2", and the main surface opposed thereto is called "a back surface of the semiconductor chip CP2".

The semiconductor chip CP1 is mounted (arranged) on an upper surface of the die pad DP1 which is a chip-mounting portion so that the front surface of the semiconductor chip CP1 faces upward, and the back surface of the semiconductor chip CP1 is bonded and fixed onto the upper surface of the die pad DP1 through a die bond material (adhesive) DB.

The semiconductor chip CP2 is mounted (arranged) on an upper surface of the die pad DP2 which is a chip-mounting portion so that the front surface of the semiconductor chip CP2 faces upward, and the back surface of the semiconductor chip CP2 is bonded and fixed onto the upper surface of the die pad PD2 through a die bond material (adhesive) DB.

The die pad DP1 and the die pad DP2 are spaced away from each other through a material configuring the sealing resin portion MR interposed therebetween, and they are electrically insulated from each other.

The leads LD are made of a conductor, and preferably made of metal material such as copper (Cu) or copper alloy. Each lead LD is composed of an inner lead portion which is a portion of the lead LD positioned inside the sealing resin portion MR and an outer lead portion which is a portion of the lead LD positioned outside the sealing resin portion MR, and the outer lead portion of the lead LD protrudes from a side surface of the sealing resin portion MR to the outside of the sealing resin portion MR. A section between the inner lead portions of the adjacent leads LD is filled with the material configuring the sealing resin portion MR. The outer lead portion of each lead LD can function as a terminal portion for external connection (an external terminal) of the semiconductor package PKG. The outer lead portion of each lead LD is bent so that a lower surface thereof in the vicinity of an end portion of the outer lead portion is positioned slightly lower than the lower surface of the sealing resin portion MR.

Each pad PD10 on the front surface of the semiconductor chip CP1 and each pad PD11 on the front surface of the semiconductor chip CP2 are electrically connected to the inner lead portion of each lead LD through a bonding wire BW which is an electrically-conductive connection member. That is, the other end of the bonding wire BW whose one end is connected to each pad PD10 on the front surface of the semiconductor chip CP1 is connected to an upper surface of the inner lead portion of each lead LD. Also, the other end of the bonding wire BW whose one end is connected to each pad PD11 on the front surface of the semiconductor chip CP1 is connected to an upper surface of the inner lead portion of each lead LD. Note that the lead LD connected to the pad PD10 of the semiconductor chip CP1 through the boding wire BW and the lead LD connected to the pad PD111 of the semiconductor chip CP2 through the boding wire BW are different leads LD from each other. Therefore, the pad PD10 of the semiconductor chip CP1 and the pad PD111 of the semiconductor chip CP2 are not connected through a conductor body.

Further, each of the pads PD5*a*, PD6*a* and PD7*a* on the front surface of the semiconductor chip CP1 is electrically connected to the pad PD8 on the front surface of the semiconductor chip CP2 through bonding wire BW. Further, each of the pads PD5*b*, PD6*b* and PD7*b* on the front surface of the semiconductor chip CP2 is electrically connected to the pad PD9 on the front surface of the semiconductor chip CP1 through bonding wire BW.

The bonding wire BW is the electrically-conductive connection member (a member for connection), and more specifically an electrically-conductive wire made of a metal thin wire such as a gold (Au) wire or a copper (CU) wire. The bonding wire BW is sealed within the sealing resin portion MR, and is not exposed from the sealing resin portion MR.

Here, the bonding wire BW connecting the pad PD5*a*, PD6*a* and PD7*a* of the semiconductor chip CP1 and the pad PD8 of the semiconductor chip CP2 is called "bonding wire BW8" denoted with a reference symbol BW8 below. Further, the bonding wire BW connecting the pad PD5*b*, PD6*b* or PD7*b* of the semiconductor chip CP2 and the pad PD9 of the semiconductor chip CP1 is called "bonding wire BW9" denoted with a reference symbol BW9 below.

Although the semiconductor chip CP1 and the semiconductor chip CP2 are connected to each other by the bonding wires BW8 and BW9, they are not connected to each other by the other bonding wire BW (electrically-conductive connection member). Therefore, the electric signal between the semiconductor chip CP1 and the semiconductor chip CP2 is transmitted through only a route from the pad PD5*a*, PD6*a* or PD7*a* of the semiconductor chip CP1 to the pad PD8 of the semiconductor chip CP2 through the bonding wire BW8 and a route from the pad PD5*b*, PD6*b* or PD7*b* of the semiconductor chip CP2 to the pad PD9 of the semiconductor chip CP2 through the bonding wire BW9.

The pads PD5*a*, PD6*a* and PD7*a* of the semiconductor chip CP1 are connected to the above-described coils CL5 and CL6 (the secondary coil) formed within the semiconductor chip CP1. However, the coils CP5 and CP6 are not connected to a circuit formed within the semiconductor chip CP1 through a conductor (internal wiring), and are magnetically coupled to the above-described coils CL7 and CL8

(the primary coil) within the semiconductor chip CP1. Therefore, only a signal transmitted from the circuit (the above-described transmission circuit TX1 or others) formed within the semiconductor chip CP1 through the above-described coils CL7 and CL8 (the primary coil) and the above-described coils CL5 and the CL6 (the secondary coil) within the semiconductor chip CP1 by magnetic induction is inputted from the pad PD5$a$, PD6$a$ or PD7$a$ into the semiconductor chip CP2 (the above-described reception circuit RX1) through the bonding wire BW8.

Further, the pads PD5$b$, PD6$b$ and PD7$b$ of the semiconductor chip CP2 are connected to the above-described coils CL5 and CL6 (the secondary coil) formed within the semiconductor chip CP2. However, the coils CL5 and CL6 are not connected to a circuit formed within the semiconductor chip CP2 through a conductor (internal wiring), and are magnetically coupled to the above-described coil CL7 and CL8 (the primary coil) within the semiconductor chip CP2. Therefore, only a signal transmitted from the circuit (the above-described transmission circuit TX2 or others) formed within the semiconductor chip CP2 through the above-described coils CL7 and CL8 (the primary coil) and the above-described coils CL5 and the CL6 (the secondary coil) within the semiconductor chip CP2 by magnetic induction is inputted from the pad PD5$b$, PD6$b$ or PD7$b$ into the semiconductor chip CP1 (the above-described reception circuit RX2) through the bonding wire BW9.

The semiconductor chip CP1 and the semiconductor chip CP2 are different from each other in a voltage level (reference potential) from each other. For example, the drive circuit DR drives such a load LOD as a motor, and specifically drives or controls a switch (a switching element) of such a load LOD as a motor for turning the switch. Therefore, when a switch to be driven turns ON, the case that the reference potential (voltage level) of the semiconductor chip CP2 rises up to a voltage almost coincident with the power source voltage (operation voltage) of the switch to be driven in some cases, and the power source voltage is a significantly high voltage (for example, about several-hundred volt to several-thousand volt). Therefore, a large difference in the voltage level (reference potential) occurs between the semiconductor chip CP1 and the semiconductor chip CP2. That is, when the switch to be driven is turned ON, a higher voltage (for example, about several-hundred volt to several-thousand volt) than the power source voltage (for example, about several volt to several-ten volt) supplied to the semiconductor chip CP1 is supplied to the semiconductor chip CP2.

As described above, however, only a signal transmitted by magnetic induction through the primary coil (CL7 and CL8) and the secondary coil (CL5 and CL6) within the semiconductor chip CP1 or a signal transmitted by magnetic induction through the primary coil (CL7 and CL8) and the secondary coil (CL5 and CL6) within the semiconductor chip CP2 is electrically transmitted between the semiconductor chip CP1 and the semiconductor chip CP2. Therefore, even if the voltage level (reference potential) of the semiconductor chip CP1 and the voltage level (reference potential) of the semiconductor chip CP2 are different from each other, inputting of the voltage level (reference potential) of the semiconductor chip CP2 into the semiconductor chip CP1 and inputting of the voltage level (reference potential) of the semiconductor chip CP1 into the semiconductor chip CP2 can be properly prevented. That is, even if the switch to be driven is turned ON and the voltage level (reference potential) of the semiconductor chip CP2 rises up to a voltage almost coincident with the power source voltage (for example, about several-hundred volt to several-thousand volt) of the switch to be driven, the inputting of the reference potential of the semiconductor chip CP2 into the semiconductor chip CP1 can be properly prevented. Therefore, transmission of an electric signal can be properly performed between the semiconductor chips CP1 and CP2 which are different from each other in the voltage level (reference potential). Further, the reliabilities of the semiconductor chip CP1 and the semiconductor chip CP2 can be enhanced. Further, the reliability of the semiconductor package PKG can be improved. Furthermore, the reliability of an electric device using the semiconductor package PKG can be improved.

Further, by transmitting a signal between the semiconductor chips utilizing the magnetically-coupled coils, while the semiconductor package PKG can be downsized, the reliability thereof can be improved.

The semiconductor package PKG can be manufactured as, for example, follows. More specifically, first, a lead frame having a frame body coupled to die pads DP1 and DP2 and a plurality of leads LD is prepared, and a die-bonding step is performed to mount and join the respective semiconductor chips CP1 and CP2 onto the die pads DP1 and DP2 of the lead frame via a die-bond material (adhesive material) DB. Then, a wire bonding step is performed. In this manner, a plurality of pads PD10 of the semiconductor chip CP1 are electrically connected to the plurality of leads LD via the plurality of bonding wires BW. Moreover, a plurality of pads PD11 of the semiconductor chip CP2 are electrically connected to a plurality of other leads LD via the plurality of other bonding wires BW. Moreover, a plurality of pads PD5$a$, PD6$a$, and PD7$a$ of the semiconductor chip CP1 are electrically connected to a plurality of pads PD8 of the semiconductor chip CP2 via a plurality of bonding wires BW8. Moreover, a plurality of pads PD5$b$, PD6$b$, and PD7$b$ of the semiconductor chip CP2 are electrically connected to a plurality of pads PD9 of the semiconductor chip CP1 via a plurality of bonding wires BW9. Then, a resin sealing step is performed to form a sealing resin portion MR sealing the semiconductor chips CP1 and CP2, the die pads DP1 and DP2, the plurality of leads LD, and the plurality of bonding wires BW (including the bonding wires BW8 and BW9). Then, the plurality of leads LD having inner lead portions sealed in the sealing resin portion MR are cut and separated from the frame body of the lead frame, and then, outer lead portions of the plurality of leads LD are subjected to a bending process. In this manner, the semiconductor package PKG can be manufactured.

Here, application examples of a product on which the semiconductor package PKG is mounted will be described. For example, the examples are an automobile, a motor control unit of home appliance such as a washing machine, a switching power source, a lighting controller, a solar power generation controller, a mobile phone, a mobile communication device and others.

For example, for the application of the automobile, the semiconductor chip CP1 is a low-voltage chip to which a low power-supply voltage is supplied, and the power-supply voltage supplied at this time is, for example, about 5 V. On the other hand, the power-supply voltage of a switch of a drive target of the drive circuit DR is a high voltage of, for example, 600 V to 1000 V or larger, and this high voltage can be supplied to the semiconductor chip CP2 when the switch is turned on.

Note that the case of SOP (Small Outline Package) has been explained here as an example as a package mode of the semiconductor package PKG. However, it is applicable to those other than SOP.

(Second Embodiment)

Figure 43:
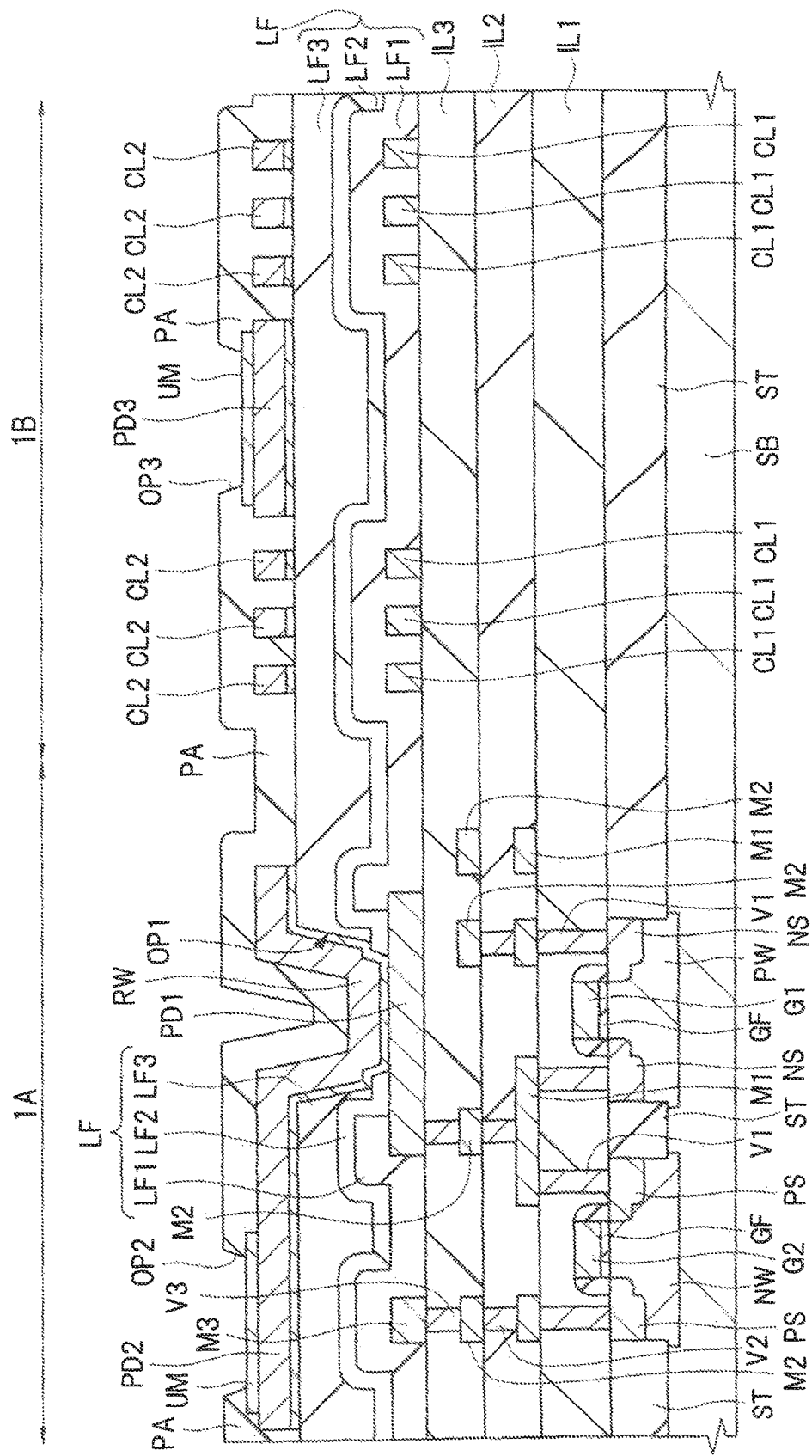
FIG. 43 is a cross-sectional view of a principal part of a semiconductor device of another embodiment.

FIG. 43 is a cross-sectional view of a principal part showing a cross-sectional structure of a semiconductor device of the present second embodiment, and corresponds to the above-described FIG. 3 of the above-described first embodiment.

In the above-described first embodiment, as shown in the above-described FIG. 3, the coil CL1 which is the primary coil of the transformer is formed in the layer lower than the pad PD1. In the case of the above-described FIG. 3, the coil CL1 is formed in the second wiring layer (in other words, in the same layer as the wiring M2) which is one-level lower layer than the third wiring layer in which the pad PD1 is formed.

On the other hand, in the present second embodiment, as shown in FIG. 43, the coil CL1 which is the primary coil of the transformer is formed in the same layer as the pad PD1. In other words, the coil CL1 is formed in the third wiring layer (in other words, in the same layer as the wiring M3) in which the pad PD1 is formed. Therefore, in the present second embodiment, the interlayer insulation film IL3 is not interposed between the coil CL1 and the coil CL2, only the laminated film LF is interposed therebetween, and the silicon oxide film LF1 of the laminated film LF is formed so as to be in contact with the coil CL1 so as to cover the coil CL1.

Since other configurations of the present second embodiment are basically the same as those of the above-described first embodiment, repetitive explanations thereof are omitted here.

Also in the present second embodiment, effects almost the same as those explained in the above-described first embodiment can be obtained. However, the above-described first embodiment has the following advantages compared with the present second embodiment.

Specifically, in the present second embodiment, the laminated film LF is interposed between the coil CL1 and the coil CL2, and the breakdown voltage between the coil CL1 and the coil CL2 is ensured by the laminated film LF. On the other hand, in the above-described first embodiment, not only the laminated film LF but also the interlayer insulation film (in the case of above-described FIG. 3, the interlayer insulation film IL3) is interposed between the coil CL1 and the coil CL2, and the breakdown voltage between the coil CL1 and the coil CL2 is ensured by the laminated film LF and the interlayer insulation film. Therefore, since the interlayer insulation film (in the case of above-described FIG. 3, the interlayer insulation film IL3) is also interposed between the coil CL1 and the coil CL2, the breakdown voltage between the coil CL1 and the coil CL2 can be more increased in the above-described first embodiment than the present second embodiment.

Moreover, if the coil CL1 and the pad PD1 are in the same layer as seen in the present second embodiment, the thickness of the coil CL1 is increased. This is because the thickness of the pad PD1 is thicker (larger) than the thickness of the wiring (in this case, the wiring M1 and the wiring M2) in the layer lower than the pad PD1. If the coil CL1 is thick, it is difficult to bury the part between the adjacent parts of the spiral coil wiring configuring the coil CL1 by an insulation film, and therefore, it is required to comparatively strictly manage the film formation step of the insulation film. On the other hand, in the above-described first embodiment, the coil CL1 is formed in the lower layer than the pad PD1, and therefore, the thickness of the coil CL1 can be thinner (smaller) than the thickness of the pad PD1. Therefore, the part between the adjacent parts of the spiral coil wiring configuring the coil CL1 can be easily buried by the insulation film, and therefore, it becomes easy to manage the film formation step of the insulation film. Therefore, the semiconductor device can be easily manufactured. Moreover, since the part between the adjacent parts of the spiral coil wiring configuring the coil CL1 can be more reliably buried by the insulation film, the reliability of the semiconductor device can be further improved.

In the foregoing, the invention made by the present inventors has been concretely described based on the embodiments. However, it is needless to say that the present invention is not limited to the foregoing embodiments and various modifications and alterations can be made within the scope of the present invention.

EXPLANATION OF REFERENCE SYMBOL

BW, BW8, BW9: bonding wire
CC: control circuit
CF: copper film
CL1, CL1a, CL1b, CL2, CL2a, CL2b: coil
CL5, CL6, CL7, CL8: coil
CP1, CP2: semiconductor chip
CW5, CW6, CW7, CW8: coil wiring
DB: die bonding material
DP1, DP2: die pad
DR: driving circuit
G1, G2: gate electrode
GF: gate insulation film
HW1, HW2, HW3a: lead wiring
HW3: connection wiring
IL1, IL2, IL3: interlayer insulation film
LD: lead
LF: laminated film
LF1: silicon oxide film
LF2: silicon nitride film
LF3: resin film
LOD: load
M1, M2, M3: wiring
MR: sealing resin portion
NS: n-type semiconductor region
NW: n-type well
OP1, OP1a, OP1b, OP1c, OP2, OP3: opening portion
PA: protection film
PD1, PD2, PD3, PD5, PD5a, PD5b: pad
PD6, PD6a, PD6b, PD7, PD7a, PD7b: pad
PD8, PD9, PD10, PD11: pad
PKG: semiconductor package
PR1, PR2: resist pattern
PS: p-type semiconductor region
PW: p-type well
RW: rewiring
RX1, RX2: reception circuit
SB: semiconductor substrate
SE: seed film
SG1, SG2, SG3, SG4: signal
ST: element isolation region
TR1, TR2: transformer
TX1, TX2: transmission circuit
UM: underlying metal film
V1: plug
V2, V3: via portion

The invention claimed is:

1. A semiconductor device comprising:
a semiconductor substrate;
a first coil formed on the semiconductor substrate via a first insulation film;
a second insulation film formed on the semiconductor substrate so as to cover the first insulation film and the first coil;
a first pad formed on the second insulation film and disposed at a position not overlapped with the first coil in a planar view;
a laminated insulation film formed on the second insulation film, the laminated insulation film including a first opening from which the first pad is exposed;
a second coil formed on the laminated insulation film and disposed above the first coil; and
a first wiring formed on the laminated insulation film including an upper portion of the first pad exposed from the first opening, the first wiring being electrically connected to the first pad.

2. The semiconductor device according to claim 1,
wherein the laminated insulation film includes a silicon oxide film, a silicon nitride film on the silicon oxide film, and a resin film on the silicon nitride film,
the first coil and the second coil are not connected by a conductor but magnetically coupled to each other, and
a part of the first pad is covered by the laminated insulation film.

3. The semiconductor device according to claim 1,
wherein the first wiring is formed in a same layer as the second coil,
the first wiring and the second coil are not connected to each other by a conductor, and
the first wiring is connected to a second pad formed on the laminated insulation film.

4. The semiconductor device according to claim 1,
wherein the first pad includes an electrically-conductive material containing aluminum as a main component.

5. The semiconductor device according to claim 1,
wherein the first pad comprises a pad used in a probe test.

6. The semiconductor device according to claim 1,
wherein a thickness of the silicon nitride film is 0.5 μm or thicker.

7. The semiconductor device according to claim 6,
wherein, between the first coil and the second coil, a thickness of the silicon oxide film is thicker than the thickness of the silicon nitride film.

8. The semiconductor device according to claim 1,
wherein a central portion of the first pad is not covered by the laminated insulation film, and an outer peripheral portion of the first pad is covered by the laminated insulation film,
the first opening of the laminated insulation film is formed by a second opening of the silicon oxide film, a third opening of the silicon nitride film, and a fourth opening of the resin film,
the third opening is included in the second opening in the planar view, and
an inner wall of the second opening of the silicon oxide film is covered by the silicon nitride film.

9. The semiconductor device according to claim 8,
wherein the third opening is included in the fourth opening in the planar view, and
an inner wall of the third opening of the silicon nitride film is not covered by the resin film.

10. The semiconductor device according to claim 9,
wherein a step portion of an upper surface of the silicon nitride film formed by the inner wall of the second opening of the silicon oxide film is covered by the resin film.

11. The semiconductor device according to claim 1,
wherein an inner wall of the third opening of the silicon nitride film is tapered, and
an inner wall of the fourth opening of the resin film is tapered.

12. The semiconductor device according to claim 1,
wherein the silicon oxide film comprises an HDP-CVD oxide film.

13. The semiconductor device according to claim 1,
wherein the resin film comprises a polyimide film.

14. The semiconductor device according to claim 1,
wherein the second coil is connected to a third pad formed on the laminated insulation film,
a protective insulation film is formed on the laminated insulation film so as to cover the first wiring and the second coil, and
the second pad and the third pad are exposed from the protective insulation film.

* * * * *